(12) United States Patent
Kikuchi et al.

(10) Patent No.: US 6,571,361 B1
(45) Date of Patent: May 27, 2003

(54) ENCODER AND DECODER

(75) Inventors: Yoshihiro Kikuchi, Yokohama (JP);
Toshiaki Watanabe, Yokohama (JP);
Kenshi Dachiku, Kawasaki (JP);
Takeshi Chujoh, Tokyo-To (JP);
Takeshi Nagai, Tokyo-To (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/142,871

(22) PCT Filed: Mar. 18, 1997

(86) PCT No.: PCT/JP97/00864
§ 371 (c)(1),
(2), (4) Date: Sep. 16, 1998

(87) PCT Pub. No.: WO97/35401
PCT Pub. Date: Sep. 25, 1997

Related U.S. Application Data

(63) Continuation-in-part of application No. 08/720,067, filed on Sep. 27, 1996, now Pat. No. 5,862,153.

(30) Foreign Application Priority Data

| Sep. 29, 1995 | (JP) | ................................................ 9-276993 |
| Mar. 18, 1996 | (JP) | ................................................ 8-061450 |
| Jun. 24, 1996 | (JP) | ................................................ 8-163082 |
| Sep. 2, 1996  | (JP) | ................................................ 8-232362 |
| Sep. 13, 1996 | (JP) | ................................................ 8-243883 |

(51) Int. Cl.[7] .............................. H04N 7/52; H04N 7/66
(52) U.S. Cl. ............................ 714/701; 348/845.3
(58) Field of Search .................. 714/779, 701; 348/845.3

(56) References Cited

U.S. PATENT DOCUMENTS

| 4,827,339 A | * | 5/1989 | Wada et al. ................. 358/136 |
| 5,121,205 A | * | 6/1992 | Ng et al. ..................... 358/141 |
| 5,168,356 A | * | 12/1992 | Acampora et al. ........... 370/473 |
| 5,247,357 A | * | 9/1993 | Israelsen ...................... 358/133 |
| 5,285,497 A | * | 2/1994 | Thatcher, Jr. ................. 380/49 |
| 5,321,440 A | * | 6/1994 | Yanagihara et al. ......... 348/408 |
| 5,379,116 A | * | 1/1995 | Wada et al. .................. 358/431 |
| 5,412,484 A | * | 5/1995 | Yoshikawa ................... 358/433 |
| 5,566,192 A | * | 10/1996 | Moon ......................... 371/47.1 |
| 5,745,504 A | * | 4/1998 | Bang ......................... 371/37.1 |
| 5,757,416 A | * | 5/1998 | Birch et al. ..................... 348/6 |
| 5,835,144 A | * | 11/1998 | Matsumura et al. ........ 348/390 |
| 6,014,171 A | * | 1/2000 | Koyanagi et al. ........... 348/402 |

FOREIGN PATENT DOCUMENTS

| JP | 03198432 A | 8/1991 |
| JP | 03250935 A | 11/1991 |
| JP | 06343065 A | 12/1994 |

OTHER PUBLICATIONS

Watanabe et al., "Error Resilient Low–bitrate Video Coding for MPEG4," Technical Report of IEICE (1996), 95:37–44.
Chujoh et al., "Error tolerant very low bitrate video coding (2) –Duplicate transmission for important information and reversible code," Annual Meeting of IEICE (1996), p. 12.
Copy of International Search Report mailed Jun. 17, 1997.

* cited by examiner

Primary Examiner—Stephen M. Baker
(74) Attorney, Agent, or Firm—Finnegan, Henderson, Farabow, Garrett & Dunner, L.L.P.

(57) ABSTRACT

In a coding system wherein an error correction/detect-ion coding is combined with a synchronization recovering technique using a synchronization code, the problems of a pseudo synchronization and a step out due to error detect-ion are solved. There is provided a coding part 212 for coding an input multiplexed code string 201 to an error correcting/detecting code comprising an information bit and a check bit; and code string assembling part 213 for inserting a synchronization code into any one of a plurality of periodically predetermined synchronization code inserting positions in the code string 201, for arranging the information bit at an optional position in the code string, and for arranging the check bit at a position other than the synchronization code inserting positions in the code string 201 to assemble an output code string 205.

21 Claims, 33 Drawing Sheets

```
                0                           1
              0 1                         0 0
            0 1 1                       0 1 0
          0 1 1 1                     0 1 1 0
        0 1 1 1 1                   0 1 1 1 0
      0 1 1 1 1 1                 0 1 1 1 1 0
    0 1 1 1 1 1 1               0 1 1 1 1 1 0
  0 1 1 1 1 1 1 1             0 1 1 1 1 1 1 0
        (a)                         (b)
```

SSC  00000000  00000000  00000001  00010101

SEC  00000000  00000000  00000001  00101010

PSC  00000000  00000000  00000001  00000000

GSC  00000000  00000000  1

(a)

PSC  00000000  00000000  0000000①  ⓪0000000   (3411, 3414)

GSC  0000000①  00000000  000000⓪①①   3402
     3401        GSC       3413 3412

ENCODER AND DECODER

This application is a Continuation-In-Part of U.S. patent application Ser. No. 08/720,067, filed Sep. 27, 1996 now U.S. Pat. No. 5,862,153.

TECHNICAL FIELD

The present invention relates generally to a system for transmitting and/or storing information via a medium of a high error rate, such as a radio transmission line. More specifically, the invention relates to a coding and/or decoding system suited to carry out the error correction/detection coding of a compressed code string obtained by the high efficiency compression coding to transmit and/or store the compressed code string.

BACKGROUND ART

For example, in a system for carrying out the high-efficient compression coding of a picture and/or voice information so as to have a small information content to transmit the compression-coded picture and/or voice information via a radio transmission line, such as a radio visual telephone, a portable information terminal and a digital television broadcast system, it is important how to transmit the obtained code string with a high quality since the transmission line has a high error rate.

In a case where a code string is transmitted and/or stored via such a medium of a high error rate, an error correcting code, such as a Bose-Chaudhuri-Hocquenghem (BCH) code, a Recommended Standard (RS) code and a convolutional code, is often used as means for reducing the error rate. In addition, an error correcting,code, such as a check sum and a cyclic redundancy check (CRC), is used as means for enabling the error correction on the receiving side. The aforementioned error correction and/or error detection adds excessive bits (redundancy) to the transmitted and/or stored information in accordance with a predetermined rule to examine whether the transmitted and/or stored code string obeys the rule during decoding, to carry out the error correction/detection on the basis of the results.

However, in such a method for coding a code string obtained by a high-efficiency compression coding into error correcting/detecting codes to transmit and/or store the codes, there is a disadvantage in that it is difficult to be combined with a synchronous recovering technique for recovering a step out caused by, a code word error in she transmission line/medium. As a synchronous recovering technique, a method for inserting a uniformly decodable code called a synchronization code to resume the decoding immediately after the synchronization code is detected when a step out occurs is often used.

In order to make a uniformly decodable code word of the synchronization code, the code word must be combined with another code word so as not to form the same bit pattern as the synchronization code. However, in an error correction-/detection coding, it is generally difficult to form a code word so as to prevent a certain bit pattern from occurring. When the same bit pattern as the synchronization code occurs, a pseudo synchronization may be caused by the error detection of the synchronization code.

In order to avoid this problem, there is used a method for preventing the pseudo synchronization by determining whether the same bit pattern as the synchronization code exists in the code string after performing the error correction/detection coding, inserting a dummy bit into the bit pattern in accordance with a certain rule when the same bit pattern exists, and deleting the dummy bit in the same rule in a decoding system. However, in a case where the code string is transmitted and/or stored via a medium in which errors are easy to occur, errors may occur in the inserted bit, so that there is a problem in that a new step out or a new pseudo synchronization may occur.

In addition, in a case where the error correction/detection coding of a code string is carried out to insert a synchronization code, there is also a problem in that the coding efficiency is lowered since it is required to add many inserted bits to the code string in order to compensate an excess of information bits, for which the error detection and/or detection coding is to be carried out, at the end portion of a synchronization interval between the adjacent synchronization codes.

On the other hand, in order to enhance the error correcting/detecting capability, the redundancy of the transmitted and/or stored information may be enhanced. However, if the redundancy is enhanced, the number of bits required to transmit the same information is increased. Therefore, if the error correcting/detecting capability is enhanced, it is required to provide a transmission line of a higher transmission rate, or the number of bits of information to be stored is increased. In addition, if the transmission rate and the stored capacity are the same, the amount of information, which can be transmitted and/or stored, is decreased as the redundancy is enhanced. In a case where a picture and/or voice information is high-efficiently compression-coded to be transmitted and/or stored, in order to add the redundancy to improve the error resistance, the compression coding into a smaller amount of information must be carried out if the transmission and/or storage rate is the same, so that the picture quality and sound quality are lowered.

Therefore, as a method for providing a smaller redundancy and a high error resistance, there is a method called hierarchical coding. This is a method for enhancing the error resistance using the same means redundancy in comparison with when the same error correcting/detecting code is used, by classifying the high-efficiency compression-coded information in accordance with the magnitude of errors influencing the picture quality and the sound quality, using an error correcting/detecting code of a higher error correction/detection capacity while having a high redundancy, for information under a great influence of the error, and using an error correcting/detecting code of a less redundancy while having not so high error correction/detection capacity, for information which is not so greatly influenced by the error.

For example, in a coding system, which is formed by combining the motion-compensated prediction with the orthogonal transform and which is often used for the high-efficiency compression coding of a dynamic image, i.e., in a system for motion-compensation predicting an input dynamic image signal to orthogonal transform its prediction residue by a DCT (discrete cosine transform) or the like, the error correcting/detecting codes of a high error correcting/detecting capability are used for motion vector information, which greatly deteriorate the picture quality if an error occurs, and for lower coefficients of the orthogonal transformation coefficients of the prediction residual signal, and the error correcting/detecting codes of a low error correcting/detecting capability are used for higher coefficients of the orthogonal transformation coefficients of the prediction residual signal, which are under a small influence of the error.

In order to achieve such a hierarchical coding, it is required to switch the error correcting/detecting codes of different error correcting/detecting capabilities in the middle of the output code string. As a method for switching the error correcting/detecting codes of different error correcting/detecting capabilities, there is a method for adding a header information representative of the kind of the error correcting/detecting codes to a code string. FIG. 11 shows an example of a code string, to which the header information is added to switch the error correcting/detecting codes. In this example, two kinds of error correcting/detecting codes FEC1 and FEC2 are switched. The headers 1101 to 1104 have a header information representative of the kind of the error correcting/detecting codes and the number of the code words. In a coding system, code words, which are error correction/detection coded, are arranged after the header information. In a decoding system, the header information is decoded, and the error correcting/detecting codes are decoded in accordance with the decoding of the header information.

However, in the method for switching the error correcting/detecting codes by adding such a header information, there is a problem in that the number of bits of the code string to be transmitted and/or stored by adding the header information is increased. In a case where the picture and/or voice information is high-efficiency compression coded to be transmitted and/or stored, if the number of bits is occupied by the header information, the number of bits used for the high-efficiency compression coding of the picture and/or voice information is decreased, so that the picture quality and sound quality are deteriorated.

As mentioned above, if the error correction/detection coding of the code string, in which the high-efficiency compression coding of dynamic image signals and so forth is performed, is carried out, an optional bit pattern is produced. Therefore, in a case where the error correction-/detection coding is combined with the synchronous recovering technique using a uniformly decodable synchronization code, there is a problem in that a pseudo synchronization is caused by the error detection of the synchronization code. Also in a case where the dummy bit is inserted to prevent the pseudo synchronization, there is a problem in that a new step out or a new pseudo synchronization is caused by the error of the inserted bit.

In addition, in a case where the error correction/detection coding of the code string is performed and the synchronization code is inserted, it is conventionally required to use many inserted bits to compensate an excess of information bits, for which the error detection and/or detection coding is to be carried out, at the end portion of a synchronization interval between the adjacent synchronization codes, so that there is a problem in that the coding efficiency is lowered.

Moreover, in a coding/decoding system for switching error correcting/detecting codes of different error correcting/detecting capabilities by adding a header information, the number of bits to be transmitted and/or stored by adding the header information is increased. Therefore, in a case where a picture and/or voice information is high-efficiency compression coded to be transmitted and/or stored, there is a problem in that the information content assigned to the picture and/or voice information is decreased to lower the picture quality and the sound quality.

DISCLOSURE OF INVENTION

It is therefore a principal object of the present invention to eliminate the aforementioned problems and to provide coding and decoding systems, which can prevent a pseudo synchronization and a step out due to the error detection of a synchronization code.

It is another object of the present invention to provide coding and decoding systems, which prevent a pseudo synchronization and a step out due to the error detection when an error correction/detection coding is combined with a synchronization recovering technique using a synchronization code.

It is further object of the present invention to provide coding and decoding systems, which can decrease the number of inserted bits used at the end portion in a synchronization interval to enhance the coding efficiency, when an error correction/detection coding is combined with a synchronization recovering technique using a synchronization code.

It is still further object of the present invention to provide coding and decoding systems which can decrease the number of bits of a code string, to which a header information representative of the kind of error correction/detection coding must be added and which is transmitted and/or stored, to improve the quality of information.

(1) A first coding system, according to the present invention, comprises: coding means for coding an input code string to an error correcting/detecting code comprising an information bit and a check bit; and code string assembling means for inserting a synchronization code into any one of a plurality of predetermined synchronization code inserting positions in an output code string, for arranging the information bit at an optional position in the output code string, and for arranging the check bit at a position other than the synchronization code inserting positions in the output code string to assemble the output code string.

A first decoding system, according to the present invention, comprises: synchronization code detecting means for detecting a synchronization code at a plurality of predetermined synchronization code inserting positions on the basis of a code string, which is coded to an error correcting/detecting code comprising an information bit and a check bit; code string resolving means for resolving the code string to extract the information bit of the error correcting/detecting code and the check bit of the error correcting/detecting code arranged at a position other than the synchronization code inserting positions; and decoding means for receiving the information bit and the check bit extracted by the code string resolving means to decode the error correcting/detecting code.

Thus, in the first coding/decoding system, the synchronization code exists only at the predetermined synchronization code inserting position in the output code string, and the check bit of the error correcting/detecting code exists at a position other than the synchronization code inserting position. Therefore, even if the same bit pattern as the synchronization code is contained in the check bit, there is no probability that it is erroneously detected that the same bit pattern as the synchronization code is a synchronization code. Accordingly, since it is not required to use a special error correcting/detecting code for preventing a particular bit pattern and to insert a bit for preventing a synchronization code after the error correction/detection coding, the degree of freedom for the used error correcting/detecting code can be increased. In addition, since there is no probability that a new synchronization detection error may occur due to the insertion of an error into an inserted bit, it is possible to improve the resistance to errors.

(2) In a second coding system according to the present invention, code string transforming means is added to the first coding system. The code string transforming means transforms an input code string other than synchronization codes arranged at a plurality of predetermined synchronization code inserting positions in an output code string so that a humming distance from the synchronization code is equal to or greater than a predetermined value. The code string transformed by the code string transforming means is inputted to coding means to be coded to an error correcting/detecting code comprising an information bit and a check bit.

In a second decoding system according to the present invention, code string transforming means is added to the first decoding system. The code string transforming means transforms a code string other than the synchronization code, which exists at a synchronization code inserting position and which is transformed so that a humming distance from the synchronization code in the code string decoded by the decoding means is equal to or greater than a predetermined value, into the original code string.

Thus, in the second coding/decoding system, the coding system carries out the transforming process so that the humming distance from the synchronization code with respect to a bit string arranged at the synchronization code inserting position is equal to or greater than a predetermined value, and the decoding system carries out the reverse transformation. Therefore, since the same bit pattern as the synchronization code is not contained in the bit string, it is possible to prevent the error detection of a synchronization code. In addition, if the transform is carried out so that the humming distances between the synchronization code and the other code strings are great, the synchronization code can be distinguished from the other code strings even if an error is mixed into the code strings, so that the probability of the error detection of the synchronization code due to errors can be decreased.

Since this transforming/inverse transforming process is carried out only at the synchronization code inserting position, the overhead is less than those in conventional methods for carrying out transforming/inverse transforming process over the whole code string. In addition, in the code string inputted to the coding system, it is not required to carry out the transforming process so as not to produce the same bit pattern as the synchronization code, and it is not required to use a special code string. In particular, in a case where a variable length coding system for switching and using different code word tables is used as an input of this coding system, if the code word table is prepared so as not to produce the same pattern as the synchronization code in the variable length coding system, there is a problem in that the coding efficiency is lowered. However, the second coding/decoding system can eliminate such a problem.

(3) A third coding system, according to the present invention, comprises: coding means for coding an input code string to an error correcting/detecting code; synchronization code inserting means for inserting a synchronization code into the code string; and determining means for determining the number of bits an information to be coded to an error correcting/detecting code immediately before the synchronization code in the code string, wherein the coding means causes the error correcting/detecting code immediately before the synchronization code, to be a degenerate code, which adaptively degenerated on the basis of the number of bits determined by the determining means.

A third decoding system, according to the present invention, comprises: decoding means for decoding a code string, which is coded to an error correcting/detecting code and into which a synchronization code is inserted; synchronization code detecting means for detecting the synchronization code in the code string; and determining means for determining the number of bits of an information, which is coded to an error correcting/detecting code immediately before the synchronization code in the code string detected by the synchronization code detecting means, wherein the decoding means decodes by identifying whether the error correcting/detecting code immediately before the synchronization code is a degenerate code on the basis of the determined result of the determining means.

Thus, in the third coding/decoding system, since a degenerate code degenerated to the number of bits required to code the information bit remaining at the end portion of a synchronization interval is used as the error correcting-/detecting code immediately before the synchronization code, it is not required to use many inserted bits in order to compensate the remainder of the information bit at the end portion of the synchronization interval, so that the coding efficiency can be improved.

(4) A fourth coding system, according to the present invention, comprises: coding means for coding a code string containing kinds of input information to an error correcting/detecting code; and switching means for switching the kind of the error correcting/detecting code in accordance with the kinds of the input information in the code string.

A fourth decoding system, according to the present invention, comprises: decoding means for decoding a code string, which is coded to a different kind of error correcting/detecting code in accordance of the kind of information, to generate the original information; and means for determining the kind of the error correcting/detecting code on the basis of the kind of information generated by the decoding means, to inform the decoding means.

Thus, in the fourth coding/decoding system, in a case where the coding/decoding is carried out by switching the error correcting/detecting code in accordance with the kind of information, the coding system switches the error correcting/detecting code in accordance with the kind of information of the input code string, and the decoding system determines the kind of the error correcting/detecting code on the basis of the decoded information to carry out the same switching as that of the coding system. Therefore, it is not required to use a header information representative of the kind of the error correcting/detecting code unlike conventional systems, so that it is possible to remove the overhead due to the header information.

(5) A fifth coding system, according to the present invention, comprises: code string transforming means for transforming an input code string other than synchronization codes, which are arranged at a plurality of predetermined synchronization code inserting positions in an output code string and in intervals of a predetermined number of bits before and after the predetermined synchronization code inserting positions in an output code string, so that a humming distance from the synchronization code is equal to or greater than a predetermined value; coding means for coding a code string transformed by the code string transforming means, to an error correcting/detecting code comprising an information bit and a check bit; and code string assembling means for inserting a synchronization code into any one of a plurality of predetermined synchronization code inserting positions in the output code string, for arranging the information bit at an optional position in the output code string, and for arranging the check bit at a position other than the synchronization code inserting positions in the output code string to assemble the output code string.

A fifth decoding system, according to the present invention, comprises: synchronization code detecting means for detecting a synchronization code at a predetermined synchronization code inserting position and in an interval of a predetermined number of bits before and after the predetermined synchronization code inserting position, on the basis of a code string, which is coded to an error correcting/detecting code comprising an information bit and a check bit and into which the synchronization code; code string resolving means for resolving the code string to extract the information bit of the error correcting/detecting code and the check bit of the error correcting/detecting code arranged at a position other than the synchronization code inserting position; decoding means for receiving the information bit and the check bit extracted by the code string resolving means to decode the error correcting/detecting code; and code string transforming means for transforming a code string other than the synchronization code, which is transformed so that a humming distance from the synchronization code in the code string decoded by the decoding means is equal to or greater than a predetermined value and which exists at the synchronization code inserting position and in an interval of a predetermined number of bits before and after the synchronization code inserting position, into the original code string.

Thus, in the fifth coding/decoding system, the input code string is transformed in the synchronization code inserting interval as well as in the interval of the predetermined number of bits before and after the synchronization code inserting interval so that the humming distance is equal to or greater than the predetermined value, and the decoding system carries out the reverse transformation of the input code string, so that the same bit pattern as the synchronization code is not contained in this interval. Therefore, even if the transmission/storage of a bit string coded through a transmission line or a storage medium for causing a bit loss, in which a part of bits is lost, and a bit addition, in which an excess bit is added, is carried out, the synchronization code can be distinguished from the other code strings if the number of lost/added bits is equal to or less than a predetermined number of bits, so that the decoding system can correctly carry out the synchronization detection.

(6) A sixth coding system, according to the present invention, comprises: multiplexing means for multiplexing kinds of compressed codes, which are obtained by compression coding an input signal, to produce a multiplexed code string; and code string assembling means for inputting the multiplexed code string to assemble an output code string, wherein the code string assembling means inserts a synchronization code into any one of a plurality of periodically predetermined synchronization code inserting positions in the output code string.

In this case, in order to insert the synchronization code into any one of the plurality of periodically predetermined synchronization code inserting positions in the output code string, the code string assembling means inserts a stuffing bit into the output code string, or periodically determines the plurality of synchronization code inserting positions in the output code string and inserts an information (a pointer information) representative of the boundary of the multiplexed code string, to insert the synchronization code into any one of the plurality of synchronization code inserting positions. Thus, the synchronization code can be inserted only into any one of the plurality of periodically predetermined synchronization code inserting positions.

The stuffing bit is preferably a code, which can be uniformly decoded in a backward direction of the output code string. Thus, if the decoding system compares the decoding end position of the code string immediately before the stuffing bit with the starting position of the stuffing bit, it is possible to easily detect an error in the input code string.

Moreover, the humming distances of the stuffing bit from the synchronization code and the part thereof are preferably equal to or greater than a predetermined value. Thus, there is an advantage in that the probability of the occurrence of a pseudo synchronization.

A sixth decoding system, according to the present invention, comprises: synchronization code detecting means for detecting a synchronization code in an output code string; demultiplexing means for demultiplexing on the basis of the position of the synchronization code detected by the synchronization code detecting means from the input code string, to produce a compressed code string; and decoding means for decoding the compressed code to output a reconstructed signal, wherein the synchronization code detecting means detects the synchronization code at a plurality of periodically predetermined synchronization code inserting positions in the input code string.

Thus, in the case of the sixth coding/decoding system, since the coding system inserts the synchronization code into the multiplexed code string, which is obtained by multiplexing kinds of compressed codes, only at the periodically predetermined synchronization code inserting positions, the decoding system may carry out the synchronization detection only at the synchronization code inserting positions, so that the number of synchronization code detecting processes can be decreased in comparison with conventional systems for inserting a synchronization code into a code string at an optional position. In addition, in accordance with the decrease of the number of the synchronization code detecting processes, it is possible to decrease the probability that a pseudo synchronization occurs because of the bit string inputted to the decoding system changed to the same bit pattern as the synchronization code due to bit error. Therefore, according to the present invention, it is possible to decrease the number of the occurrences of the pseudo synchronization, so that the processing quantity in the synchronization code detection can be decreased.

(7) In a seventh coding system according to the present invention, code string transforming means is added to the sixth coding system. The code string transforming means transforms a code string other than said synchronization code, which is arranged at said synchronization code inserting position in said output code string, so that a humming distance from said synchronization code is equal to or greater than a predetermined value.

A seventh decoding system, according to the present invention, further comprises: code string transforming means for transforming a code string other than the synchronization code, which is transformed so that a humming distance from the synchronization code is equal to or greater than a predetermined value at the synchronization code inserting position of the input code string, into the original code string.

Thus, in the seventh coding/decoding system, in addition to the construction of the sixth coding/decoding system, the bit insertion in view of the error of the synchronization code, i.e., the transformation of the humming distance of the bit string arranged at the synchronization code inserting position from the synchronization code, is carried out, so that the same bit pattern as the synchronization code is contained in the bit code string. Therefore, it is possible to ensure that the error detection of the synchronization code does not occur with respect to an error of a supposed number of bits or less, so that it is possible to decrease the probability of the error detection of the synchronization code.

Furthermore, in the present invention, the synchronization code is a code string, which is inserted into a code string for synchronization recovery and which can be uniformly decoded. For example, if a code string for inserting a synchronization code is a multiplexed code string, which is obtained by multiplexing a plurality of kinds of compressed codes obtained by compression coding an image signal inputted for each frame, the synchronization code is a code representative of a partition of a coding frame, partitions of the plurality of kinds of compressed codes, and other partitions.

As described above, according to the present invention, the following advantages can be obtained.

(1) According to the first coding/decoding system, the synchronization codes are inserted only into the synchronization code inserting positions arranged at regular intervals, and the check bits of the error correcting-/detecting code are shifted so as to exist at positions other than the synchronization code inserting positions. Therefore, even if the same bit pattern as the synchroni-zation code occurs in the check bit, the same pattern as the synchronization code does not occur at the synchroni-zation code inserting position, and, in theory, there is no probability that synchronization is detected.

In addition, if the bit insertion into a code string at the synchronization code inserting position is carried out so as not to produce a pseudo synchronization code, it is possible to eliminate the difficulty in forming a code word so as not to produce the same bit pattern as the synchroni-zation bit.

(2) According to the second coding/decoding system, in addition to the construction of the first coding system, the bit insertion is carried out in view of the synchronization code, i.e., the transforming process is carried out so that the humming distance from the synchronization code is equal to or greater than the predetermined value with respect to the bit string arranged at the synchronization code inserting position, and the decoding system carries out the backward transformation, so that the bit code does not contain the same bit pattern as the synchronization code. Therefore, it is possible to ensure to prevent the error detection of the synchronization code from occurring due to the errors of the supposed number of bits or less, so that the probability of the error detection of the synchronization code is decreased. In addition, if such transformation is carried out, it is possible to distinguish the synchronization code from the other code strings even if an error is mixed into the code string, so that the probability of the error detection of the synchronization code due to errors can be decreased.

Moreover, since the error correction/detection coding is carried out after the code word is transformed by the bit insertion, the error protection is carried out for the inserted bit. Therefore, in comparison with conventional systems for carrying out the bit insertion after the error correction/detection coding, the probability that an error occurs in the inserted bit is decreased. In addition, since the bit insertion is carried out only into the synchronization code inserting position, the increase of the quantity of cods due to the bit insertion is smaller than that in conventional systems for carrying out the bit insertion over the whole code string, so that the coding efficiency is improved.

(3) According to the third coding/decoding system, since the error correcting/detecting code immediately before the synchronization code is a degenerate code, it is possible to decrease the number of inserted bits for compensating the remainder of the information bit at the portion immediately before the synchronization code, to improve the coding efficiency, in comparison with conventional coding systems.

(4) According to the fourth coding/decoding system, the coding system utilizes the multiplexing rule in the high-efficiency compression coding system, such as image and voice, and switches the error correcting/detecting code in accordance with the kind of the information of an input code string, and the decoding system determines the kind of the error correcting/detecting code on the basis of the decoded information to carry out the same switching as that of the coding system. Therefore, it is not required to add the header information representative of the kind of the error correcting/detecting code, and it is possible to assign the number of bits to high efficiency compression coding, such as image and voice, so that it is possible to improve the information quality, such as picture quality and sound quality.

(5) According to fifth coding/decoding system, the coding system transforms an input code string so that a humming distance in a synchronization code inserting interval as well as a humming distance in an interval of a predetermined number of bits before and after the synchronization code inserting interval are equal to or greater than a predetermined value, and the decoding system carries out the inverse transformation of the input code string, so that it is possible to prevent the same- bit pattern,as the synchronization code from being contained in this interval. Therefore, even if a bit string, coded through a transmission line and/or a storage medium, which may cause a bit loss for losing a part of bit is lost and a bit addition for adding, an excess bit, is transmitted/stored, if the number of lost/added bits is equal to or less than a predetermined number of bits, it is possible to distinguish a synchronization code from other code strings, so that the decoding system can correctly carry out the synchronization detection.

(6) According to the sixth coding/decoding system, since the coding system inserts synchronization codes only into synchronization code inserting positions periodically predetermined in a multiplexed code string, which is obtained by multiplexing kinds of compressed codes, the decoding system may carry out the synchronization detection only at the synchronization code inserting positions, so that the number of the synchronization code detecting processes can be decreased in comparison with conventional systems for inserting synchronization codes into a code string at optional positions.

In addition, since the probability that a pseudo synchronization occurs by the variation of the bit string inputted to the decoding system into the same bit pattern as the synchronization code, is decreased in accordance with the decrease of the number of the synchronization code detecting processes, it is possible to prevent the pseudo synchronization according to the present invention, so that the processing quantity for the synchronization code detection decreases.

(7) According to the seventh coding/decoding system, in addition to the construction of the sixth coding/decoding system, the bit insertion in view of the error of the synchronization code, i.e., the transformation of the humming distance of the bit string at the synchronization code inserting position from the synchronization code is carried out, so that the same bit pattern as the synchronization code is not contained in the bit string. Therefore, it is ensured that the error detection of the synchronization code does not occur with respect to errors of the supposed number of bits, so that the probability of error detection of synchronization codes can be decreased.

BRIEF DESCRIPTION OF THE DRAWINGS

FIGS. 28a–28d are diagrams illustrating other examples of multiplexing rules in a multiplexer of a dynamic image coding system.

FIGS. 30a and 30b are a code table for explaining examples of stuffing bits used for the present invention.

FIGS. 34a and 34b are diagrams of examples of the use of synchronization codes of different lengths.

BEST MODE FOR CARRYING OUT THE INVENTION

Referring now to the accompanying drawings, the preferred embodiments of the present invention will be described below.

First Preferred Embodiment

Figure 1:
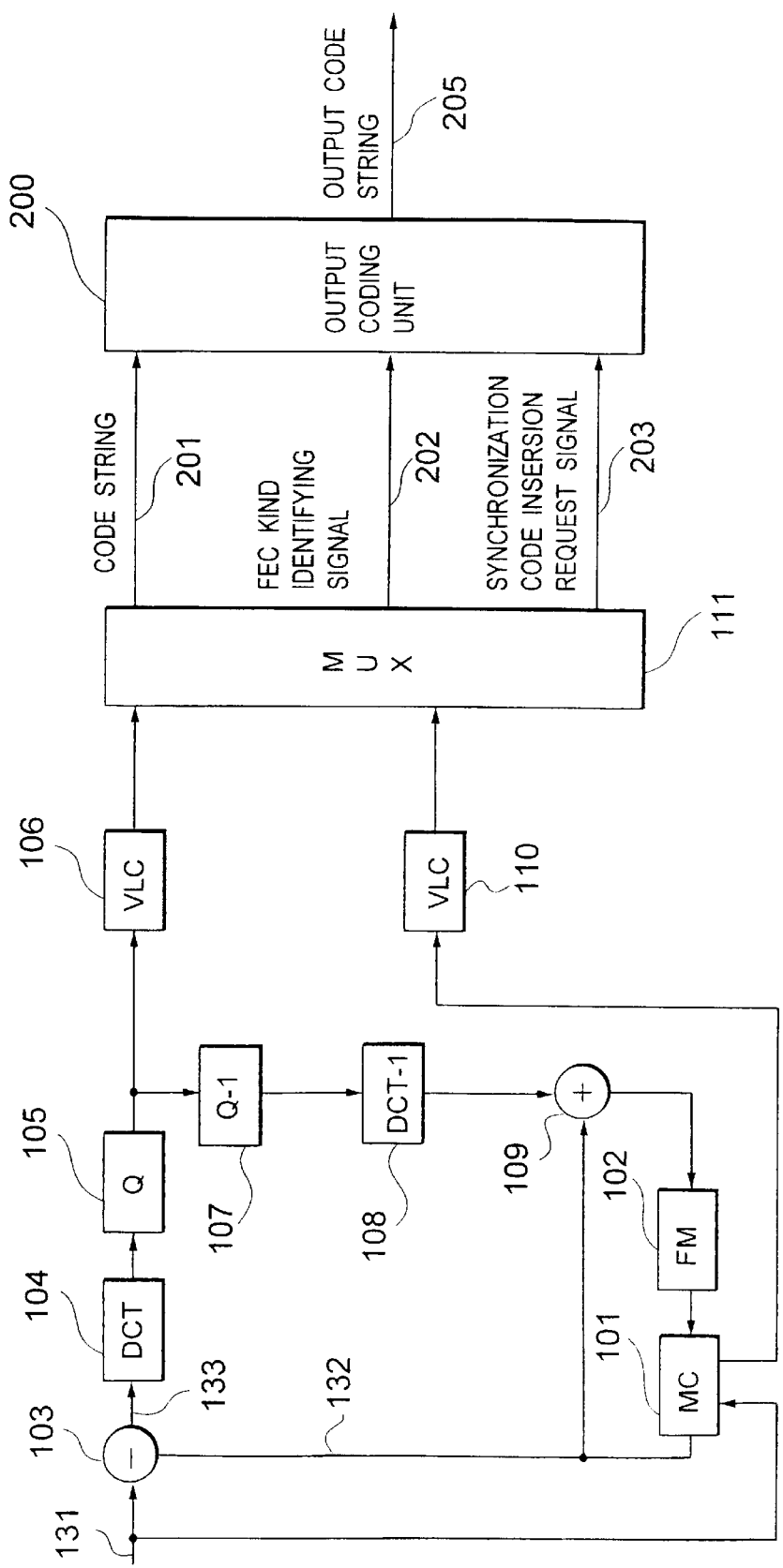
FIG. 1 is a block diagram of the first and second preferred embodiments of a dynamic image coding system according to the present invention.

FIG. 1 is a block diagram of the first preferred embodiment of a dynamic image coding system, according to the present invention, wherein a coding system having an error correcting/detecting code switching function of the present invention is combined with a high-efficiency compression coding system which uses a motion-compensated adaptive prediction and a discrete cosine transform coding serving as a kind of an orthogonal transform coding. A coding system comprising the combination of a motion-compensated adaptive prediction and a discrete cosine coding is detailed in, e.g., Literature 1 "International Standard of Multimedia Coding" by Hiroshi Yasuda, Maruzen (June 1991). Therefore, only the operation of the coding system will be schematically described. In addition, it is assumed that information bits are separated from detection bits in an error correcting/detecting code similar to a BCH code.

In FIG. 1, with respect to an input dynamic image signal 131 serving as an object to be coded, which is inputted for each frame, a motion-compensated adaptive prediction is first carried out for each small region, such as a macro block. That is, in a motion-compensated adaptive predictor 101, a motion vector between an input dynamic image signal 131 and an image signal, which is stored in a frame memory 102 and which has been encoded and/or locally decoded, is detected, and a prediction signal 132 is produced by the motion-compensated prediction on the basis of the motion vector. In this motion-compensated predictor 101, a prediction mode suitable for coding is selected from the motion-compensated prediction coding and the intraframe coding (prediction signal=0), which directly encodes the input dynamic image signal 131, to produce the corresponding prediction signal 132.

The prediction signal 132 is inputted to a subtracter 103, wherein the prediction signal 132 is subtracted from the input dynamic image signal 131 to output a prediction residual signal 133. The prediction residual signal 133 is discrete-cosine-transformed (DCT) in a discrete cosine transformer 104 for each block having a predetermined size to produce a DCT coefficient. The DCT coefficient is quantized by means of a quantizer 105. The DCT coefficient data quantized by the quantizer 105 are divided into two parts, one of which is variable-length-encoded by means of a first variable length encoder 106, and the other of which is inverse-quantized by means of an inverse quantizer 107 to be inverse-discrete-cosine-transformed (inverse DCT) by means of an inverse discrete cosine transformer 108. The output of the inverse discrete cosine transformer 108 is added to the prediction signal 132 in an adder 109 to produce a locally decoded signal. This locally decoded signal is stored in the frame memory 102.

On the other hand, the information on the prediction mode and the motion vector, which have been determined by the motion-compensated adaptive predictor 101, is variable-length-encoded by means of a second variable length encoder 110. The variable length codes (compressed codes) outputted from the first and second variable length encoders 106 and 110 are multiplexed by means of a multiplexer 111 to be outputted as a multiplexed code string 201.

The multiplexer 11 outputs the multiplexed code string 201, a FEC kind identifying signal 202 representative of the kind of an:error correcting/detecting code corresponding thereto, and a synchronization code insertion-request signal for requesting to insert a synchronization code. The code string 202, the FEC kind identifying signal 202 and the synchronization code insertion request signal 203 are inputted to an output coding unit 200 for switching and encoding the code string 202 to kinds of error correcting/detecting codes of different error correcting-/detecting capabilities, to produce a final output code string 205. In this preferred embodiment, the output coding unit 200 corresponds to a coding system according to the present invention.

Figure 2:
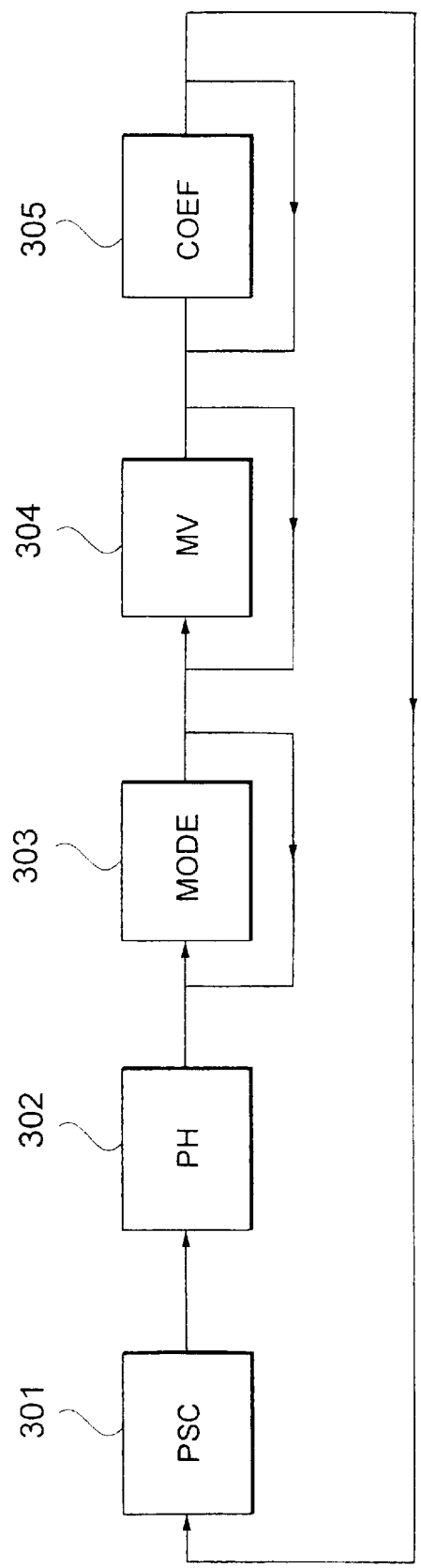
FIG. 2 is a diagram illustrating a multiplexing rule in a multiplexer of the dynamic image coding system of FIG. 1.

FIG. 2 is a diagram illustrating a multiplexing flow in the multiplexer 111. The multiplexing is carried out for each coding frame. First, a synchronization code 301 is multiplexed. When the synchronization code 301 is multiplexed, the synchronization code insertion request signal 203 is outputted from the multiplexer 111, and the coding system 200 has notice that the multiplexed code word is a synchronization code. Then, picture headers 203 representative of various coding modes of the coding frame are multiplexed to be the multiplexed code string 201. Then, a prediction mode information 303 representative of a prediction mode in a motion-compensated adaptive predictor MC in each region is multiplexed, and a motion vector information 304 and a DCT coefficient 305 of a predictive residual signal (hereinafter referred to as a "residual DCT coefficient") are multiplexed. When the picture header 302, the prediction mode information 303, the motion vector information 304 and the residual DCT coefficient 305 are multiplexed, the FEC kind identifying signals 202 representative of the kind of error correcting/detecting codes, corresponding thereto are outputted.

The error correcting/detecting codes of high correct-ing/detecting capabilities are used for the picture header 302, the prediction mode information 303 and the motion vector information 304, which greatly deteriorate the picture quality if an error is mixed:. On the other hand, if an error is mixed into the residual DCT coefficient 305, it is possible to prevent the picture quality from greatly deteriorating by detecting the error and setting the residue to be zero. Therefore, the error correcting capacity is not required to be high, and only the error detection may be carried out.

Figure 3:
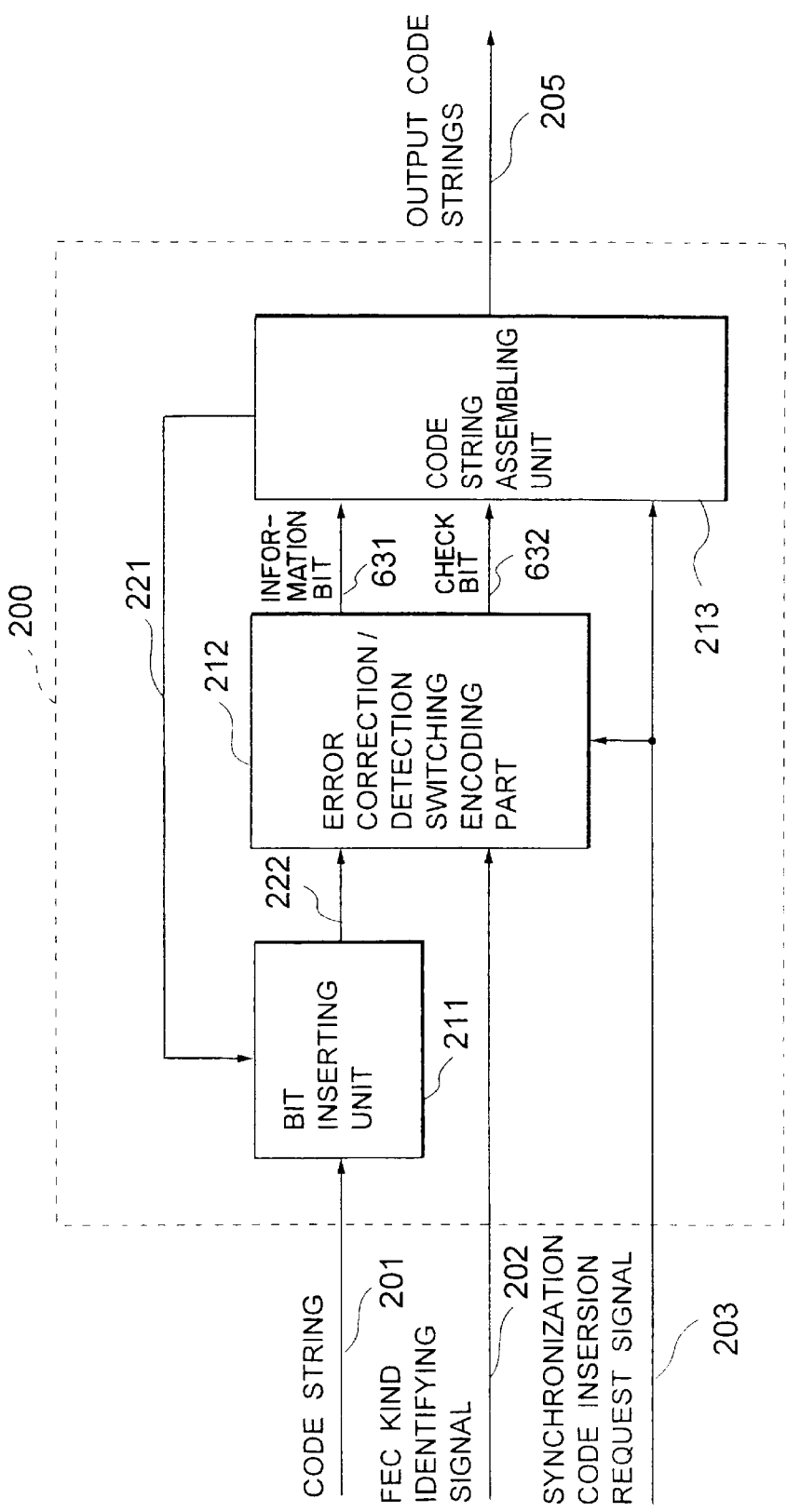
FIG. 3 is a block diagram of an output coding unit of the dynamic image coding system of FIG. 1.
Figure 4:
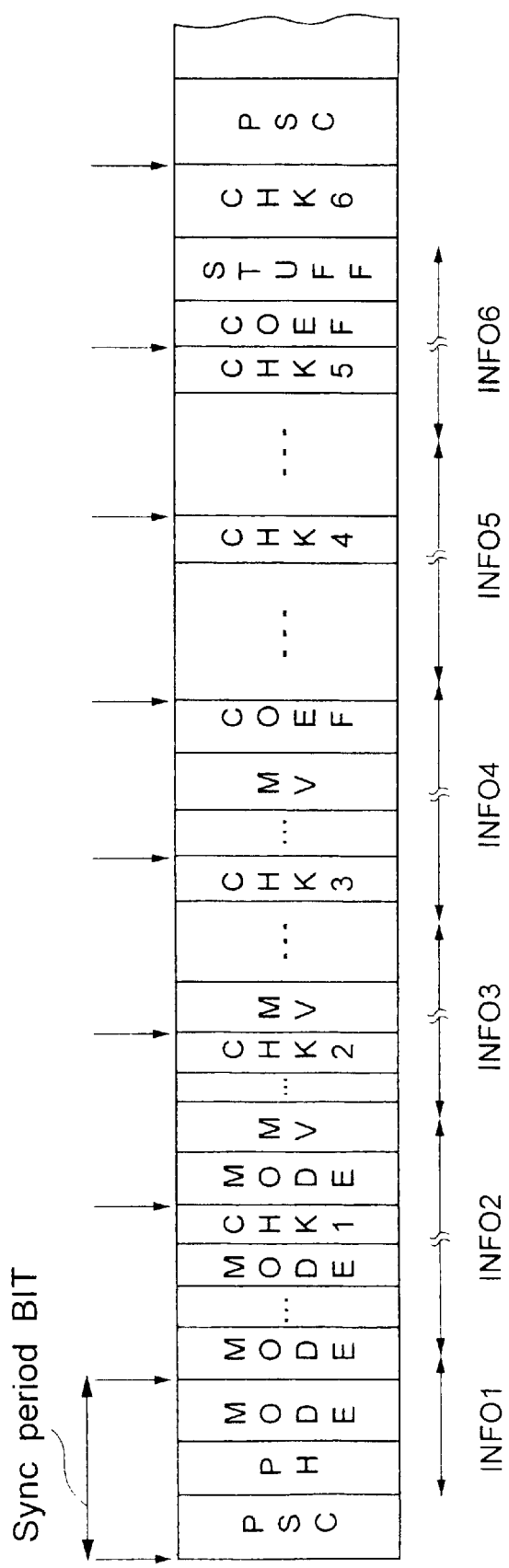
FIG. 4 is a diagram illustrating an example of an output code string of the dynamic image coding system of FIG. 1.

FIG. 3 is a block diagram of an output coding unit of FIG. 1. The output coding unit 200 comprises a bit inserting unit 211, an error correction/detection switching encoder 212 and a code string assembling unit 213. FIG. 4 shows an example of an output code string 205 produced by the output coding unit 200. In FIG. 4, PSC denotes a synchronization signal, PH denotes a picture header, MODE denotes a prediction mode information, MV denotes a motion vector, CHK denotes a check bit of an error correcting/detecting code, DOEF is a residual DCT coefficient, and STUFF denotes a stuffing bit (an inserted bit). This output code string 205 has the following characteristics.

(1) The synchronization codes PSC are inserted into only synchronization code inserting positions indicated by arrows, which are arranged at regular intervals (every sync_period bits). The length of the sync_period is set to be greater than the length of the synchronization code PSC and the maximum length of the check bit CHK. The check bit CHK is shifted so as to be arranged immediately before the synchronization code inserting position.

(2) The error correcting/detecting code at the end part of a frame, i.e., a synchronization period between a synchronization code PSC and the next PSC, is a degenerate code for encoding only the finally remaining information bit, and the stuffing bits STUFF having the number of bits required to displace the check bit CHK (CHK6 in the example of FIG. 4) are inserted.

(3) The FEC kind identifying signal representative of the kind and number of the error correcting/detecting codes does not exist in the output code string 205 of FIG. 4.

In this output code string 205, since the check bit CHK is displaced as described in (1), no check bit CHK enters the synchronization code inserting positions indicated by the arrows, so that there is no probability that a pseudo synchronization is produced by the check bit CHK. In addition, in a case where the error correction/detection coding of the end of the frame is carried out as described in (2), it has been required to insert many inserted bits (dummy bits) in the prior art. However, in this preferred embodiment, since the end of the frame has the degenerate code, the number of inserted bits may be small. Moreover, as described in (3), since the header information representative of the kind and number of the error correcting/detecting codes are contained in the output code string 205, the amount of codes is not increased therefor.

Comparing the multiplexed code string 201 of FIG. 2 outputted from the multiplexer 111 with the output code string 205 of FIG. 4, the construction and operation of the output coding unit 200 of FIG. 3 for producing such an output code string 205 will be described in detail below.

Figures 5, 6:
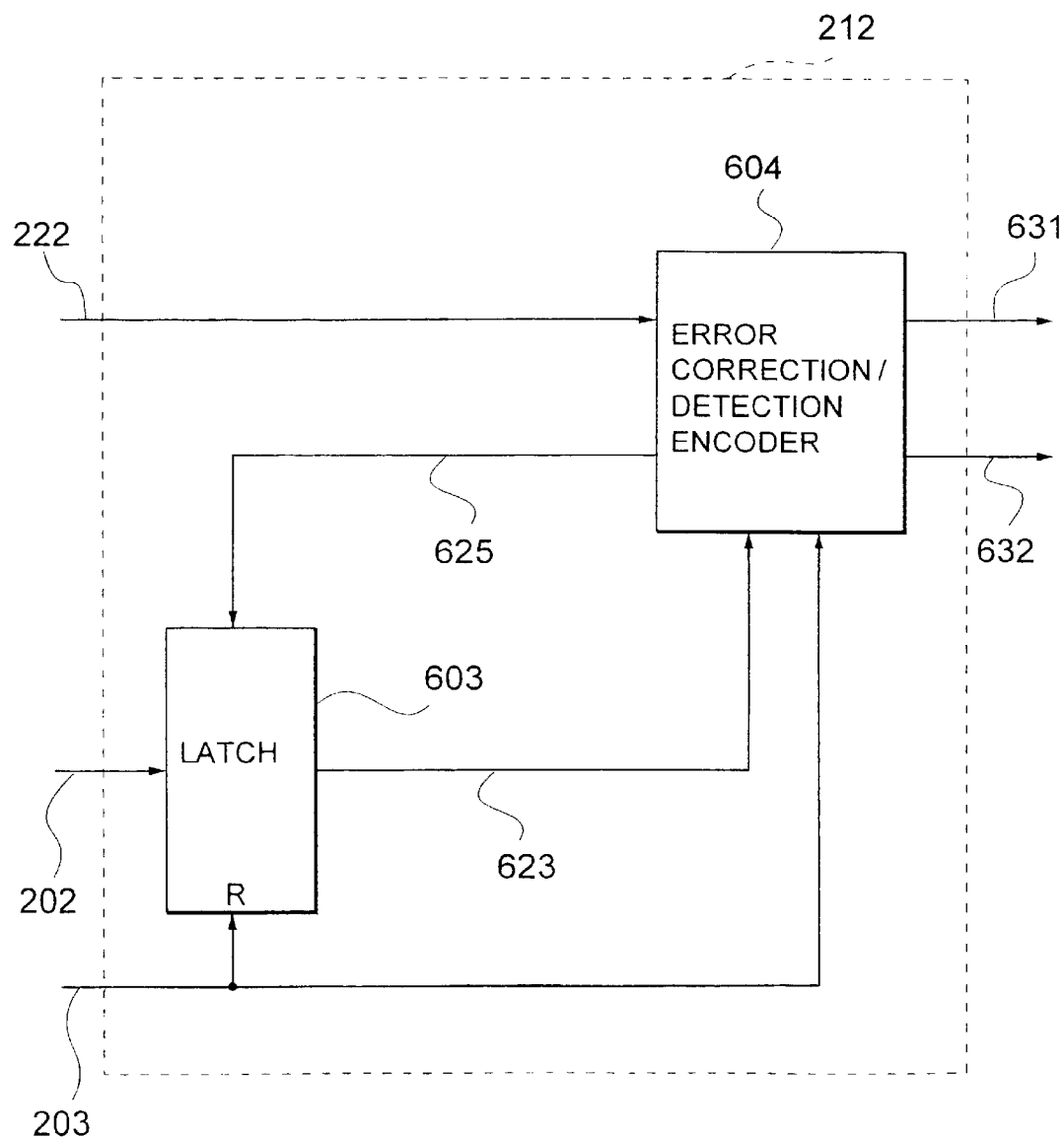
FIG. 5 is a diagram illustrating an example of a synchronization code.
FIG. 6 is a block diagram of an error correction/detection switching coding part in the output coding unit of FIG. 3.

When the synchronization code 301 is multiplexed in the multiplexer 111, the synchronization code insertion request signal 203 is outputted as described above. For example, as shown in FIG. 5, the synchronization code 301 comprises "0"s of sync_0_len bits, a "1" of one bit, and a "xxxxx" of sync_nb_len bits representative of the kind of the synchronization code 301. The output coding unit 200 outputs a synchronization code (PSC) serving as an output code string 205 from the code string assembling unit 213 when receiving the synchronization code 301 and the synchronization code insertion request signal 203 from the multiplexer 111.

As shown in FIG. 4, since the synchronization code 301 can be inserted only at the synchronization code inserting positions arranged at intervals of sync_period bits, when the end of the output code string 205 produced is not arranged at the synchronization code inserting position, a stuffing bit STUFF is inserted so that the synchronization code 301 is arranged at the synchronization code inserting position as described later.

After the synchronization code 301 is outputted to the output code string 205, the picture header 302, the prediction mode information 303, the motion vector information 304 and the residual DCT coefficient 305 are encoded as follows. The bit insertion into the multiplexed code string 201 outputted from the multiplexer 111 is carried out to prevent a pseudo synchronization from occurring in the bit inserting unit 211,. That is, if the same bit pattern as the code word of the synchronization code 301 exists in the output code string 201, the bit insertion is carried out, if necessary, in order to prevent the synchronization code 301 from being not able to be uniformly decoded. For example, in a case where the synchronization code 301 is a code word having continuous "0"s of sync_0_len bits as shown in FIG. 5, if a "1" is inserted so that "0"s of the sync_0_len bits or more do not continue in code strings other than the synchronization code 301, it is possible to prevent a pseudo synchronization from being produced.

As described above, since the synchronization codes 301 are inserted only at the synchronization code inserting positions, the bit inserting operations for preventing the pseudo synchronization from occurring may be carried out only at the synchronization code inserting positions. Therefore, a counted value 221 representative of the total number of bits of the output code strings 205 produced is outputted from the code string assembling unit 213, and it is determined by the bit inserting unit 211 on the basis of the counted value 221 whether the bit insertion is required. Assuming that the counted value 221, i.e., the total number of bits of the output code strings 205 produced, is total_len, the number of "1"s in the multiplexed code string 201 is counted in an interval wherein 0<total_len mod sync_period≦sync_0_len. If no "1" exists in this interval, a "1" of one bit is inserted. A mod B denotes a remainder when A is divided by B.

In addition, in order to decrease the probability of the error detection of the synchronization code 301, the bit insertion may be carried out as follows.

In order to detect the synchronization code 301 even if an error of n bits is mixed into the synchronization code 301, it is required to determine that a code word having a, hamming distance of n or less from a true synchronization code in an input decoding unit of a dynamic image decoding system as described later is a synchronization code. However, if such a determination is carried out while the code strings other than the synchronization code 301 are as they are, bit patterns having a hamming distance of n or less from the synchronization code may exist even in the code strings other than the synchronization code 301. Therefore, if this is arranged at the synchronization code inserting position, it may be erroneously determined to be the synchronization code 301.

Therefore, the bit insertion into the multiplexed code string 201 is carried out by means of the bit inserting unit 211, so that the code strings other than the synchronization codes arranged at the synchronization code inserting positions in the multiplexed code string 201 are transformed so as to have a humming distance of 2 * n+1 or more from the synchronization code 301. Specifically, the number of "1"s (assumed to be nO) is counted in an interval wherein 0<total_len mod sync_period≦sync_0_len−(2 * N+1). If n0 is equal to or less than 2 * n+1, "1"s of 2 * n+1−n0 bits are inserted into the multiplexed code string 201.

Thus, a code string 222, in which the bit insertion is carried out by means of the bit inserting unit 211, together with the FEC kind identifying signal 202 representative of the kind of an error correcting/detecting code, is inputted to the error correcting/detecting code switching encoding part 212.

FIG. 6 is a block diagram of an error correcting/detecting code switching encoding part 212. A latch circuit 603 is a circuit for latching a FEC kind identifying signal 202. When the output of a synchronization code from the multiplexer 111 to the multiplexed code string 201 is completed to stop the output of the synchronization code insertion request signal 203, the latch circuit 603 latches the FEC kind identifying signal 202 to supply a latched signal 623 to an error correction/detection encoder 604.

An error correction/detection encoder 604 carries out the error correction/detection coding of a code string 222, which is outputted from a bit inserting unit 211, on the basis of the latched signal 623 to output an information bit 631 and a check bit 632. In addition, when the error correction/detection coding of one block is completed, the error correction/detection encoder 604 outputs a latch indicating signal 625, which indicates the latch of the next FEC kind identifying signal 202, to the latch circuit 603. The latch circuit 603 latches in accordance with the latch indicating signal 625 to supply the latched signal 623 to the error correction/detection encoding 604.

The aforementioned operation is repeated in the output coding unit 200, so that the error correction/detection coding of the bit-inserted code string 222 outputted from the bit inserting unit 211 is carried out while switching the error correcting/detecting code in the error correct-ion/detection switching encoder 212 on the basis of the FEC kind identifying signal 202 outputted from the multiplexer 111. Since the FEC kind identifying signal 202 is latched by the latch circuit 603 only at the time that the coding of the error correcting/detecting code of one block is completed the same error correcting/detecting codes are applied before this switching point. For example, in a case where the picture header 302 uses an error correcting/detecting code FEC1 and the prediction mode information 303 uses an error correcting/detecting code FEC2, if the number of bits of the picture header 302 is smaller than the number of information bits of one block of the FEC1, the FEC1 is used as the error correcting/detect-ing code of the subsequent prediction mode information 303 until the number of bits of the picture header 302 reaches the number of information bits of the FEC1.

Figure 7:
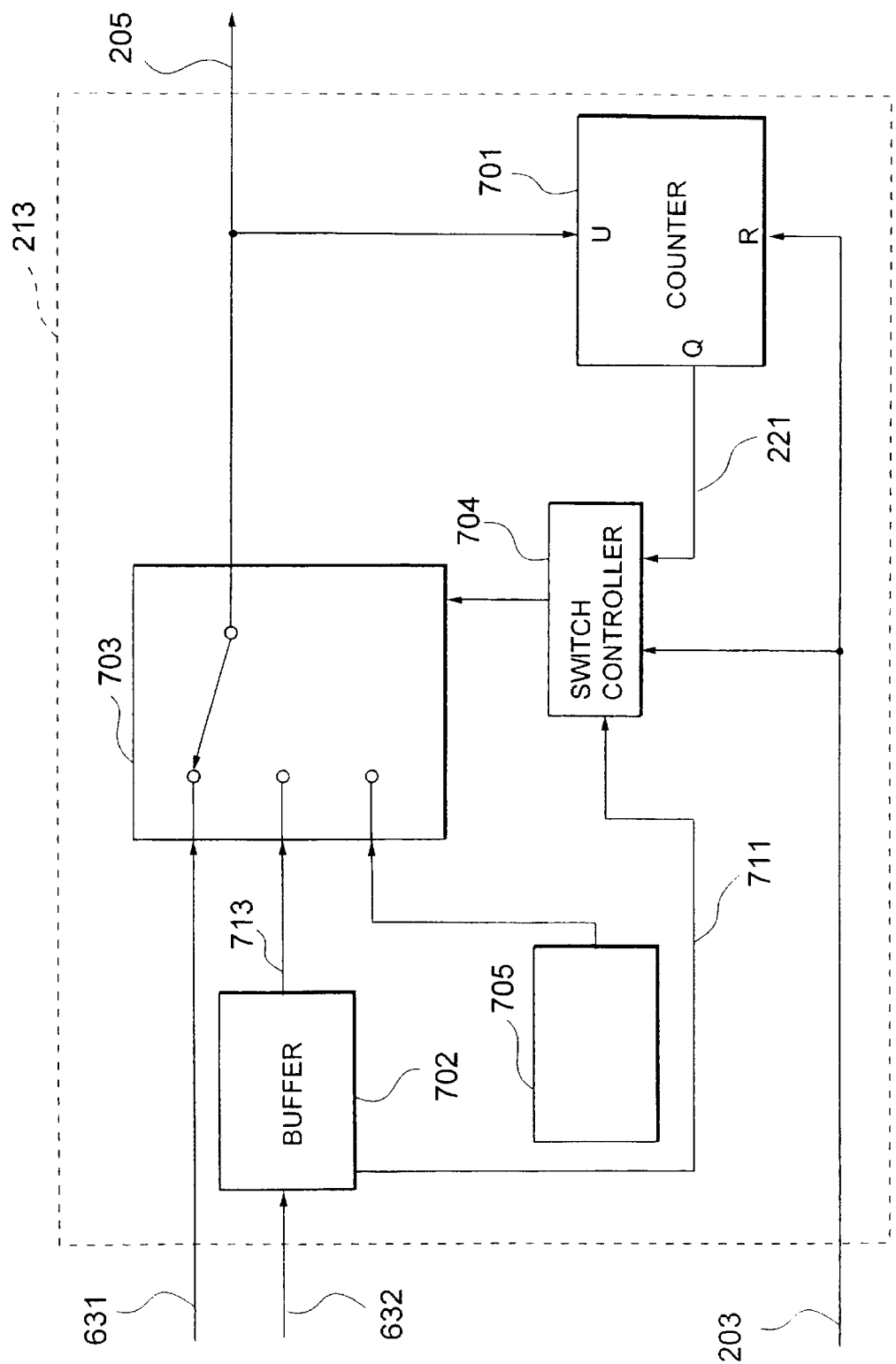
FIG. 7 is a block diagram of a code string assembling unit of the output coding unit of FIG. 3.

FIG. 7 is a block diagram of a code string assembling unit 213 of FIG. 3. The code string assembling unit 213 comprises a counter 701 for counting the number of bits of the output code string 205, a buffer 702 for temporarily storing the check bit 632 and the number of bits thereof, a switch 703 for switching the output code string 205, and a switch controller 704 for controlling the switch 703.

The counter 701 is reset to be a value of a synchronization code length sync_len when the synchronization code insertion request signal 203 is inputted, and counts up sequentially from the next bit of the synchronization code until the next synchronization code is inputted. The switch 703 is operated so that the information bit 631 is outputted before the initial check bit 632 is inputted after the synchronization code is inputted. When the check bit 632 is inputted, it is stored in the buffer 702 and the number of bits thereof (the number of check bits) 711 is outputted from the buffer 702 to the switch controller 704.

The switch controller 704 controls the switch 703 on the basis of the number 711 of check bits and the counted value 221 of the counter 701 so that the check bit is displaced in order to prevent the check bit 632 from being outputted to the synchronization code inserting position as described above. For example, assuming the counted value 221 is bit_count and the number 711 of check bits is check_len, the information bit 631 is outputted when bit_count mod sync_period<sync_period−check_1 en, and a check bit 713 stored in the buffer 702 is outputted when sync_period−check_len≦total_bits mod sync_period<sync_period. Thereafter, the aforementioned process is repeated while the information bit 631 and the check bit 632 are inputted.

As described above, since the output coding unit 200 uses a degenerate code as an error correcting/detecting code at the end portion of one frame and performs the bit insertion to displace the check bit, it performs operation different from usual operations of portions other than the end portion. That is, when the output of the multiplexed code string 201 of one frame is completed, the multiplexer 111 outputs a synchronization code insertion request signal 203 for the next frame. In response thereto, the error correcting/detecting code 604 in the error correction/detection switching encoding part 212 of FIG. 6 performs the error correction/detection coding using a degenerate code, assuming that a shortage of the information bits 631 of the error correcting/detecting code is a predetermined bit pattern outputted from an inserted bit generator 705. This bit pattern may be a bit pattern wherein all bits are "1"s or "0"s, or may be a specific repeated pattern such as "0101 . . . ". This compensated inserted bits are not outputted to the information bit 631.

In the code string assembling unit 213 of FIG. 7, after the information bit.613 is outputted to the end, the switch 713 is switched from the bit generator 705 to the input, and the inserted bits are inserted so that the check bit 713 stored in the buffer 702 is arranged immediately before the next synchronization code. Assuming that the counted value 221 of the counter 701 is total_len when the last information bit 631 of one frame is outputted and that the number of the finally outputted check bits 632 is last_check_len, the number of inserted bits stuffing_len is stuffing_len=sync_period−last_check_len−(total_len mod sync_period). Furthermore, in a case where no degenerate code is used, it is required to insert (into_len−last_into_len) bits, which is a shortage of the last information bit last_into_len from the usual information bit into_len, and to insert a shortage of bits for displacing the check bit. Therefore, it is required to insert more inserted bits than those in the use of the degenerate code, by into_len−last_into_len+(into_len−last_into_len) mod sync_period.

Thus, after the code string assembling unit 213 outputs the information bits 631 and the inserted bits to the output code string 205 via the switch 703, and it finally outputs the check bit 713 to the output code string 205.

The first preferred embodiment of a dynamic image decoding system, according to the present invention, will be described below.

Figure 8:
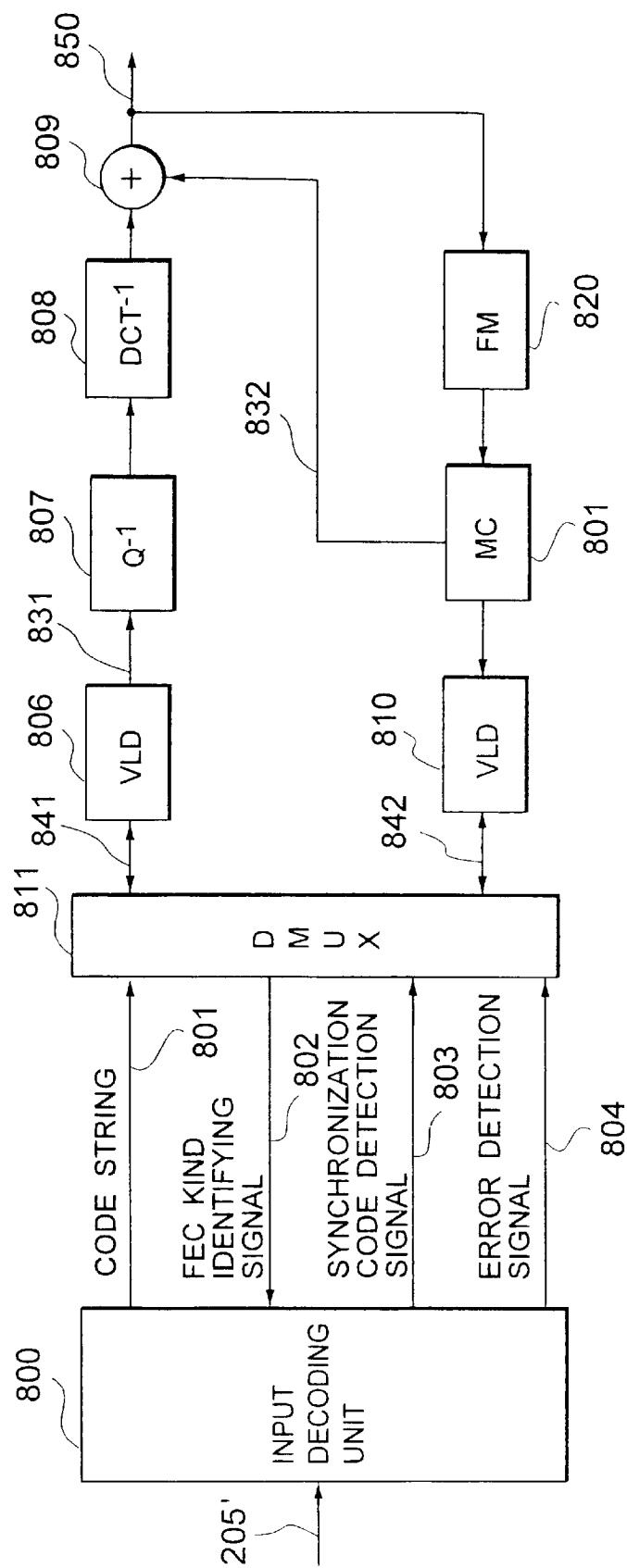
FIG. 8 is a block diagram of the first and second preferred embodiments of a dynamic image decoding system according to the present invention.

FIG. 8 is a block diagram of a dynamic image decoding system corresponding to the dynamic image coding system of FIG. 1. The output code string 205 outputted from the dynamic image decoding system of FIG. 1 passes through a transmission/storage system to be inputted to an input decoding unit 800 as an input code string 205'. In this preferred embodiment, the input decoding unit 800 corresponds to a decoding system of the present invention.

The input decoding unit 800 switches error correcting/detecting codes on the basis of a FEC kind identifying signal 802 representative of the kind of an error correcting/detecting code outputted from a downstream demultiplexer 811, to output a code string 801, which has been error correction/detection encoded, a synchronization code detection signal 803 and an error detection signal 804. The demultiplexer 811 receives the code string 801, the synchronization code detection signal 803 and the error detection signal 804 to separately output a prediction residual signal 841 and a motion-compensated adaptive prediction information code 842.

The prediction residual signal 841 and the motion-compensated adaptive prediction information code 842 are inputted to first and second variable length decoders 806 and 810, respectively. For a residual DCT coefficient 831 decoded by the first variable length decoder 806, a series of processes are carried out, i.e., the inverse quantization is carried out by means of an inverse quantizer 807 and the inverse discrete cosine transform is carried out by means of an inverse DCT unit 808. Then, the processed residual DCT coefficient is added to a motion-compensated adaptive prediction signal 832, which is an output of the motion-compensated adaptive predictor 801, in an adder 809 to be outputted as a reconstructed image signal 850. The reconstructed image signal 850 is outputted to the outside of the system and recorded in a frame memory 820. The motion-compensated adaptive prediction information decoded by the second variable length decoder 810 is inputted to the motion-compensated adaptive predictor 801 to produce the motion-compensated adaptive prediction signal 832.

The aforementioned processes are processes for producing a dynamic image so as to correspond to the dynamic image coding system of FIG. 1. The processes of the inverse quantizer 807, the inverse DCT unit 808, the adder 809 and the frame memory 820 are basically the same as those the inverse quantizer 107, the inverse DCT unit 108, the adder 109 and the frame memory 102 although the realizing means may be different. In addition, the processes in the first and second variable length decoders 806 and 810, the demultiplexer 811 and the input decoding unit 800 are inverse processes to those in the variable length encoders 106 and 110, the multiplexer 111 and the output coding unit 200, except for the case that an error is mixed into the code string.

Figure 9:
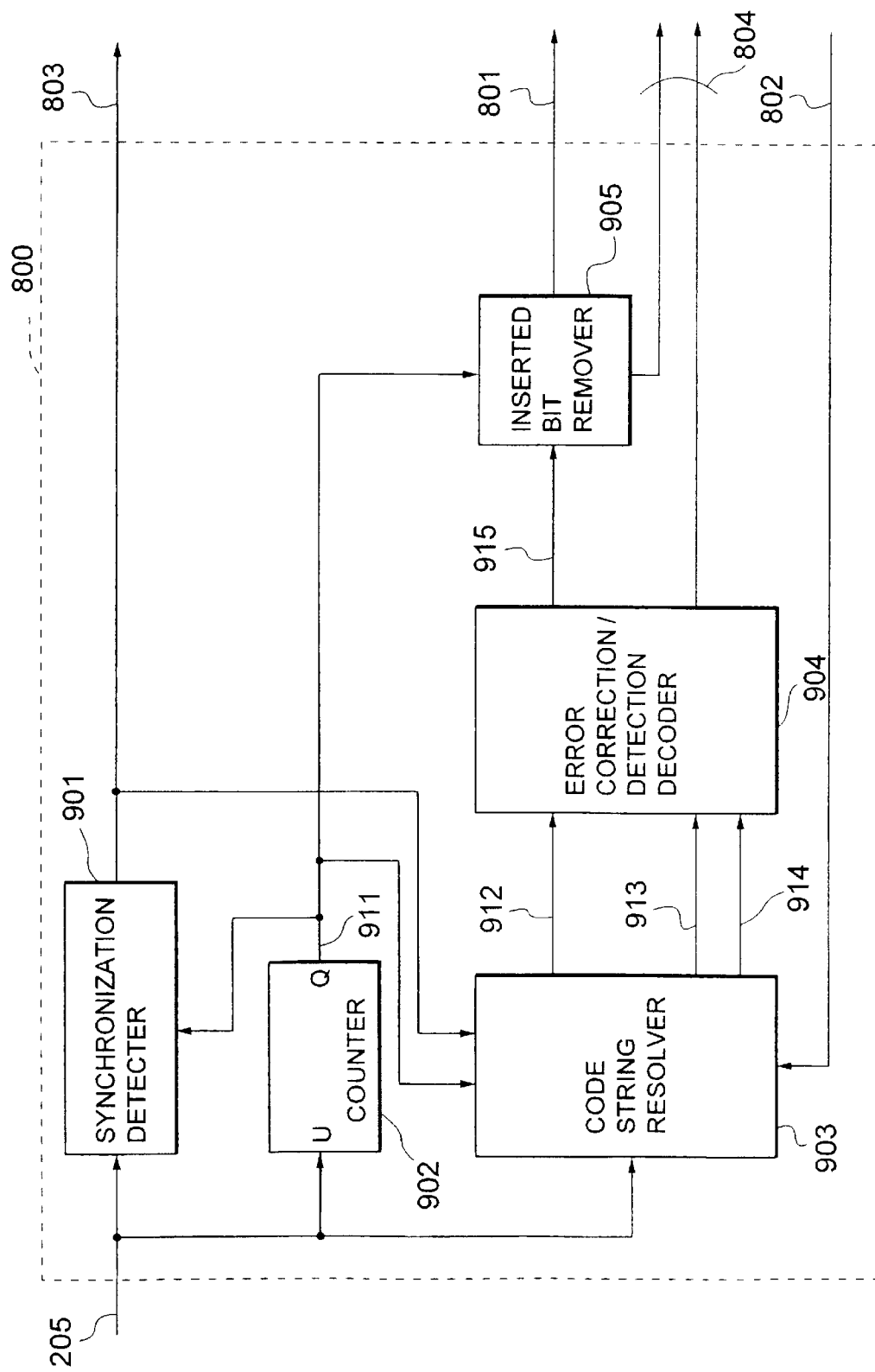
FIG. 9 is a block diagram of an input decoding unit of the dynamic image decoding system of FIG. 8.

FIG. 9 is a block diagram of the input decoding unit 800. The input decoding unit 800 comprises a synchroni-zation detector 901 for detecting a synchronization code in the input code string 205, a counter 902 for counting the number of bits of the input code string 205, a code string resolver 903 for resolving a code string into information bits 912 and check bits 913, an error correction/detection decoder 904, and an inserted bit remover 905.

The synchronization detector 901 detects synchronization codes only at the synchronization code inserting positions on the basis of the counted value 911 of the counter 902. For example, assuming that the interval between the adjacent synchronization code inserting positions is sync_period, the counted value 911 is bit_count, and the length of the synchronization code is sync_len, the synchronization detection is carried out only when 0<bit_count % sync_period≦sync_len.

Furthermore, the synchronization code may be detected in view of errors in the synchronization code.

In the bit inserting unit 211 of the output coding unit of FIG. 3, if the code string is transformed by inserting bits so as to have a humming distance of 2 * n+1 or more from the synchronization code in view of errors of n bits or less, even if it is determined that the code string having a humming distance of n or less from a true synchronization signal is a synchronization code, error synchronization detection does not occur when the error of n bits or less is mixed.

Figure 10:
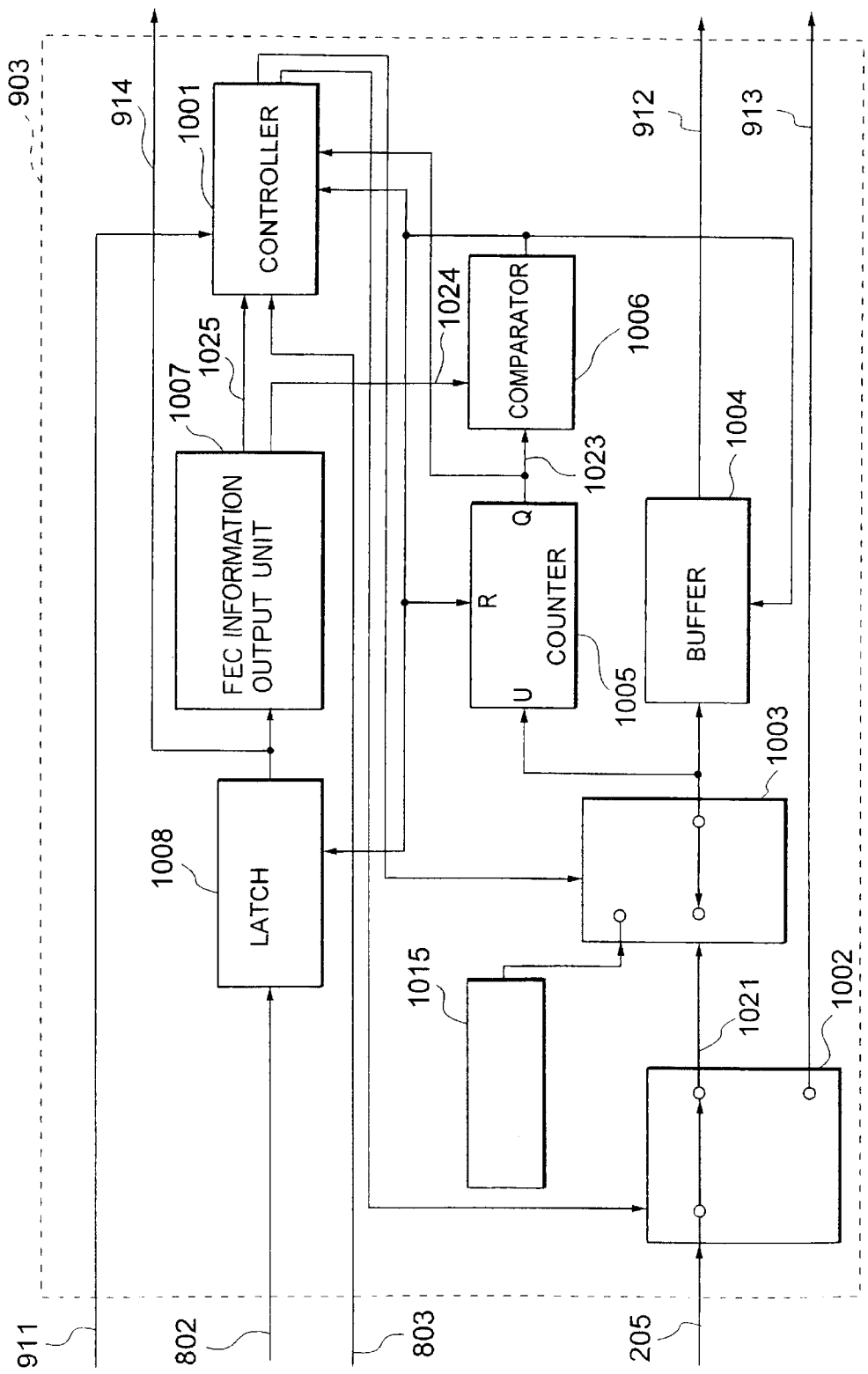
FIG. 10 is a block diagram of a code string resolver of input decoding unit of FIG. 9.
Figure 11:
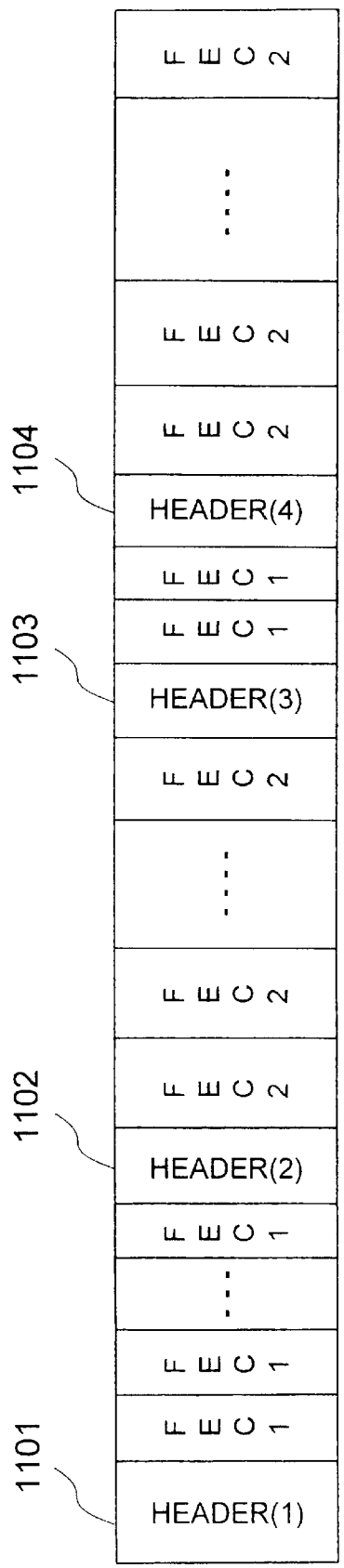
FIG. 11 is a diagram illustrating an example of a code string obtained by a conventional error correction/detection switching coding system.

FIG. 10 is a block diagram of the code string resolver 903. The input code string 205 is switched into information bits 1021 and check bits 913 by means of a first switch 1002 controlled by a controller 1001 which will be described later. When the information bits 1021 are outputted from the first switch 1002, an information bit length of the information bits 1021 are transmitted to a buffer 1004 via a second switch 1003 to be stored therein. A counter 1005 counts the number of output bits from the second switch 1003. A comparator 1006 compares a counted value 1023 of the counter 1005 with an information bit length 1024 outputted from an error correct-ing/detecting code information output unit 1007. When both are the same, the counter 1005 is reset, the FEC kind identifying signal 802 representative of the kind of an error detecting/correcting code is latched by means of a latch circuit 1008, and the buffer 1004 outputs the information bit 904. The output 914 of the latch circuit 1008 is inputted to the error correcting/detecting code information output circuit 1007, and outputted to the error correction/detection decoder 904 shown in FIG. 9.

As described above, the check bits of the error correcting/detecting code are displaced to be arranged between the information bits of the error correcting/detecting code after the code string 205. The controller 1001 controls so that the displaced check bits are separated from the information bits. When the input of the information bits of the error correcting/detecting code of one block is completed, the counted value 1023 corresponds to the information bit length 1024 in the comparator 1006. In response thereto, the controller 1001 receives a check bit length 1025 from the error correction/detection information output unit 1007, and calculates the positions of the check bits arranged between the next information bits. When it is determined by the comparator 1006 that both correspond to each other, assuming that the counted value 911 of the number of input bits of the code string 205' is bit_count and the check bit length is check_len, the check bit starting position check_start is check_start=(bit_count/sync_period+1) * sync_per iod–check_len, and the check bit end position check_end is check_end=(bit_count/sync_period_+1) * sync_period. The controller 1001 controls the switch 1002 so that the check bits 913 are outputted from the check_start to the check_end of the counted value 911.

Since the end of one frame is a degenerate code and the error correction/detection encoding thereof is carried out, it is specially processed. When reaching the end of one frame, a signal 803 representative of the detection of the next frame is outputted. In response to this signal 803, the controller 1001 calculates the positions of the check bits of the last error correcting/detecting code of the frame and the number of insufficient bits of the information bits. It is assumed that the counted value 911 of the number of bits of the code string 205' inputted when starting to input the last error correcting/detecting code of one frame is pre-last-count, the counted value 911 when the input of the code string 205' of one frame is completed is total_count, the counted value 911 during the process is bit_count, the check bit length of the last error correcting/detecting code of one frame is last_check_len, and the check bit length of the error correcting/detecting code immediately before of the last error correcting/detecting code is pre_last_check_len. First, the excess and deficiency of information bits due to the error correcting code being a degenerate code and due to the insertion of bits is calculated. Among the information bits of the last error correcting/detecting code of one frame, the number of bits contained in the output code string 205, last_info_len, is last_info_len=total_co unit-last_check_len-pre_last_count-pre_last_chec k_len. When last_info_len is shorter than the information length of the error correcting code info_len, it is determined that the error correcting code is a degenerate code. In addition, when the counted value 1023 is in the range of from last_into_len to info_len, the switch 1021 is switched to a bit pattern outputted from an inserted bit generator 1015, to make up for the deficiency of information bits due to degeneracy. The output bit pattern from the inserted bit generator 1015 generates the same bit pattern as that of the inserted bit generator 705 of FIG. 7 of the encoder.

On the other hand, when last_info_len is longer than info_len, it is determined that the error correcting code is the inserted bit part, so that the information bits 912 are not outputted for the portion wherein the counted value 1023 is equal to or greater than info_len. With respect to the check bits, the switch 1002 is controlled so as to output, as check bits, the output code string 205 when total_count–check_len<bit_count≦total_count.

The error correction/detection decoder 904 receives the information bits 912 and the check bits 913, which are outputted from the code string resolver 903, and decode the error correcting/detecting code on the basis of the FEC kind identifying signal 914 representative of the kind of the error correcting/detecting code latched by the latch circuit 1008 of FIG. 10, to output an error corrected code string 915 and an error detection signal 804.

The error corrected code string 915 is inputted to the inputted bit remover 905. The inserted bit remover 905 removes the inserted bits for preventing the pseudo synchronization signal inserted by the bit inserting unit 211 of the output coding unit 200. As described above, since the bit insertion is carried out only at the synchronization inserting position, the synchronization inserting position is determined on the basis of the counted value 911 of the counter 902.

For example, when the synchronization code word is that shown in FIG. 5 and when the bit inserting unit 211 inserts bits into the portion "0000 . . . " of the first sync_len bits of the synchronization code so that the humming distance from the synchronization code is greater than 2 * n+1, the number of "1"s (=n0) of "sync_0_len–(2 * n+1)" bits from the synchronization code inserting position is counted. When the n0 is equal to or less than 2 * n+1, 2 * n+1–n0 bits are removed. However, since it is determined that the inserted bit is "1", when the bit determined as the inserted bit by the inserted bit removing unit 905 is "0", it is considered that an error is, mixed in the synchronization code inserting interval. In this case, the error detection signal 804 is outputted.

Thus, the code string 801 decoded by the input decoding unit 800 is inverse multiplexed by means of the demultiplexer 811. This is operation for separating and output-ting the multiplexed code word as shown in FIG. 2. This inverse multiplexer 811 works with the first and second variable length decoders 806 and 810.

First, when the synchronization code detection signal 803 is inputted from the output decoding system 800, the demultiplexer 811 returns to the initial state of the frame process. Then, the kind of the error correcting/detecting code to the picture header is outputted as the FEC kind identifying signal 802 representative of the kind of the error correcting/ detecting code, and the code string 801 is inputted to decode the picture header 302, so that it is determined whether there is no error in the picture header. When there is no error, the kind of the error correcting/detecting code to the prediction mode information 303 is outputted as the FEC kind identifying signal 802, and the code string 801 is inputted to demultiplex the prediction mode information to output it to the second variable length decoder 810.

When all the prediction mode information is decoded, the second variable length decoder 810 outputs a signal representative thereof to the demultiplexer 811. In response thereto, the demultiplexer 811 outputs a FEC kind identifying signal representative of the kind of an error correcting/ detecting code to the motion vector information 304, and starts the demultiplexing of the motion vector information 304. The demultiplexed motion vector information is outputted to the second variable length decoder 810 to be decoded. When the decoding of all the motion vector information is completed, a signal representative thereof is outputted from the second variable length decoder 810 to the demultiplexer 811. In response thereto, the demultiplexer 811 outputs a FEC kind identifying signal representative of the kind of an error correcting/detecting code to the residual DCT coefficient, and demultiplexes the residual DCT coefficient 305 which is outputted to the first variable length decoder 806.

As described above, the kind of the error correcting-/ detecting code is determined on the basis of the multiplexing rule which is defined in the demultiplexer 811 so as to be the same as that of the output coding unit 200. Therefore, the output code string 205 is not required to contain the header information representative of the error correcting/detecting code and so forth.

In the error correction/detection decoder 904, it may be detected by the error detection code that an error is mixed in the input code string 205. In addition, as described above, an error of the inserted bits may be detected by the inserted bit removing unit 905. In these cases, the error detection code 804 is outputted from the input decoding unit 800. Moreover, when a code word, which does not exist in the variable length code word table, is detected in the variable length decoding process, it is determined that an error is mixed. In addition, when it is determined that a part is against the multiplexing rule in the demultiplexing process in the demultiplexer 811, it is determined that an error is mixed. In these cases, the input decoding unit 800 and the demultiplexer 811 carry out the following processes so as not to greatly deteriorate the reconstructed image.

(1) When an error is detected in the residual DCT coefficient, the residue of the corresponding part is set to be 0. When a intra coding mode is selected as a prediction mode, the reconstructed image signal in the corresponding region may be predicted on the basis of the reconstructed image signal in the reconstructed frame and the surrounding region.

(2) In a case where an error is detected in the prediction mode information and the motion vector, when the prediction mode information and the motion vector information in the region, in which the error is detected, can be presumed on the basis of the prediction mode information and the motion vector information in the surrounding region, the presumed information are used. When it is impossible, the reconstructed image signal in the corresponding region is predicted on the basis of the reconstructed image signal in the reconstructed frame and the surrounding region.

(3) When an error is detected in a picture header, if the picture header is used as it is, there is probability that the picture quality is very greatly deteriorated. Therefore, the reconstructed image of the last frame is used as the reconstructed image of the current frame.

In the aforementioned processes (1), (2) and (3), when the error has the influence on the subsequent codes to the next synchronization code because of the use of the variable length coding, the same processes are carried out for that portion.

While it has been described that the synchronization code detector 901 detects synchronization odes only at the synchronization code inserting positions (at intervals of sync_ period bits), the loss of bits and/or the insertion of error bits may occur in a transmission/storage medium. In such a case, the synchronization codes may be detected at positions other than the synchronization code inserting positions, and it may be determined that the positions, at which the synchronization codes are detected, are synchronization code inserting positions.

Second Preferred Embodiment

Figure 12:
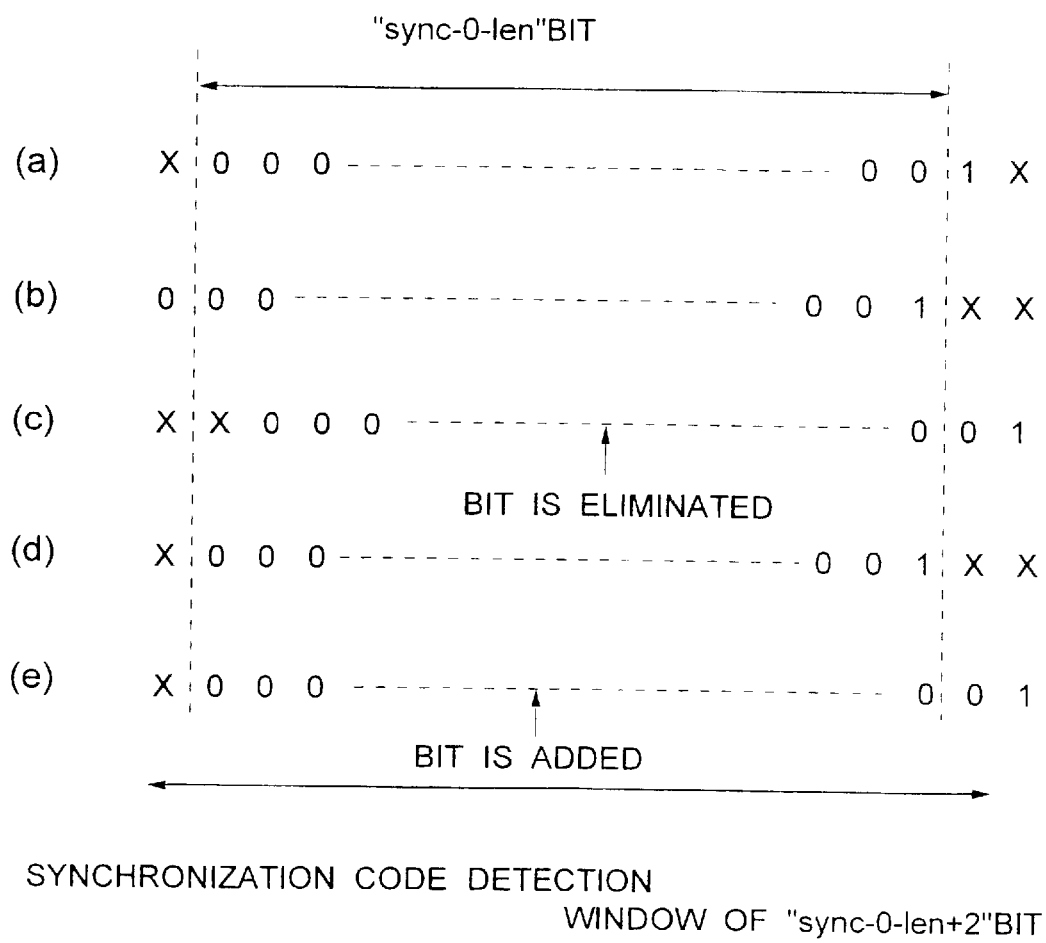
FIGS. 12a–12e are a diagram illustrating an example of a synchronization code, in which an error is caused by the addition/loss of a bit(s) in a transmission line, for explaining the second preferred embodiment of the present invention.
Figure 13:
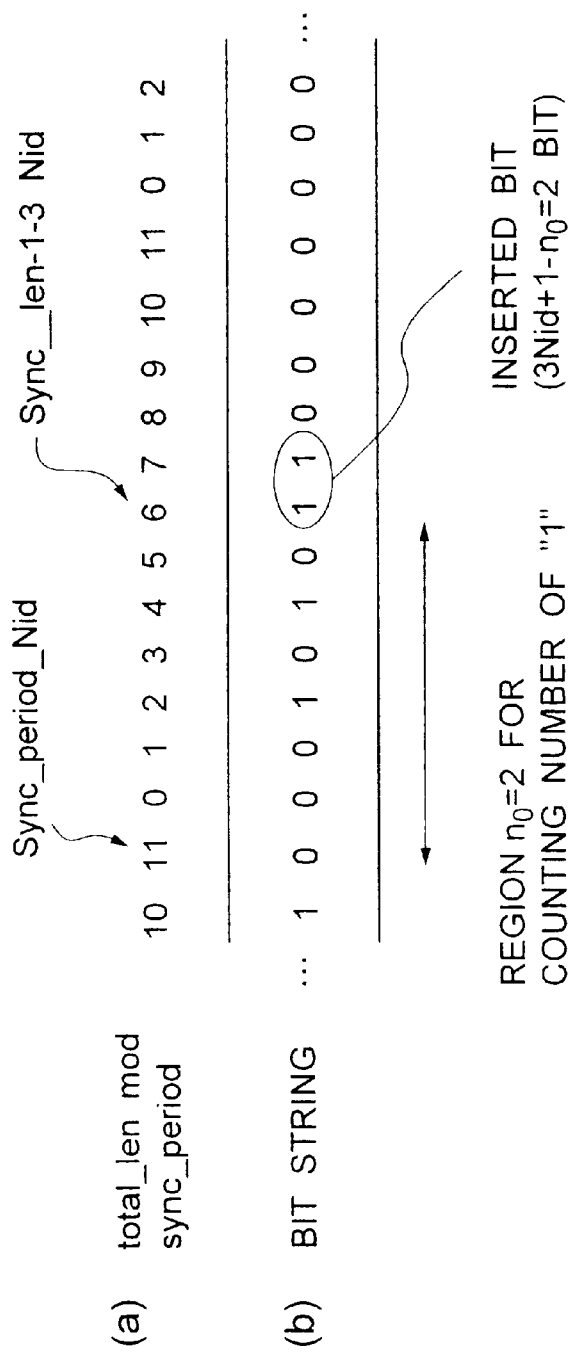
FIGS. 13a–13b are diagrams explaining the operation of a bit inserting unit of FIG. 3 in the second preferred embodiment.
Figure 14:
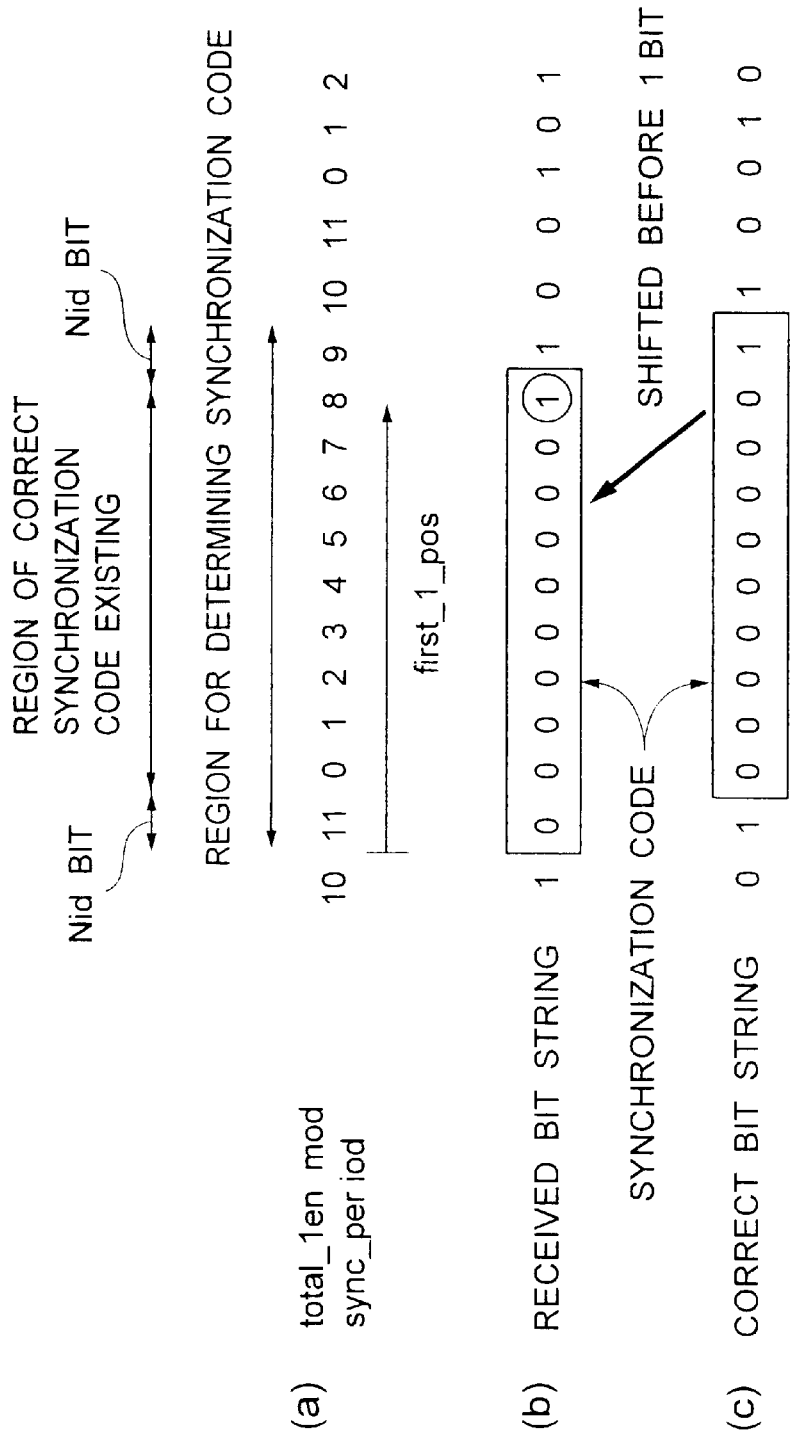
FIGS. 14a–14c are diagrams explaining the operations of a synchronization detector and an inserted bit removing unit of FIG. 9 the second preferred embodiment.

Referring to FIGS. 12 through 14, the second preferred embodiment of the present invention will be described below.

In this preferred embodiment, a dynamic image coding system and a dynamic image decoding system can surely detect synchronization even if a code string is transmit-ted/ stored in a transmission line/storage medium in which the number of bits is decreased due to the loss of a part of a bit string or the number of bits is increased due to the addition of excessive bits.

FIG. 12 is a block diagram showing the principle of a process for detecting synchronization when such addition/ loss of bits occurs. It is assumed herein that the right synchronization code comprises "0"s of sync_0_len bits and a "1" of,one bit as shown in FIG. 12(a). Furthermore, in FIG. 12, "x" denotes a bit other than a synchronization code.

FIGS. 12(b) through 12(e) show how the synchronization code is changed by the addition/loss of bits. It is assumed herein that the number of added/lost bits (Nid) is one bit at the maximum. FIG. 12(b) shows that one bit is eliminated from a bit string before a synchronization code, so that the whole synchronization code is shifted forwards by the one bit. FIG. 12(c) shows that one bit is added to a bit string before a synchronization code, so that the whole synchronization code is shifted backward by the one bit. FIG. 12(d) shows that a bit is eliminated from a synchronization code, so that the bits after the bit eliminating position indicated by the arrow are shifted forward by one bit. Moreover, FIG. 12(e) shows that one bit is added to a synchronization code at the bit adding position indicated by the arrow, so that the bits after the bit adding position are shifted backwards by the one bit.

In order to correctly detect synchronization even if the addition/loss of bits occurs, it is required to determine that the bit strings shown in FIGS. 12(b) through 12(e) are synchronization codes. As can be seen from FIG. 12, the number of "1"s contained in the interval of ±Nid bits at the right synchronization code inserting positions is sync_0_ len−3*Nid bits at the maximum. Therefore, synchronization may be detected in the interval of ±Nid bits at the synchronization code inserting positions on the decoding side, and if the number of "1"s contained in this range is less than the aforementioned value, it may be determined to be a synchronization code. In addition, in the coding system, code strings are transformed so that bit patterns of FIGS. 12(b) through 12(d) do not occur.

Mainly with respect to the difference from the first preferred embodiment, such coding/decoding systems will be described below.

The whole construction of the second preferred embodiment of a dynamic image coding system, according to the present invention, is the same as that of the first preferred embodiment of a dynamic image coding system, except for the operation of the bit inserting unit 211 of FIG. 3. FIG. 13 shows the operation of the bit inserting unit 211. That is, in the bit inserting unit 211 in the first preferred embodiment, the bit inserting operation is carried out only at the synchronization code inserting interval. On the other hand, in the bit inserting unit 211 in the second preferred embodiment, the bit insertion is carried out in a synchronization code inserting interval of ±Nid bits in order to prevent the same bit pattern as the synchronization code from being produced even if the addition/loss of Nid bits occurs at the maximum.

Assuming that the counted value 221 in FIG. 3 is total_len and the interval between the adjacent synchronization code inserting positions is sync_period, the bit inserting unit 221 counts the number of "1"s (assumed to be=n0) in the region of total_len mod sync_period=sync_0_len−1−3 * Nid on the basis of total_len mod sync_period=sync_period−Nid (mod: excess operation), and inserts "1" of "3 * Nid+1−n0" if n0 is less than 3 * Nid+1.

FIG. 13 shows an example of the operation of the bit inserting unit 211 when sync_period=12, sync_0_len=9, and Nid=1. In this example, since n0=2, "1"s of 3 * Nid+1−n0=2 bits are inserted.

By such bit insertion, it is ensured that the number of "0"s of ±Nid bits in the synchronization code inserting interval is equal to or greater than 3 * Nid bits, so that it is possible to uniformly identify synchronization codes.

On the other hand, the whole construction of the second preferred embodiment of a dynamic image decoding system, according to the present invention, is the same as that of the first preferred embodiment, except for the operations of the synchronization detector 901 and the inserted bit remover 905 in FIG. 9. FIG. 14 shows the operation of an inserted bit remover 905.

That is, the synchronization detector 901 detects synchronization codes in the range of ±Nid bits before and after the synchronization code inserting position, in order to detect synchronization even if the addition/loss of Nid bits occurs at the maximum.

First, it is determined whether synchronization codes exist at every synchronization code inserting position. That is, assuming that the counted value 911 of the counter 902 is bit_count, the number of "0"s (assumed to be=ns0) in the range of bit_count mod sync_period=sync_0_len−1+Nid is counted on the basis of bit_count mod sync_period=sync_period−Nid. When n0 is below 3 * Nid, it is determined that a synchronization code exists in this region.

FIG. 14 shows operation when sync_period=12, sync_0_len=9, and Nid=1. In this example, the number of "0"s is counted in the range that (bit_count mod sync_period) is from "1" to "8". In the example of FIG. 14, since ns0=2, it is determined that a synchronization code exists.

Then, it is determined what bits the code string is shifted by the addition/loss of bits in the synchronization code inserting interval, in which it is determine that a synchronization codes exists. In the case of sync_0_len bits shown in FIG. 14, the shifted amount from the position of the last "1" is determined. Specifically, after searching a "1" which first appears from the (sync_0_len+1 bits) th from the head of the synchronization code determining region, it is derived which bit the searched "1" is from the head of this synchronization code determining region (assuming that this is first_1_position bit). On the basis of the derived results, the shifted amount is derived from "the number of shifted bits first_1_pos−(sync_0_len+1+Nid)" (forward shift in the case of negative, and backward shift in the case of positive). In the example of FIG. 14, since first_1_pos=10, the number of shifted bits=10−(9+1+1)=−1, so that it is found that the code string is shifted forward by one bit.

Unlike the first preferred embodiment, in the inserted bit remover 905, the inserted bit removing process is carried out in the interval of ±Nid bits before and after the synchronization code inserting position. That is, on the basis of bit_count mod sync_period=sync_pe rinod−Nid, the number of "1"s (assumed to be=n0) is counted in the region of bit_count mod sync_period=sync_0_len−1−3 * Nid. When the n0 is equal to or less than 3 * Nid+1, the "1"s of 3 * Nid+1−n0 bits are removed.

In the second preferred embodiment, if the region, n which the addition/loss of bits occurs in a transmission line or a storage medium, can be determined by some method, the synchronization detecting process, the bit inserting process and the bit removing process, which consider the addition/loss of bits, may be carried out only in that region.

Furthermore, also in the dynamic image decoding system in the first preferred embodiment as described above, the synchronization detection corresponding to the addition-/loss of bits in a transmission line and/or a storage medium is carried out. Therefore, the synchronization detector 901 may detect synchronization in the synchronization code inserting interval, i.e., in the interval of ±Nid bits, similar to the second preferred embodiment. In this case, although a pseudo synchronization, which is erroneously determined to be a synchronization code while being a portion other than the synchronization code, may be produced, it is possible to inhibit the quality of a reproduced image from being deteriorated due to synchronization detection error in a transmission line and/or a storage medium which tends to cause the addition/loss of bits, so that the picture quality can be improved.

In addition, if the region, in which the addition/loss of bits occurs in a transmission line and/or a storage medium, can be determined by some process, that process may be carried out only in that region, and a usual synchronization detection may be carried out in other regions.

Figure 15:
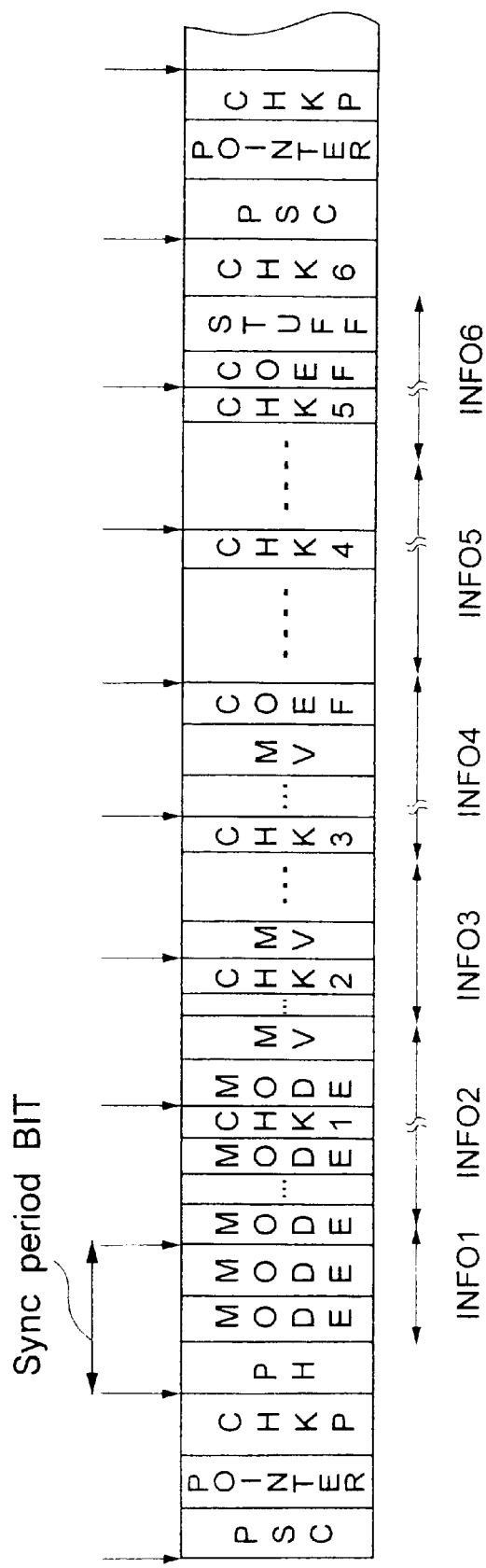
FIG. 15 is a diagram illustrating an example of a code string, in which a synchronization protection is carried out using a frame length information in the first and second preferred embodiments.
Figure 16:
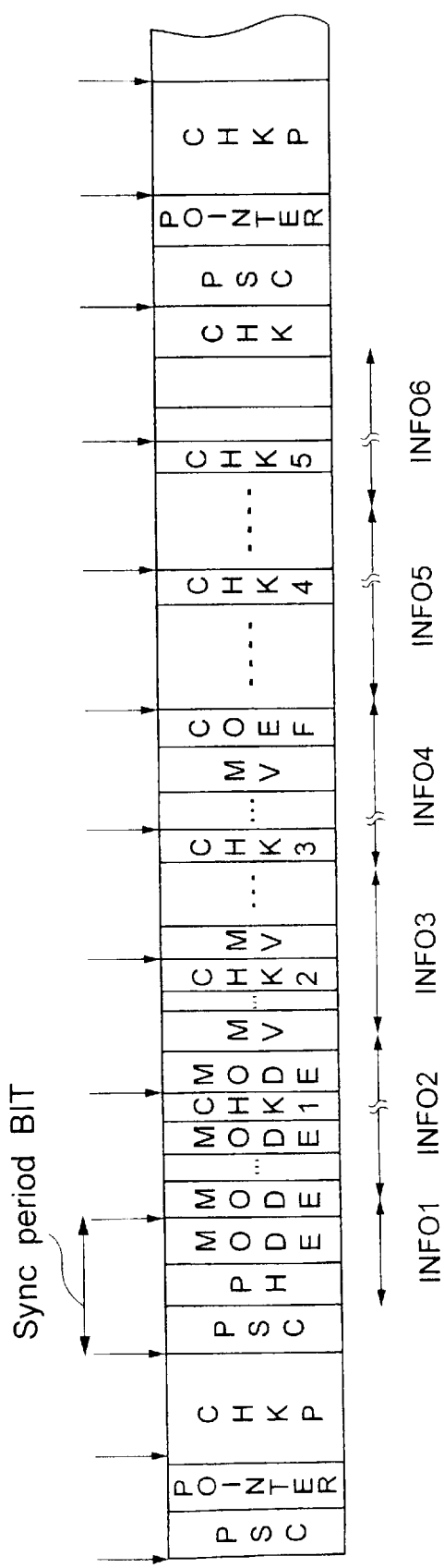
FIG. 16 is diagram illustrating another example of a code string, in which a synchronization protection is carried out using a frame length information in the first and second preferred embodiments.
Figure 17:
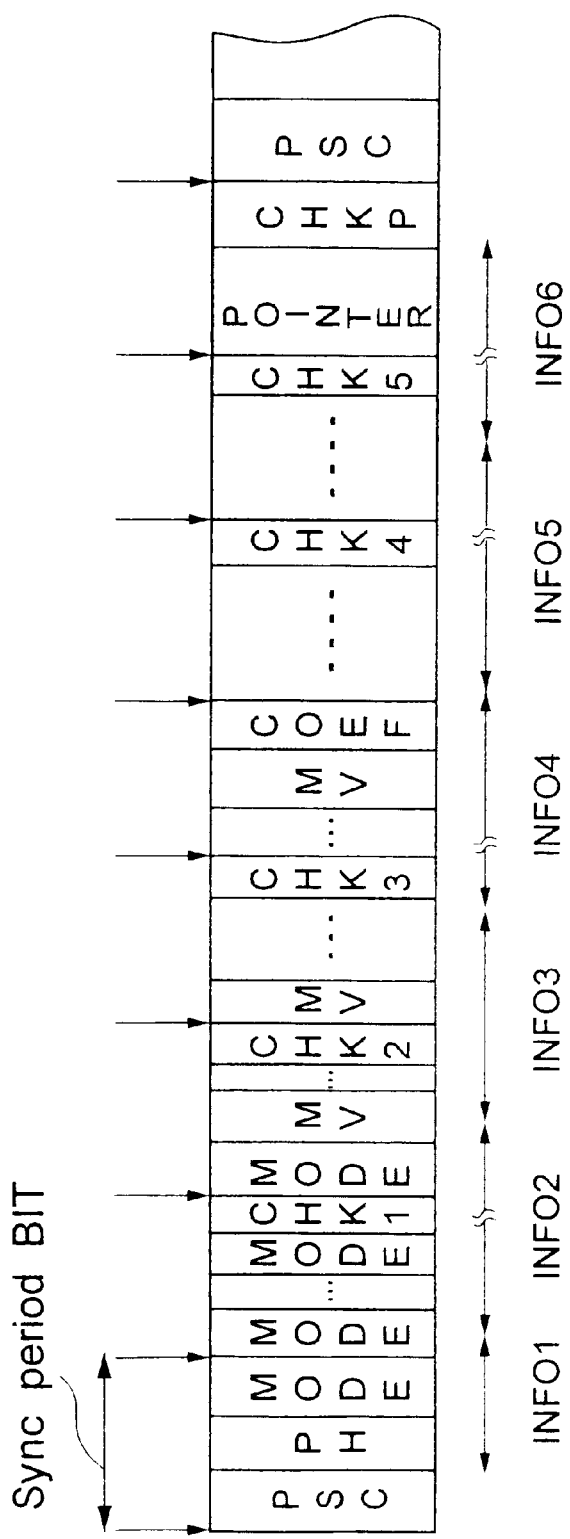
FIG. 17 is diagram illustrating further example of a code string, in which a synchronization protection is carried out using a frame length information in the first and second preferred embodiments.

Moreover, in the first and second preferred embodiments as described above, the synchronization may further protected using information representative of the length of a frame (which will be hereinafter referred to as a "frame length information"). FIGS. 15, 16 and 17 show examples of code strings using a frame length information POINTER.

In the example of FIG. 15, a frame length information POINTER and a check bit CHKP of an error correcting/detect-ing code for protecting the frame length information POINTER are arranged immediately after a synchronization code PSC. The number of bits of the last frame, i.e., information representative of the number of bits from the synchronization code of the last frame to the synchronization code of the current frame, is stored in the frame length information POINTER.

The coding system counts the number of bits a code string of one frame to transform the counted number into a frame length POINTER, and carries out the error correction-/detection encoding to produce a check bit CHKP. Then, as shown in FIG. 15, the coding system produces a code string immediately after the synchronization code of the next frame.

On the other hand, after the decoding system detects synchronization codes by the same method as those in the first and second preferred embodiments, it takes the subsequent frame length information POINTER and the check bit CHKP out of the code string, and carries out the error correction/detection decoding to decode the frame length information POINTER. Then, the decoded frame length information POINTER is compared with a value derived by counting the number of bits from the last detected synchronization code to the current synchronization code (frame length counted value), to check whether there is no error detection of synchronization codes.

If the frame length counted value is different from the code length of the last frame indicated in the frame length information POINTER, there is probability that a synchronization code is erroneously detected, so that the erroneously detected synchronization code is detected again using the frame length information POINTER. That is, it is assumed that a synchronization code, which could not detected, exists before the current synchronization code by the number of bits indicated by the frame length information POINTER. In this case, the interval between the last detected synchronization code and the current synchronization code is divided into two frames, i.e., the interval between the last synchronization code and the position indicated by the frame length information POINTER, and the interval between the position and the current synchronization code, to carry out the decoding process.

However, if the number of bits indicated by the frame length information POINTER is greater than the number of bits from the last detected synchronization code to the current synchronization code, it is assumed that the frame length information POINTER is erroneous, so that the aforementioned synchronization re-detecting process is not carried out.

If the numbers of bits of the frame length information POINTER and the check bit CHKP are great, the synchronization code PSC, the frame length information POINTER, and the check bit CHKP may extend in a plurality of synchronization intervals as shown in FIG. 16. In this case, the bit inserting process in the coding system and the bit removing process in the decoding system, which are performed in order to maintain a constant humming distance between a code string other than a synchronization code and the synchronization code, may not be carried out in an interval in which the frame length information POINTER and the check bit CHKP exist.

In the examples of FIGS. 15 and 16, in a case where the end half of a synchronization code PSC contains information representative of the kind of the synchronization code (the distinction between a frame synchronization code, a GOB synchronization code and so forth), the frame length information POINTER is not only protected, but the end half of the synchronization code PSC may be also protected by an error correcting code. Thus, since the kind of a synchronization code can be accurately detected in addition to the position of the synchronization code, the resistance to errors can be further improved.

In the example of FIG. 17, a frame length information POINTER and a check bit CHKP are arranged at the end of a frame (immediately before a synchronization code in the next frame). In this case, after the decoding system detects the synchronization code in the next frame, it takes out a frame length information POINTER and a check bit CHKP immediately before the detected synchronization code to carry out the error correction/detection decoding, to carry out the re-detection of the synchronization code by the same processes as those of FIGS. 15 and 16.

In the example of FIG. 15, since the synchronization codes exist only at the synchronization code inserting positions, the frame length information POINTER to be recorded may be a value derived by dividing the number of bits of the frame by a synchronization code inserting interval (=sync_period bits). Thus, the frame length can be indicated by a smaller number of bits.

In addition, in the first and second preferred embodiments, while there has been shown examples of a hierarchical coding for changing an error correcting/detecting code in accordance with the importance of the coded information, the same error correcting/detecting code may be used in the frame, or no error correcting/detecting code may be used. In such cases, it is possible to improve the capability to detect synchronization in comparison with conventional systems, by using the bit inserting process for maintaining a code string other than a synchronization code at a humming distance greater than a predetermined value from the synchronization code, and the synchronization code detecting process corresponding to the bit inserting process, as described in this preferred embodiment.

In addition, in the aforementioned preferred embodiments, while it has been shown that a dynamic image signal is high-efficiency compression encoded to be transmitted/stored, the present invention may be applied to the transmission/storage of a static image, voice, data or the like. For example, when the high-efficiency compression coding of a static image signal is carried out using the orthogonal transform, the error correcting/detecting code may be switched so as to more strongly carry out the error protection of a low component of a transform coefficient. In the method for modeling and encoding voice into a driving source and a vocal tract filter, the error correcting/detecting code may be switched so as to more strongly carry out the error protection of a pitch cycle, a vocal tract parameter and so forth.

Third Preferred Embodiment

The third preferred embodiment of the present invention will be described below. In this preferred embodiment, the error correcting/detecting code is not used. At this point, this preferred embodiment is different from the first and second preferred embodiments.

Figure 18:
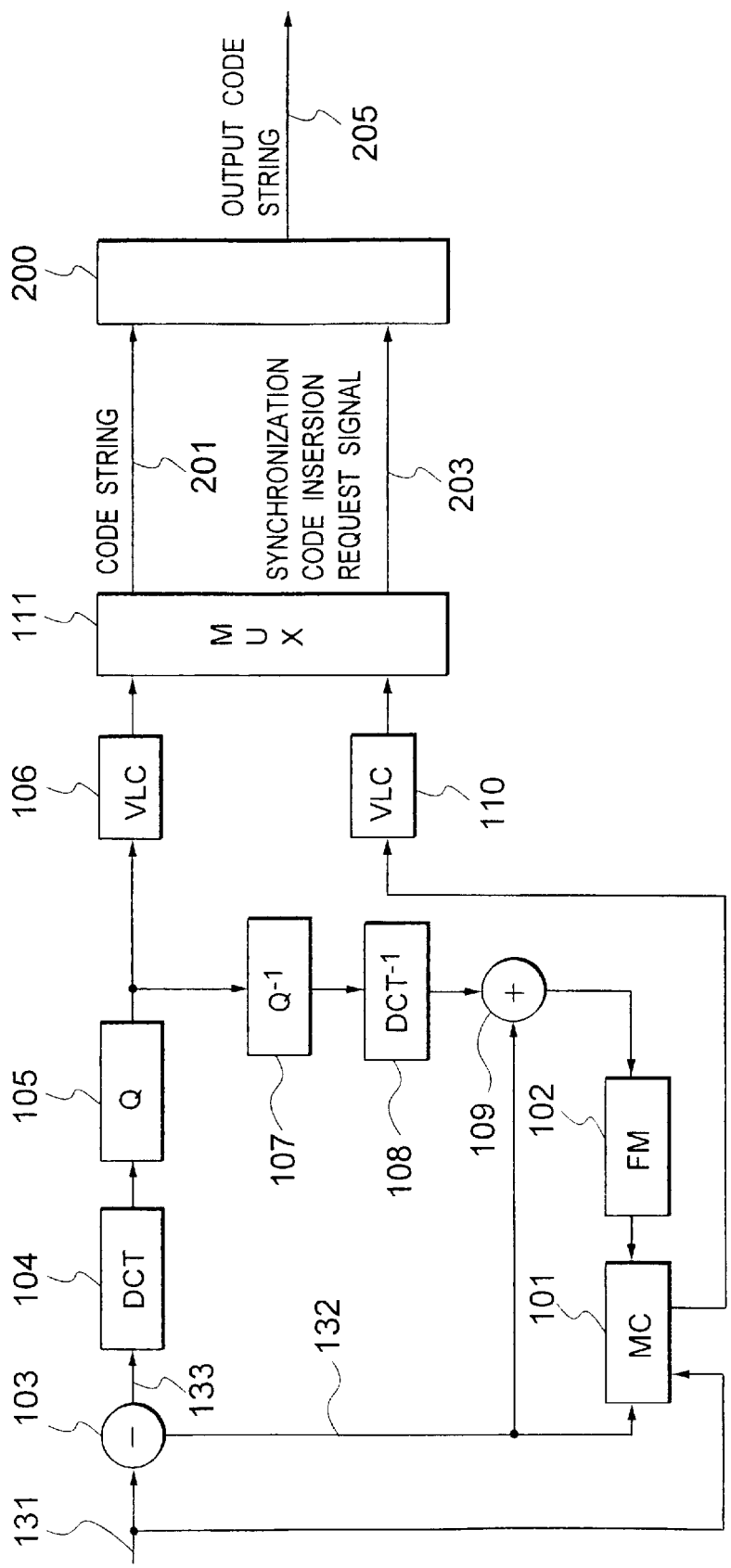
FIG. 18 is a block diagram of the third and fourth preferred embodiments of a dynamic image coding system according to the present invention.

FIG. 18 is a block diagram of a dynamic image coding system in this preferred embodiment. Using the same reference numbers as those in FIG. 1 for the parts corresponding to those in FIG. 1, the different points from the first preferred embodiment will be mainly described. In this preferred embodiment, the construction and operation of an output coding unit 200 are different. In addition, although the basic operation of a multiplexer 111 is the same as the multiplexer 111 of FIG. 1, the multiplexer 111 in this preferred embodiment outputs only a multiplexed code string 201 and a synchronization code insertion request signal 203 since the error correcting/detecting code is not used.

Figure 19:
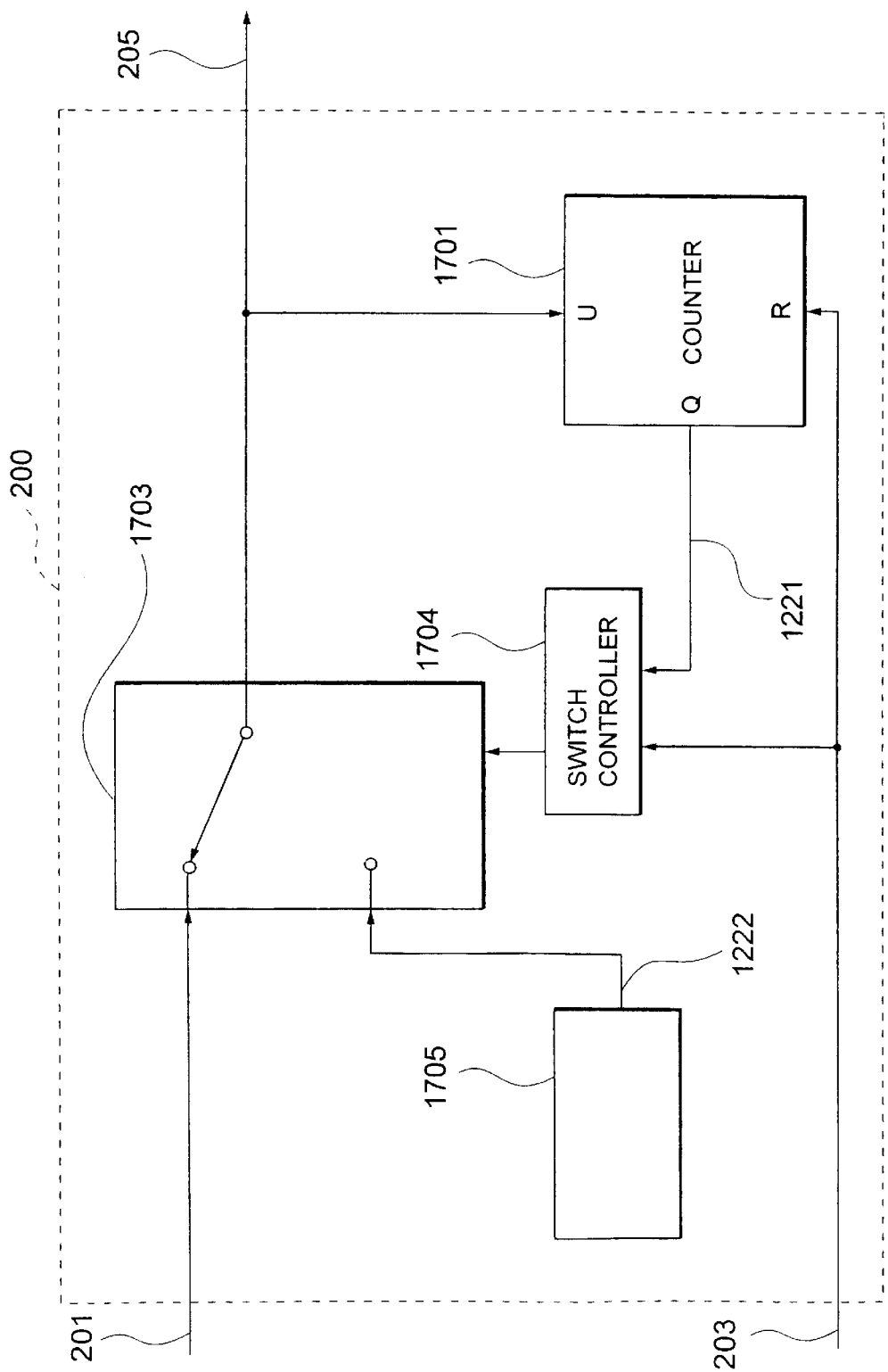
FIG. 19 is a block diagram of an output coding unit of the third preferred embodiment of a dynamic image coding system according to the present invention.

FIG. 19 is a block diagram of the output coding unit 200 of FIG. 18. The output coding unit 200 comprises a counter

1701 for counting the number of bits of an output code string 205, a switch 1703 for switching the output code string 205, a switch controller 1704 for controlling the switch 1703, and a stuffing bit generator 1705 for generating stuffing bits.

Figure 20:
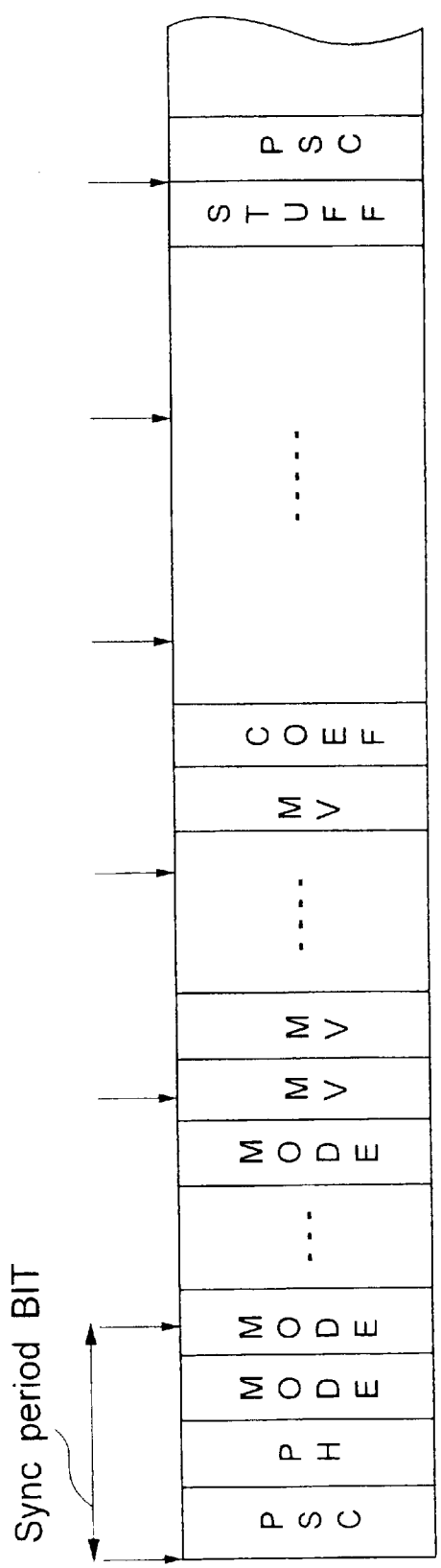
FIG. 20 is a diagram illustrating an example of an output code string of the third preferred embodiment of a dynamic image coding system according to the present invention.

FIG. 20 shows an example of an output code string 205 generated by the output coding unit 200 of FIG. 19. The same signs as those in FIG. 4 are used for code words corresponding to those of the output code string of FIG. 4. Similar to FIG. 4, each of synchronization codes PSC c- is inserted only at any one of, synchronization code inserting positions, which are arranged periodically, i.e., at regular intervals (sync_period bits) and which are indicated by arrows. FIG. 20 does not contain the check bit CHK for the error correcting/detecting code. At this point, FIG. 20 is different from FIG. 4. A stuffing bit STUFF is inserted into the end part of one frame of the output code string 205 so that a synchronization code PSC is inserted at the synchronization code inserting position. The number of bits of the stuffing bit STUFF is equal to or less than sync_period.

The construction and operation of the output coding unit 200 of FIG. 19 for producing such an output code string 205 will be described in detail below.

The counter 1701 is set to be "1" when a synchronization code insertion request signal 203 is inputted from a multiplexer 111 thereto and an initial bit of a synchronization code 301 is inputted thereto as a multiplexed code string 201, and it is set to be a synchronization code length sync_len when all the bits of the synchronization code 301 are inputted thereto. Thereafter, the counter 1701 counts up sequentially from the next bit of the synchronization code 301 until a bit immediately before the next synchronization code is outputted.

When bits from the initial bit of the synchronization code to the bit before the next synchronization code are inputted as a multiplexed code string 201, The switch controller 1704 controls the switch 1703 so as to switch the switch 1703 to the multiplexed code string 201 to output the multiplexed code string 201 as an output code string 205.

Then, at the last part of one frame, the bit insertion (bit stuffing) is carried out so that the next synchronization code is inserted at the synchronization code inserting position. The multiplexer 111 output a synchronization code insertion request signal 203 for the next frame when the output of the multiplexed code string 201 of one frame is completed. In response thereto, the switch controller 1704 switches the switch 1703 to the stuffing bit generator 1705 to output a stuffing bit 1223 as an output code string 205. The stuffing bit 1223 may have all the bits of "1" or "0", or a specific pattern such as "0101 . . . ".

This preferred embodiment of a dynamic image decoding system, according to the present invention, will be described below.

Figure 21:
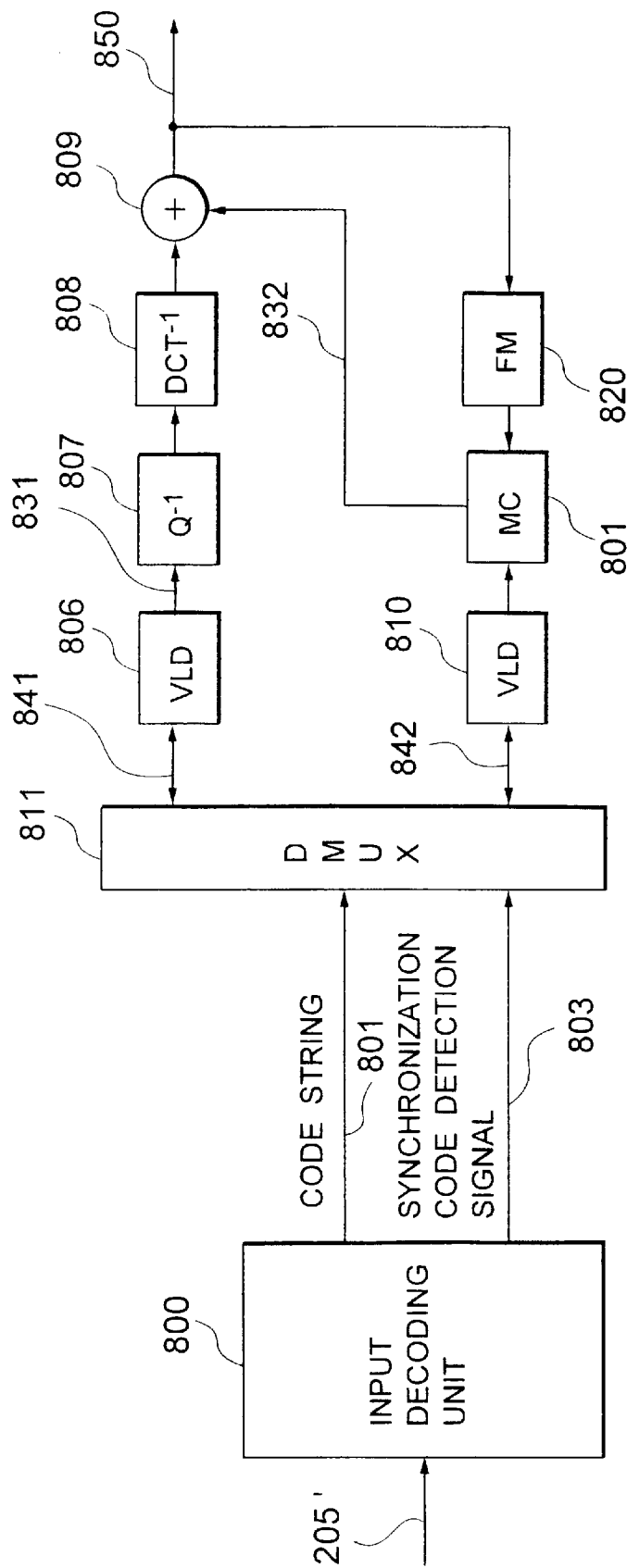
FIG. 21 is a block diagram of the third and fourth preferred embodiments of a dynamic image decoding system according to the present invention.

FIG. 21 is a block diagram of a dynamic image decoding system corresponding to the dynamic image coding system of FIG. 18. Using the same reference numbers as those in FIG. 8 for parts corresponding to those in FIG. 8, the different points from the first preferred embodiment will be mainly described. In this preferred embodiment, the construction and operation of an input coding system 800 are different from those in the first preferred embodiment. In addition, signals inputted from the input decoding unit 800 to a demultiplexer 811 are only a code string 801 and a synchronization code detection signal 803, and no signal is inputted from the demultiplexer 811 to the input decoding unit 800.

Figure 22:
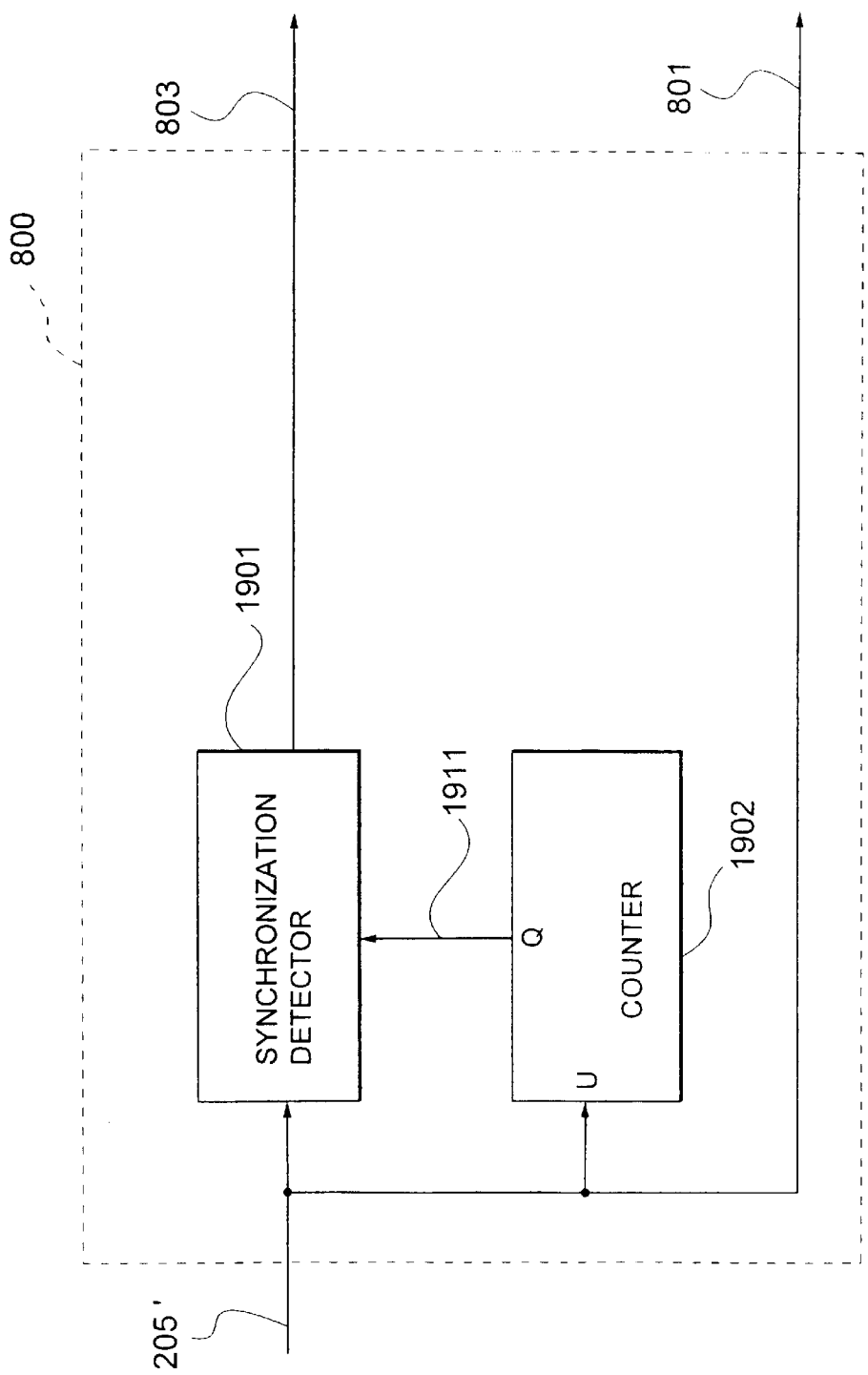
FIG. 22 is a block diagram of an input decoding unit of the third preferred embodiment of a dynamic image decoding system according to the present invention.

FIG. 22 is a block diagram of the input decoding unit 800. The input decoding unit 800 comprises a synchroniza-tion detector 1901 for detecting a synchronization code in an input code string 205', and a counter 1902 for counting the number of bits of the input code string 205 The counter 1902 is reset to be "0" at the initial stage of decoding, and counts up a counted value 1911 for each "1" every time one bit of the input code string 205 is inputted.

The synchronization detector 1901 detects synchronization codes only at the synchronization code inserting positions on the basis of the counted value 1991 of the counter 1902. For example, assuming that the synchroni-zation code inserting interval is sync_period, the counted value 1911 is bit_count, and the length of the synchroni-zation code is sync_len, the synchronization detection is carried out only when 0<bit_count mod sync_period≦sync_len, wherein A mod B denotes a remainder when A is divided by B. The synchronization detector 1901 outputs a synchronization code detection signal 803 when a synchroni-zation code is detected.

The code string 801 from the input decoding unit is inputted to the multiplexer 811 while the input code string 205' is outputted as it is. Thereafter, similar to the dynamic image decoding system of FIG. 21, the demultiplexing and decoding processes are carried out.

In a case where the last stuffing bit STUFF of the frame is a predetermined bit pattern, it is determined whether the stuffing bit STUFF corresponds to a predetermined pattern in the demultiplexer 811. When it does not correspond thereto, it is determined that there is an error in the input code string 205', so that the process for preventing the picture quality from being greatly deteriorated, which has been described with respect to the dynamic image coding system in the first preferred embodiment, may be carried out.

Fourth Preferred Embodiment

The fourth preferred embodiment of the present invention will be described below.

In this preferred embodiment, the whole construction of a dynamic image coding system is the same as that of the dynamic image coding system of FIG. 18, and the operation of an output coding unit is different from that in the third preferred embodiment.

Figure 23:
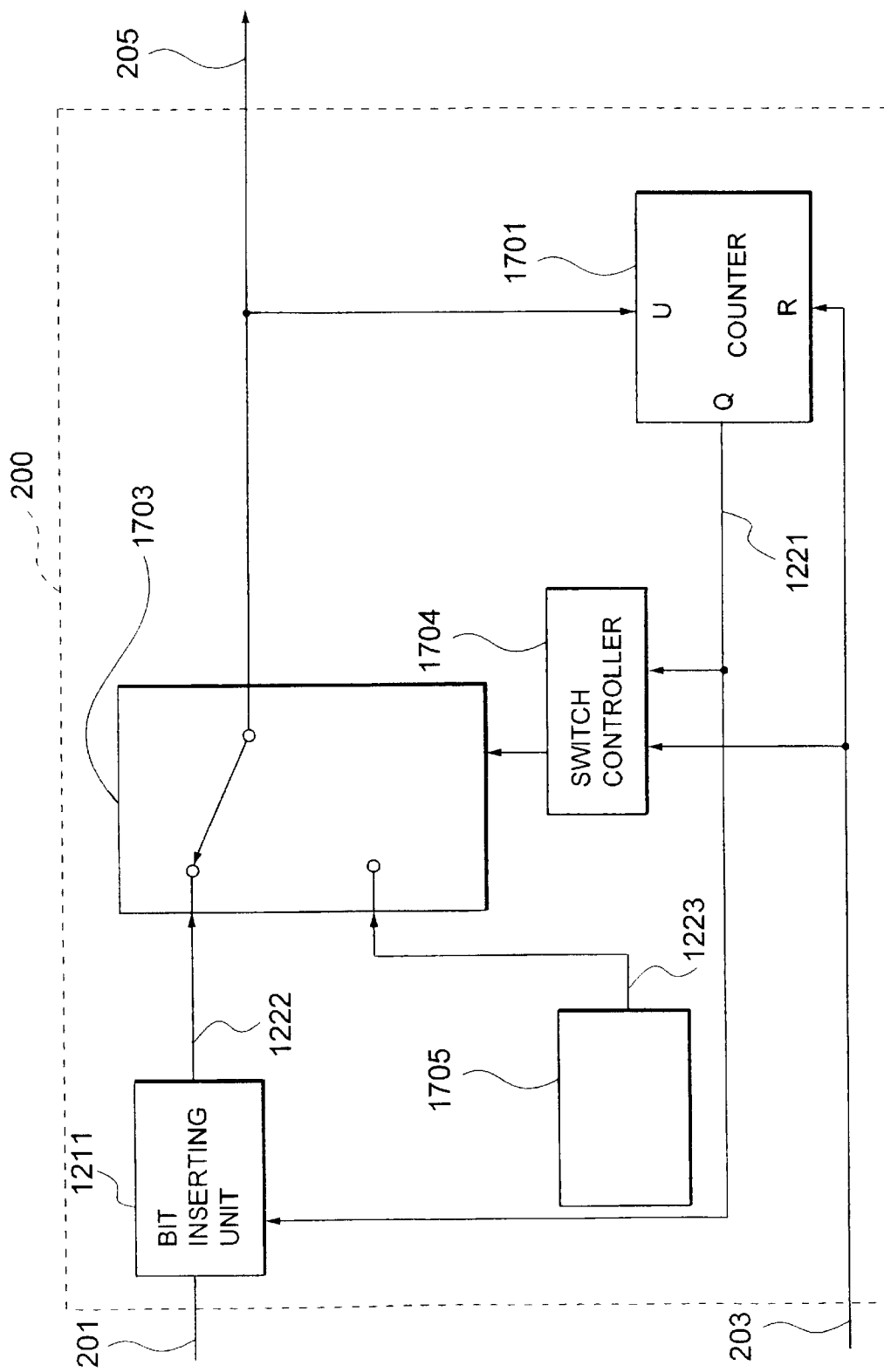
FIG. 23 is a block diagram of an output coding unit of the fourth preferred embodiment of a dynamic image coding system according to the present invention.

FIG. 23 is a block diagram of an output coding unit 200 in FIG. 18. Using the same reference numbers for parts corresponding to those of the output coding unit of FIG. 19, the difference from the output coding unit of FIG. 19 is that a bit inserting unit 1211 for carrying out the bit stuffing process for preventing a pseudo synchronization code is added.

In the bit inserting unit 1211, the bit insertion for preventing a pseudo synchronization for occurring is carried out for the multiplexed code string 201. Since it is not possible to uniformly decode a synchronization code if the same bit pattern as the synchronization code is contained in the output code string 205, the bit insertion is carried out in order to prevent this. For example, as shown in FIG. 5, when the synchronization code comprises "0"s of sync_0_len bits, a "1" of one bit and "xxxxx" of sync_nb_len bits representative of the kind of the synchronization code, it is possible to prevent a pseudo synchronization from occurring if a "1" is inserted so that "0"s of sync_0_len bits or more are not continuously arranged in the code string other than the synchronization code.

The synchronization code is inserted only into the synchronization code inserting system. Therefore, the bit inserting operation for preventing the pseudo synchronization from occurring may be carried out only at the synchronization code inserting positions. Thus, it is determined whether it is required to carry out the bit insertion on the basis of a counted value 1221 representative of the total number of bits of an output code string 205. Assuming that the counted value 1221 is total_len, the number of "1"s in the multiplexed code string 201 is counted in an interval of 0<total_len_mod_sync_period≦sync_0_len. If no "1" exists in this interval, a "1" of one bit is inserted. Herein, A mod B denotes a remainder when A is divided by B.

In addition, in order to decrease the probability of the error detection of a synchronization code due to error, the bit insertion may be carried out as follows.

In order to detect a synchronization codes even if an error of n bits is mixed into the synchronization code, it is required to determine that a code word having a hamming distance of n or less from a true synchronization code in an input decoding unit of a dynamic image decoding system as described later is a synchronization code. However, if such a determination is carried out while the code strings other than the synchronization code are as they are, bit patterns having a hamming distance of n or less from the synchronization code may exist even in the code strings other than the synchronization code. If this is arranged at the synchronization code inserting position, it may be erroneously determined to be the synchronization code.

Therefore, the following bit insertion into a multiplexed code string 201 is carried out by means of a bit inserting unit 211, so that the code strings other than the synchronization codes arranged at the synchronization code inserting positions in the multiplexed code string 201 are transformed so as to have a humming distance of 2×n+1 or more from the synchronization code. Specifically, the number of "1"s (assumed to be n0) is counted in an interval in which 0<total_len mod sync_period≦sync_0_len−(2×N+1). If n0 is less than 2×n+1, "1"s of 2×n+1−n0 bits are inserted into the multiplexed code string 201.

With respect to a code string 1222, in which the bit insertion has been thus carried out, the bit insertion (STUFF in FIG. 20) is carried out in the last interval of the frame similar to the output coding unit of FIG. 19, to be outputted as an output code string 205.

This preferred embodiment of a dynamic image decoding system, according to the present invention, will be described below. The whole construction of this dynamic image decoding system is the same as that of the dynamic image decoding system of FIG. 21, and the operation of an input coding system 800 thereof is different from that in the third preferred embodiment.

Figure 24:
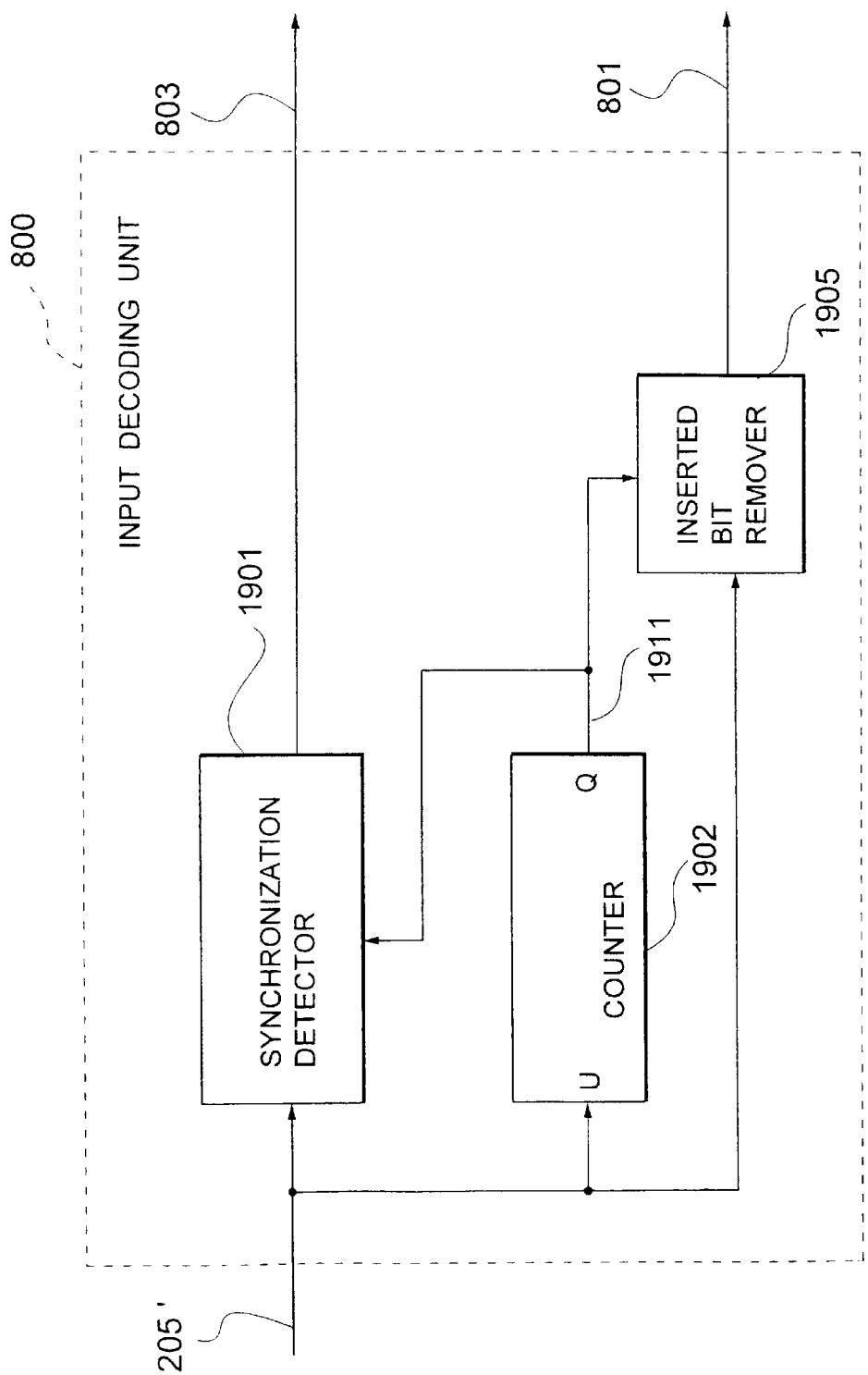
FIG. 24 is a block diagram of an input decoding unit of the fourth preferred embodiment of a dynamic image decoding system according to the present invention.

FIG. 24 is a block diagram of an input decoding unit 800. Using the same reference numbers for parts corres-ponding to those of an input decoding unit of FIG. 22, the difference between this preferred embodiment and the third preferred embodiment will be mainly described. In this preferred embodiment, a bit removing unit 1905 is added.

An input code string 205 is inputted to an inserted bit remover 1905, and a process for removing inserted bits is carried out in order to prevent a pseudo synchronization code inserted by a bit inserting unit 1211 of the output coding unit of FIG. 23. As described above, since the bit insertion is carried out only at the synchronization code inserting positions, the synchronization code inserting positions are determined on the basis of a counted value 1911 of a counter 1902.

For example, assuming that the synchronization code is a code word shown in FIG. 5 and when the bit inserting unit 1211 carries out the bit insertion into the initial portion "0000 . . ." of the synchronization code so that the humming distance from the synchronization code is greater than 2×n+1, the number of "1"s of sync_0_len−(2×n+1) bits from the synchronization code inserting position is counted. When the n0 is less than 2×n+1, 2×n+1−n0 bits are removed.

Since it is determined that the inserted bit is "1", when the bit determined to be the inserted bit is "0", it is considered that an error is mixed in the, synchronization code inserting interval. In this case, an error detection signal (not shown) may be outputted to a demultiplexer 811, and the same process as that in the first preferred embodiment may be carried out so as to prevent a reproduced image from being greatly deteriorated.

Figure 25:
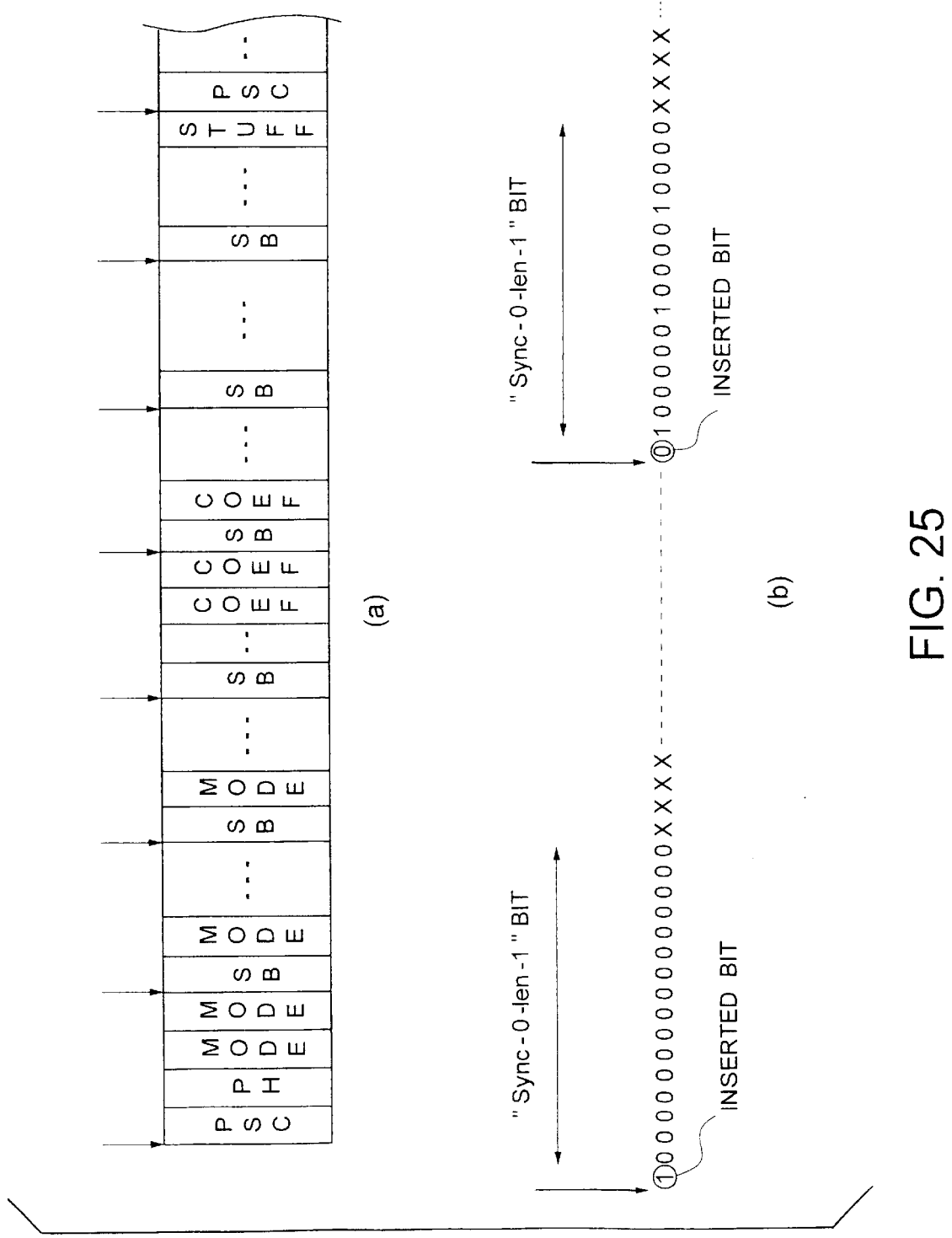
FIGS. 25a and 25b are diagrams of an example of an output code string of the fourth preferred embodiment of a dynamic image coding system according to the present invention.

The bit inserting process by the bit inserting unit 1211 of FIG. 23 may be carried out so that the inserted bits of a predetermined number of bits are inserted into all the synchronization code inserting intervals other than the synchronization code. FIG. 25 shows an example of an output code string 205 when such a bit inserting process is carried out. In the drawing, SB denotes an inserted bit.

For example, as shown in FIG. 5, when a synchronization code comprises "0"s of sync_0_len bits, a "1" of one bit and "xxxxx" of sync_nb_len bits representative of the kind of the synchronization code, an inserted bit SB of one bit is inserted at a predetermined position of an interval of sync_0_len bits from the head of the synchronization code inserting interval.

The inserted bit SB may be always "1". In addition, in accordance with a bit pattern in an interval of sync_0_len bits from the head of the synchronization code inserting interval, the inserted bit SB may be suitably determined so that the number of "1"s in the interval is equal to or greater than 1.

Moreover, the inserted bit SB may be an odd parity in an interval of sync_0_len bits from the head of the synchronization code inserting interval, to prevent the same bit pattern as the synchronization code from occurring and to detect an error mixed into this bit pattern.

FIG. 25(b) shows an example of an output code string, in which such a bit inserting process is carried out. In this example, an inserted bit SB of 1 bit is inserted into the initial portion from the synchronization code inserting position. This inserted bit SB is determined so that the number of "1"s in an interval of the inserted bit SB and sync_0_len−1 bits from the next bit is always an odd number. For example, in the left example of FIG. 25(b), the inserted bit SB is "1". In addition, in the right example of FIG. 25(b), since the inserted bit SB is "1" even if all the bits are "0" in the interval of sync_0_len−1 bits from the next bit to the inserted bit SB, "1"s of 1 bit or more always exist in the synchronization code inserting interval, so that the same bit pattern as the synchronization code is not produced. In addition, since the inserted bit SB serves as a parity check, it is possible to detect a bit error mixed into this interval.

In addition, the inserted bit SB may be an odd parity check bit for all the bits before the next synchronization code inserting position. However, in order to prevent the same bit pattern as the synchronization code from occurring only when all of sync_0_len−1 bits from the next bit to the inserted bit SB are "0", the inserted bit SB is always set to be "1". Thus, it is possible to carry out the error detection by the parity check of all bits.

In order to decrease the probability of the error detection of a synchronization code due to error, it is desired to insert more bits. For example, in order to correctly detect synchronization even if an error of n bits is mixed, "1"s of 2×n+1 bits are inserted into a predetermined position in this interval.

In this preferred embodiment, the operation of the bit removing unit 1905 of FIG. 24 is different so as to correspond to the operation of the aforementioned bit inserting unit 1211. That is, the bit removing unit 1905 removes the inserted bit SB at a predetermined position, at which the bit insertion has been carried out by the bit inserting unit 1211.

In a case where the inserted bit SB is always "1", it is determined that a bit error exists when a bit at the bit inserting position in the input code string 205 is "0", so that an error detection signal (not shown) may be outputted to the inverse multiplexer 811 so as to prevent a reproduced image from being greatly deteriorated.

Figure 26:
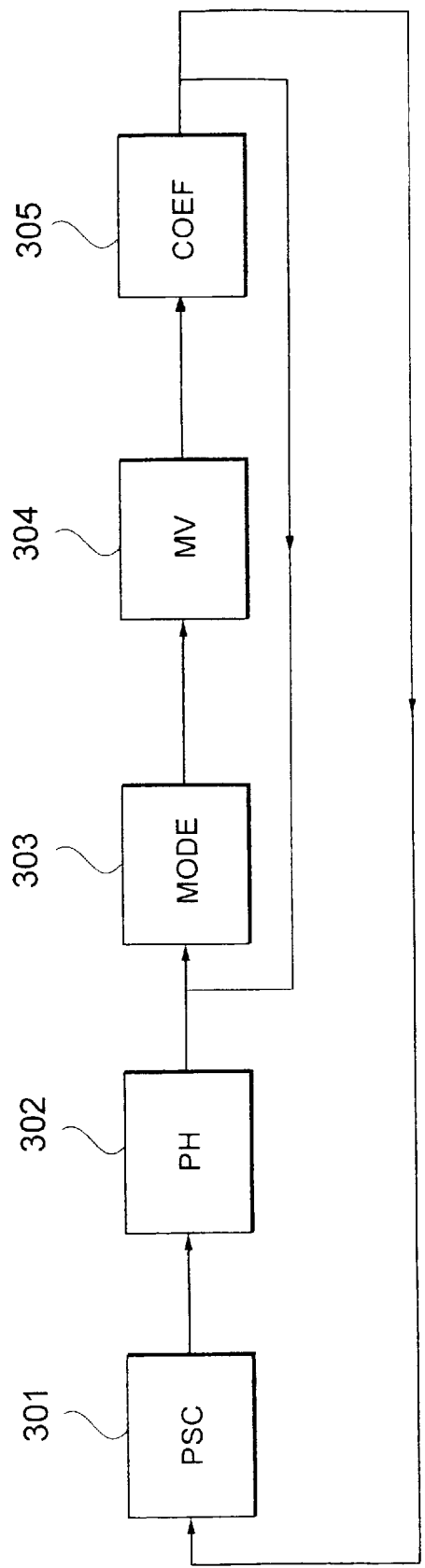
FIG. 26 is a diagram illustrating a multiplexing rule in a multiplexer of a dynamic image coding system.

In the first through fourth preferred embodiments, while the prediction mode information 303, the motion vector information 304 and the residual DCT coefficient 305 have been multiplexed in the multiplexer 111 for each coding frame as shown in FIG. 2, the predication mode information 303, the motion vector information 304 and the residual DCT coefficient 305 may be multiplexed for each coding region (e.g., a macro block, GOB) as shown in FIG. 26. In this case, the picture header 302 and the other information may have different error correcting/detecting code, or the same error correcting/detecting code. Alternatively, an error correcting/detecting code may be used for only the picture header or for a part of a code string of a predetermined number of bits of each frame, or no error correcting/detecting code may be used.

In addition, the multiplexing may not be carried out only for each frame (picture), but it may be also carried out for each part of a frame or for each layer of a plurality of frames, so that a synchronization code may be inserted for each of these multiplexing units (layer unit).

Figure 28:
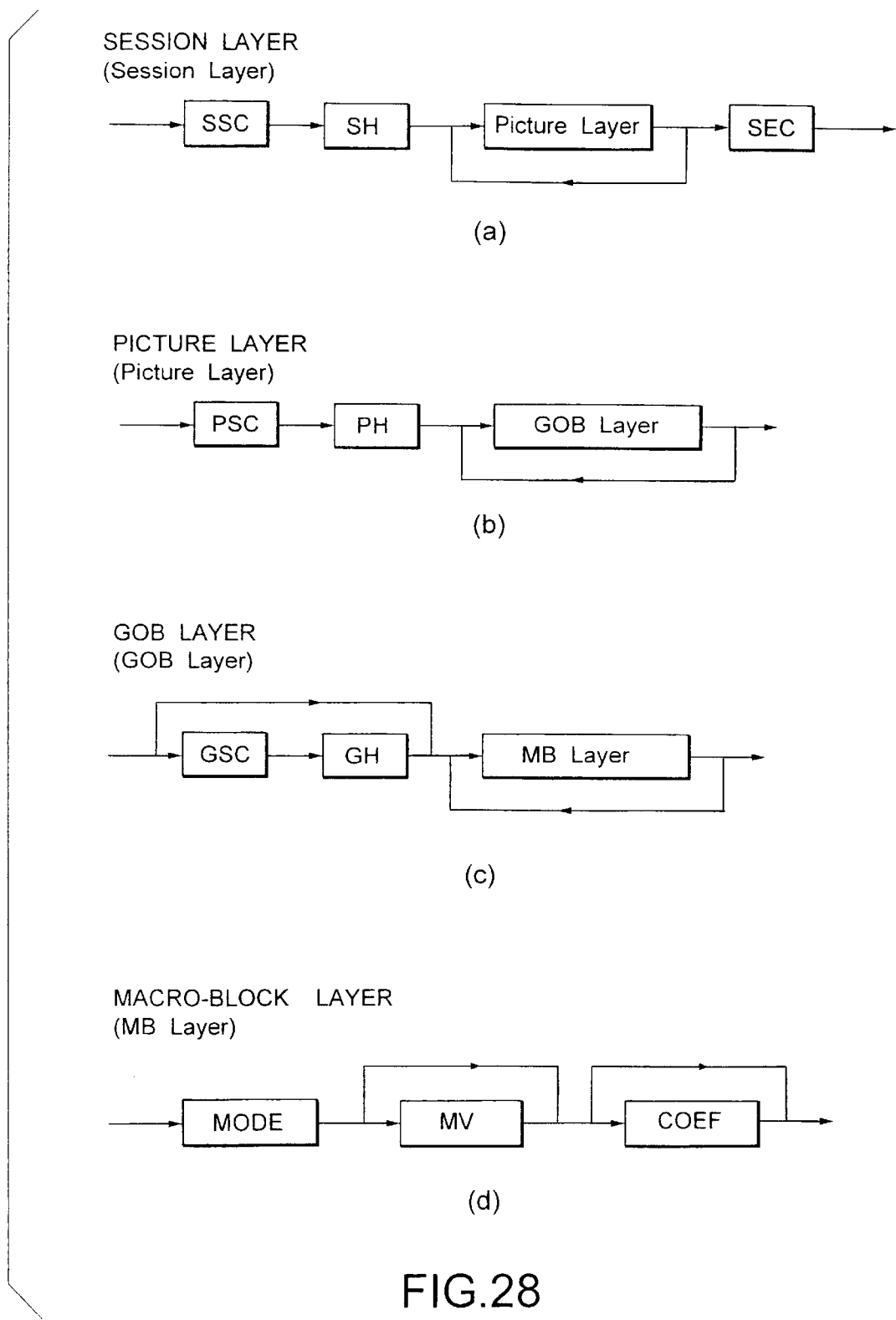
FIG. 28 is carried out.

FIG. 28 shows examples of such multiplexing. In the examples of FIG. 28, the multiplexing processes are carried out for each of four layers, i.e., each macro block layer of a plurality of coding blocks, each GOB layer of a plurality of macro blocks, each picture (frame) layer, and each session layer of a plurality of pictures. Among these layers, the session, picture and GOB layers use their synchronization signals (SSC, SEC, PSC and GSC in the drawing), respectively. Different codes are used for the SSC, SEC, PSC and GSC so that it is possible to identify which layer the synchronization code is detected. When the synchronization code shown in FIG. 5 is used, these synchronization codes may be distinguished by the portion of sync_nb_len bits representative of the kind of the synchronization code.

Figure 29:
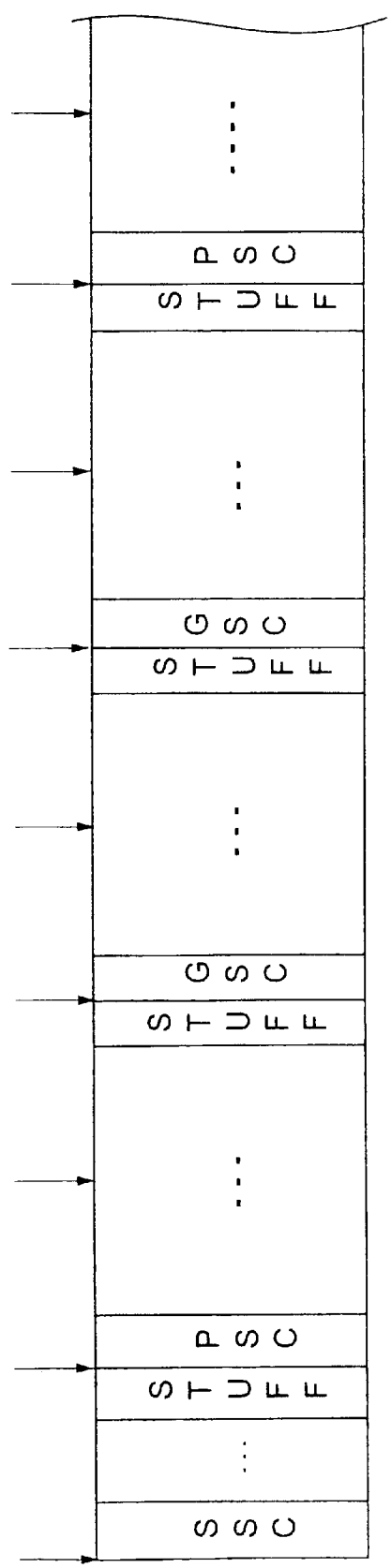
FIG. 29 is a diagram of an output code string, in which synchronization codes are processed when the multiplexing shown it

Also when such multiplexing is carried out, the same processes as those for the frame synchronization code in the preceding preferred embodiments may be carried out for a part or all of the synchronization codes of the session, picture or GOB. FIG. 29 shows an example of an output code string, in which such a process is carried out. As shown in FIG. 29, stuffing bits STUFF are inserted before the PSC and the GSC, and the SSC, PSC and GSC are inserted at the synchronization code inserting positions indicated by arrows in the drawing. Therefore, similar to the afore-mentioned preferred embodiment which shows the frame synchronization code PSC, the detection accuracy of each synchronization code can be improved.

The same length information as the frame length information POINTER of FIGS. 15, 16 and 17 may be added to each synchronization code of the session, picture and GOB. In a case where the frame length information POINTER is protected by the error correcting/detecting code as shown in FIGS. 15 and 16, if the error correcting/detecting code is not used only for the frame length information POINTER, but it is also used for a portion of sync_nb_len bits representative of the kind of a synchronization code, it is possible to improve the probability that the kind of the synchronization code, in addition to the position thereof, can be correctly detected. In addition, a part or all of the header information (SH, PH and GF in the drawing) of the session, picture and GOB may be protected using the error correcting/detecting code, so that it is possible to improve the error resistance of each header information.

In a case where the stuffing process for preventing a pseudo synchronization code is carried out as this preferred embodiment, the following process may be carried out so that the synchronization code inserting interval sync_period is equal to or less than the length of the synchronization code.

First, the process in the output coding unit of the dynamic image coding system will be described. It is assumed herein that the synchronization code is a code word comprising "0"s of sync_0_len bits and a "1" of 1 bit as shown in FIG. 5. In the output coding unit of FIG. 23, assuming that the counted value 1221 representative of the number of bits outputted from the bit inserting unit 1211 is total_len, when a remainder of division of total_len by the synchronization code inserting interval sync_period is equal to a remainder of division of a value, which is derived by subtracting 1 from the number of bits sync_0_len of the initial "0" of the synchronization code, by sync_period, i.e., when total_len mod sync_period=(sync_0_len−1) mod sync_period(1)

the number of "1" (assumed to be n1) in the output bits before (sync_0_len−1) bits from the output bit at that time is counted, and a "1" of 1 bit is inserted if no "1" exists (i.e., if n1=0).

Figure 33:
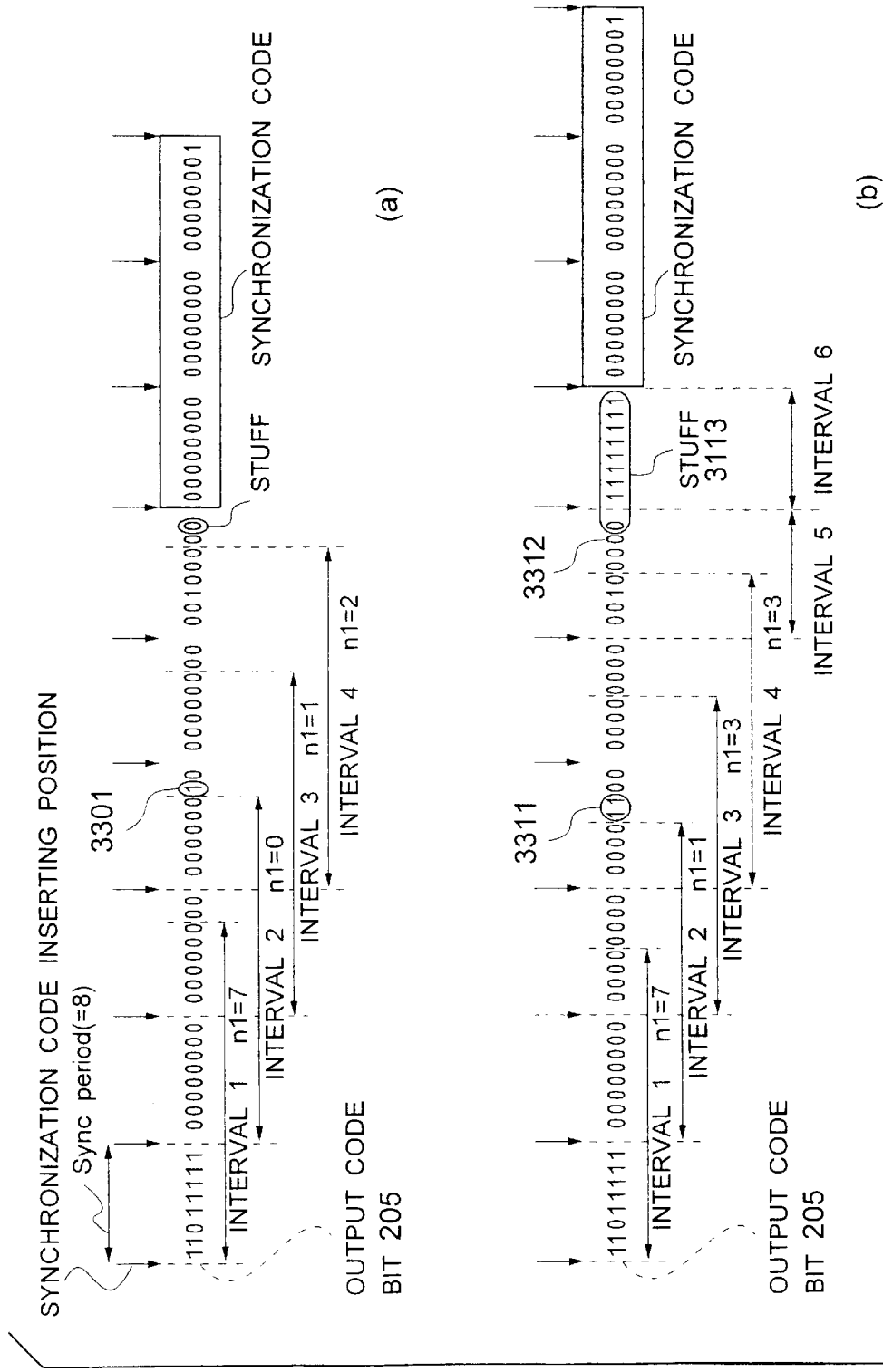
FIGS. 33a and 33b are diagrams of examples of output code strings when a synchronization code inserting interval is shorter than a synchronization code.

FIG. 33(*a*) shows an example of an output code string, for which such a process has been carried out. In the drawing, each of downward arrows indicates a synchronization code inserting position, and a synchronization code comprises "0" of 23 bits (i.e., sync_0_len=23), and a "1" of 1 bit. In the shown example, a synchronization code inserting interval sync_period is 8, which is shorter than the length of the synchronization code (=24 bits).

In the drawing, intervals 1 through 4 denote intervals for counting the aforementioned n1. In each interval, the number of "1"s n1 is sequentially counted. If n1=0, a stuffing bit is inserted into the next bit of the interval. Since n1>0 in interval 1, it is not required to insert the stuffing bit. Since n1=0 in interval 2, a stuffing bit 3301 of 1 bit is inserted into the next interval. In interval 3, n1=1 due to the inserted stuffing bit 3301, so that it is not required to insert a stuffing bit.

If such a bit stuffing process is carried out, the same bit pattern as a synchronization code does not exist at a portion other than the synchronization code in an output code string, so that no pseudo synchronization occurs.

On the other hand, in order to decrease the probability that a synchronization code is erroneously detected due to transmission line error, a bit insertion may be carried out as follows.

Even if an error of n bits enters a synchronization code, the synchronization code can be correctly detected by carrying out a bit inserting process so that a humming distance between a portion other than the synchronization code and the synchronization code in an output code string in a bit insertion 1211 is equal to or greater than 2×n+1.

In this process, when a remainder derived by dividing a counted value 1221 total_len representative of the total number of bits of the output code string 205 of FIG. 23 by a synchronization code inserting interval sync_period is coincident with a remainder derived by dividing a value, which is derived by subtracting 2×n+1 from the initial number of bits of "0"s of a synchronization code, by sync_period, i.e., when $$\text{total\_len mod sync\_period} = (\text{sync\_0\_len} - (2 \times n + 1)) \text{ mod sync\_period} \quad (2)$$

the number of "1"s (assumed to be n1) in output bits of (sync_0_len−(2×n+1)) bits from the output bit at that time. If the number of "1"s is less than (2×n+1) bits, i.e., if n1<2×n+1, "1"s of (2×n+1−n1) bits are inserted.

As shown in FIG. 5, when a synchronization code starting from "0"s of a plurality of bits is used, if the number of "1"s in a bit string immediately before the synchronization code is insufficient, a synchronization error detection may occur at that portion. In order to prevent this, a bit insertion (STUFF in FIG. 20) in the last interval of a frame may be outputted so that the number of bits of "1"s in an interval of sync_period bits from the synchronization code to the synchronization code inserting position immediately before the synchronization code is equal to or greater than 2×n+1 bits.

In order to do this, a STUFF always containing "1"s of 2×n+1 bits may be used, or the STUFF may be determined in accordance with an output code string. That is, the STUFF may be determined so that the number of bits of "1"s of sync_period bits immediately before the synchronization code in the output code string containing the STUFF is equal to or greater than 2×n+1 bits.

FIG. 33(b) shows an example of an output code string, for which such a process has been carried out. In the drawing, intervals 1 through 4 denote intervals for counting the aforementioned n1. In each interval, the number of "1"s n1 is sequentially counted. If n1<2×n+1, a stuffing bit is inserted into the next bit of that interval. Since n1=1 in interval 2, stuffing bits 3311 of (2×n+1)−1=2 bits are inserted into the next interval. In interval 3, n1=3 due to the inserted stuffing bits 3311, so that it is not required to insert stuffing bits.

Moreover, in order to prevent a synchronization code error detection immediately before a synchronization code, a STUFF is determined as follows. It is assumed that a bit immediately before the STUFF is 3311. Since the number of "1"s in an interval (interval 5) of sync_period bits from a synchronization code inserting position immediately before the bit 3312 to a synchronization code inserting position immediately after the bit 3312 is only 1 bit, an synchronization error detection may occur in this portion if the synchronization code has a plurality of "0" continuously arranged as shown in FIG. 5. Therefore, the position, at which the synchronization code is inserted, is shifted to the next synchronization code inserting position, and a STUFF 3313 containing many "1"s is outputted. Thus, since "1"s of 2×n+1 or more are contained in an interval (interval 6) of sync_period bits immediately before the synchronization code, it is possible to prevent the synchronization error detection.

If such a bit stuffing process is carried out, the humming distance from the synchronization code can be 2×n+1 or more at a portion other than the synchronization code in the output code string, so that the probability of the synchronization error detection can be decreased.

Processes in an output decoding system of a dynamic image decoding system will be described below. In the bit remover 1905 of FIG. 24, assuming that the counted value 1905 representative of the number of bits of an input code string is total_len, and when the total_len meets the conditions in which it is 1, the number of "1"s (assumed to be n1) in input bits of (sync_0_len−1) bits from the input bit at that time is counted. If no "1" exists, i.e., if n1=0, 1 bit is removed.

In order to detect a synchronization code even if an error of n bits is mixed into the synchronization code, in a case where a bit inserting process is carried out by the bit inserting unit 1211 so that the humming distance between a portion other than the synchronization code and the synchronization code in an output code string is equal to or greater than 2×n+1, the following process may be carried out. When the total_len reaches a value meeting formula (2), the number of "1"s (assumed to be n1) of (sync_0_len−(2×n+1)) bits from the input bit at that time in the output bits is counted. When the number of "1" is less than (2×n+1), i.e., when n1<(2×n +1), (2×n+1−n1) bits are removed.

In the output coding unit and the input decoding unit, if the aforementioned processes are carried out so that the synchronization code inserting interval sync_pe riod has a smaller number of bits than the length of the synchronization code, the number of bits of the stuffing bits STUFF can be decreased, so that the coding efficiency can be improved. In particular, when a synchronization code is long, or when many synchronization codes are inserted, the degree of the enhanced coding efficiency due to the decrease of the number of bits of the stuffing bits STUFF is great. For example, in a system for dividing a screen into one or a plurality of macro blocks or macro block lines to insert synchronization codes into each unit, such as a GOB/slice in a dynamic image coding, many dynamic image patterns are inserted, so that the degree of the coding efficiency due to the decrease of the number of bits of the STUFF is increased.

In addition, when a structure having a plurality of layers is multiplexed as shown in FIG. 28, synchronization codes having different lengths in accordance with layers may be used.

FIG. 34(a) shows examples of such synchronization codes. Among four kinds of synchronization codes, each of SSC, SEC and PSC has 32 bits, which comprises "0"s of 23 bits, a "1" of 1 bit and 8 bits representative of the kind of the synchronization code. On the other hand, a synchronization code GSC of a GOB layer is a synchronization code of 17 bits, which comprises "0" of 16 bits and a "1" of 1 bit, and is a shorter code word than other synchronization codes.

The reason why only the GSC is such a shorter code word is as follows. The GOB is a coded unit, which comprises one or a plurality of macro blocks (MB) and which is formed by dividing a screen into small regions, so that there are generally more synchronization codes of the GOB layer than other synchronization codes. Therefore, if the synchronization code length is decreased, the code amount of the output code string can be decreased. In addition, it is possible to output more GSCs if the code amount is the same, and it is possible to divide the screen into small GOB regions for encoding, so that the quality of a reproduced image can be improved when a transmission line error occurs.

A process for preventing a pseudo synchronization as described in the fourth preferred embodiment, i.e., a bit stuffing process for preventing the same bit pattern as a synchronization code from being produced in a code string other than the synchronization code, may be carried out. If a bit stuffing process for decreasing the probability of error detection of a synchronization code due to a transmission line error, e.g., a bit stuffing process for preventing the same bit pattern as a shortest synchroniza-tion code (GSC in the example of FIG. 34(a)) from being produced in a bit string, for which it is ensured only that the same bit pattern as a long bit length of synchronization code (SSC, SEC, PSC in the example of FIG. 34(a)) is not produced, is carried out, it is possible to prevent the same bit patterns as all the synchronization codes from being produced. This process may be carried out for the code strings of all the layers, or for code strings of lower layers (GOB layer, macro block layer in the shown example) than a layer using the shortest code, or for code strings of layers (picture layer, GOB layer, macro block layer) below a layer immediately above that layer. Alternatively, this process may be carried out only for code strings of a predetermined layer.

In order to easily identify synchronization codes of different lengths even if a transmission line error occurs, the process of a synchronization code or before and after the synchronization code may be carried out as follows.

(i) In a case where a synchronization code comprising a plurality of bits of "0"s and the subsequent "1" is used, the relative positions of a long code word and a short code word from the synchronization code inserting position of the "1" may be different. In the example of FIG. 34(b), the "1" 3211 of the PSC and the "1" 3412 of the GSC are arranged at different position, and all of bits (3413 to 3411, 3414 to 3412) arranged at the same positions in other synchronization codes are "0". Thus, since the humming distance of the synchronization code and a partial code string thereof is increased, it is possible to easily identify different synchronization codes even if a transmission line error occurs.

(ii) A stuffing bit may be inserted before a short synchronization code. For example, if a stuffing bit 3401 comprising one or a plurality of "1"s is inserted before a short GSC, the humming distance between the OSC and a partial code string of another synchronization code can be increased. (iii) A stuffing bit may be inserted after a short synchronization code. For example, a bit insertion 3402 may be carried out after a GSC so as to increase the humming distance from a portion identifying the kind of a synchronization code in long synchronization codes.

Fifth Preferred Embodiment

The fifth preferred embodiment of the present invention will be described below.

In this preferred embodiment, the whole constructions of a dynamic image coding system and a dynamic image decoding system are the same as those in the first preferred embodiment, except for the processes carried out at the head and end portions of a synchronization interval by an output coding unit 200 and an input decoding unit 800.

FIGS. 27(a), 27(b) and 27(c) are examples of an output code string 205 of a dynamic image coding system in this preferred embodiment. In this output code string 205, a part 2701 of a code string of the last,frame (frame n−1) is arranged after a synchronization code PSC, and a pointer information 2702 (SA) representative of a boundary 2703 (a start point of a code string of the current frame) between the code string 2701 and the current frame (n frame), i.e., the boundary between multiplexed code strings, is arranged, so that the stuffing bit (STUFF in FIG. 4) does not exist at the last of one frame. At this point, this output code string 205 is different from the output code string of FIG. 4.

In the output coding unit 200 of the dynamic image coding system, the number of bits resid_bit of the residual code strings of the frame is checked at each synchronization code inserting position. When the sum of, the resid_bit and the numbers of bits of a synchronization code PSC and a pointer information SA is less than synchronization code inserting interval sync_period bits, the synchronization code PSC is outputted before the residual code strings of the frame are outputted to the output code string 205. Then, the pointer information SA (representative of the resid_bit in this case) is outputted, and then, the residual code strings 2701 are outputted. Thereafter, the code strings of the next frame are outputted.

In the input coding system 800 of the dynamic image decoding system, a synchronization codes is detected at each of synchronization code inserting positions. When the synchronization code is detected, it is determined that the pointer information SA and the residual information of the frame are arranged after the detected synchronization code, and the subsequent process is carried out.

Figure 27:
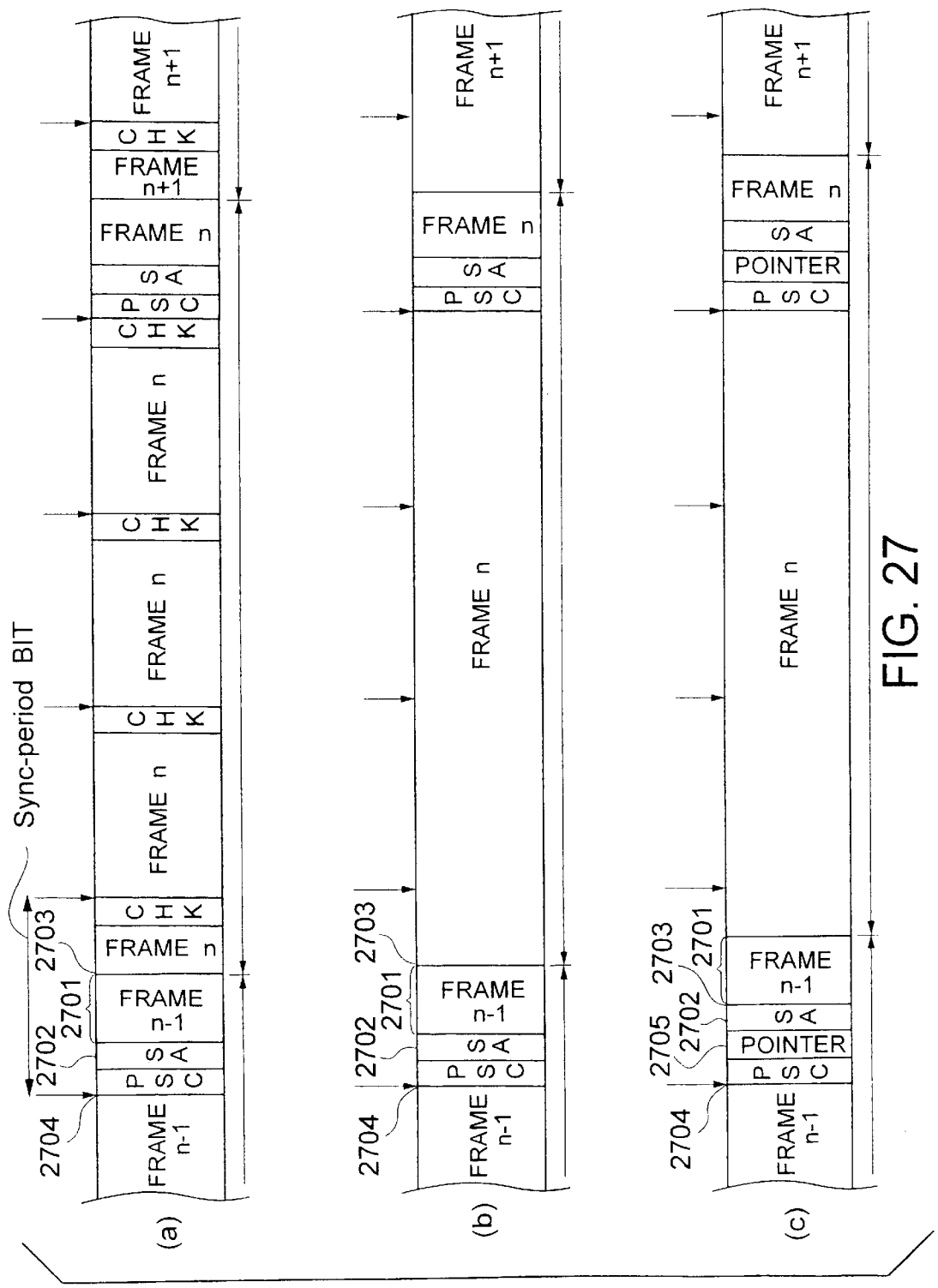
FIGS. 27a, 27b and 27c are block diagrams examples of output code strings of the fifth preferred embodiment of a dynamic image coding system according to the present invention.

For example, the boundary between a frame n−1 and a frame n in FIG. 27 will be described. After the decoding process immediately before 2704 the synchronization code PSC is completed, a synchronization code is detected in the subsequent synchronization code inserting interval. When the synchronization code is detected, the pointer information 2702 is decoded, and it is derived which bits the code strings of the frame n−1 have. On the basis of this, the bits of the number of bits indicated by the pointer information are taken out of the code string immediately after the pointer information (to 2703 in FIG. 27), and the code string 801 is outputted so that these are arranged after 2704.

In this preferred embodiment, the error correction/detection coding of a part or all of the output code strings may be carried out as shown in FIG. 27(a). In this case, all the kinds of the error correcting/detecting codes may be the same or different.

In addition, as shown in FIG. 27(b), the error correction/detection coding may not be carried out.

Moreover, as shown in FIG. 27(c), the frame length information POINTER representative of the number of bits of code strings of one frame as shown in FIGS. 15 and 16 may be inserted. In this case, the frame length information POINTER may be representative of the number of bits from the synchronization code PSC of the frame to a synchronization code PSC of the next frame.

In a case where the error correction/detection coding is carried out as shown in FIG. 27(a), the pointer information SA, the residual code strings 2701 of the frame n−1, and the code strings of the frame n after 2703 are combined to be one information bit, and the error correction/detection coding of the combined information bit is carried out.

The pointer information SA may be information, for which the error correction/detection coding has been carried out. In this case, the synchronization code PSC (or a part thereof), the frame length information POINTER and the pointer information may be combined to carry out the error correction/detection coding.

Examples of stuffing bits STUFF will be described below.

FIGS. 30(a) and 30(b) shows examples of code tables of stuffing bits STUFF as examples of the aforementioned stuffing bits STUFF. Both of FIGS. 30a) and 30(b) are characterized in that the decoding can be uniformly carried out in the backward direction to an output code string, so that the starting position of the stuffing bits STUFF can be uniformly identified. Therefore, an error mixed into a code string can be detected by comparing the decoding end position of a code string immediately before the stuffing bit STUFF with the starting position of the stuffing bit STUFF, and the starting point of the backward decoding can be identified when a coding system for decoding in a backward direction from a synchronization code is used.

Moreover, in the stuffing bits STUFF shown in the code tables of FIGS. 30(a) and 30(b), the first bit is always "0", so that the error detection can be carried out by a simplified decoding as described later.

Figures 30, 31:
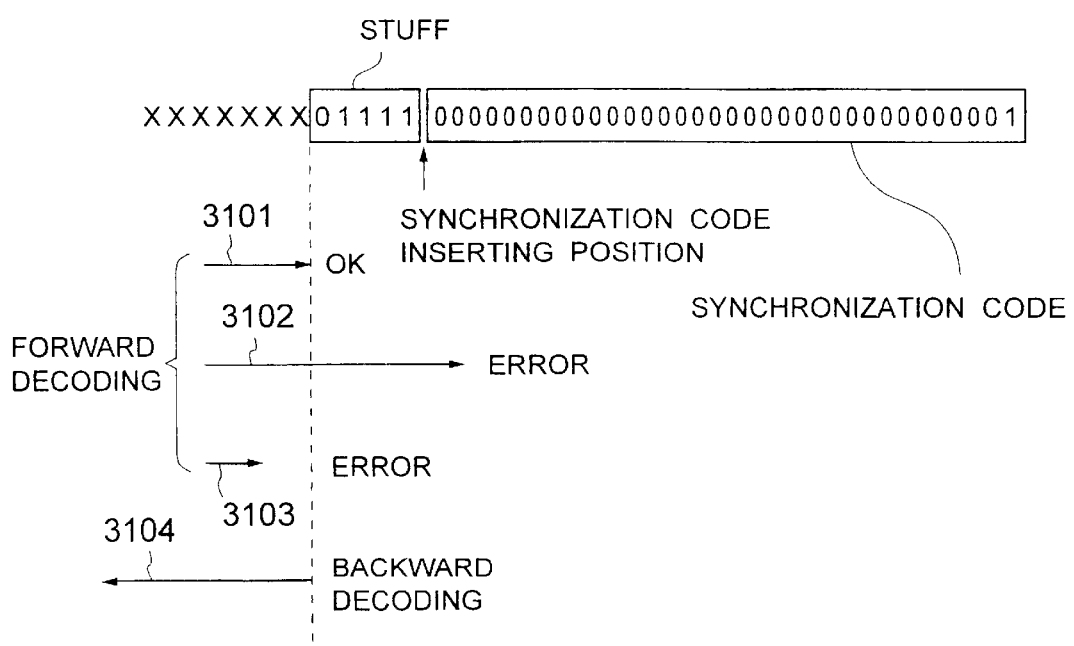
FIG. 31 is a diagram explaining a process in a decoding system when the stuffing bits of FIG. 30 are used.

FIG. 31 shows an example of a decoding process of a code string, which contains the stuffing bits STUFF shown in the code tables of FIGS. 30(a) and 30(b). Although FIG. 31 shows an example of the stuffing bit immediately before the synchronization code inserting position, the same process can be carried out by inserting a stuffing bit immediately before another optional synchronization code inserting position. In FIG. 31, arrows 3101 through 3103 denote examples of decoding end positions of a code string (indicated by "xxx . . . ") immediately before the stuffing bit STUFF when the decoding is carried out in a forward direction, and the right end of each of the arrows indicates the decoding end position. When no error is mixed into a code string and the decoding is normally carried out, the decoding end position of a code string immediately before the stuffing bit STUFF is coincident with the starting position of the stuffing bit STUFF as shown by the arrow 3101.

On the other hand, when an error is mixed into a code string, the decoding end position of a code string immediately before the stuffing bit STUFF is shifted from the starting position of the stuffing bit STUFF as shown by the arrows 3102 and 3103. In such a case, it is determined that an error exists in the code string.

In the decoding system, when the decoding of a code string immediately before the stuffing bit STUFF is completed, the stuffing bit STUFF before the next synchronization code inserting position is read, and it is determined whether the read stuffing bit STUFF is coincident with the codes in the code table shown in FIGS. 30(a) and 30(b). If the stuffing bit STUFF is not coincident with any codes, it is determined that an error exist.

When it is determined whether the stuffing bit STUFF is coincident with the code table, a small bit error may be allowable. Thus, it is possible to decrease the error detection of an error when an error is mixed into the stuffing bit STUFF itself.

The code table of FIG. 30(a) always starts from "0" and has the subsequent bits of "1". Therefore, in order to carry out the error detection, it may be determined only whether the next bit to the decoding end position of the code string immediately before the stuffing bit STUFF is "0", or the error detection may be carried out only by the first "0" and the subsequent some "1"s. Thus, although the error detection accuracy is slightly lowered, the throughput required to decoding can be decreased. Thus, in a case where a code table starting from a specific bit pattern, in which all the stuffing bits STUFF comprise a specific bit or a plurality of bits, is used, the decoding process can be simplified.

Moreover, the stuffing bits STUFF shown in the code tables of FIGS. 30(a) and 30(b) contain a lot of bits of "1", and the humming distances from the synchronization code containing a lot of "0"s and a part thereof are great as shown in FIG. 5, so that there is an advantage in that the probability that a pseudo synchronization occurs is low. Specifically, in the code table of FIG. 30(a), all of only the first bits of the stuffing bits STUFF are "0", and all of the other bits are "0", so that the humming distance between the synchronization codes, all of which are "0", and a part thereof is (the length of the stuffing bit STUFF is −1). In addition, in the code table of FIG. 30(b), only the first and last bits of the stuffing bits STUFF are "0", and all the other bits are "1", so that the humming distances from the synchronization code and a part thereof are (the length of the stuffing bit STUFF is −2). Thus, if the humming distances between the stuffing bit STUFF, and the synchronization code and a part thereof are selected so as to be greater than a predetermined value, e.g., (the length of the stuffing bit STUFF −2), so that it is difficult to produce a pseudo synchronization code even if an error is mixed into a code string.

Figure 32:
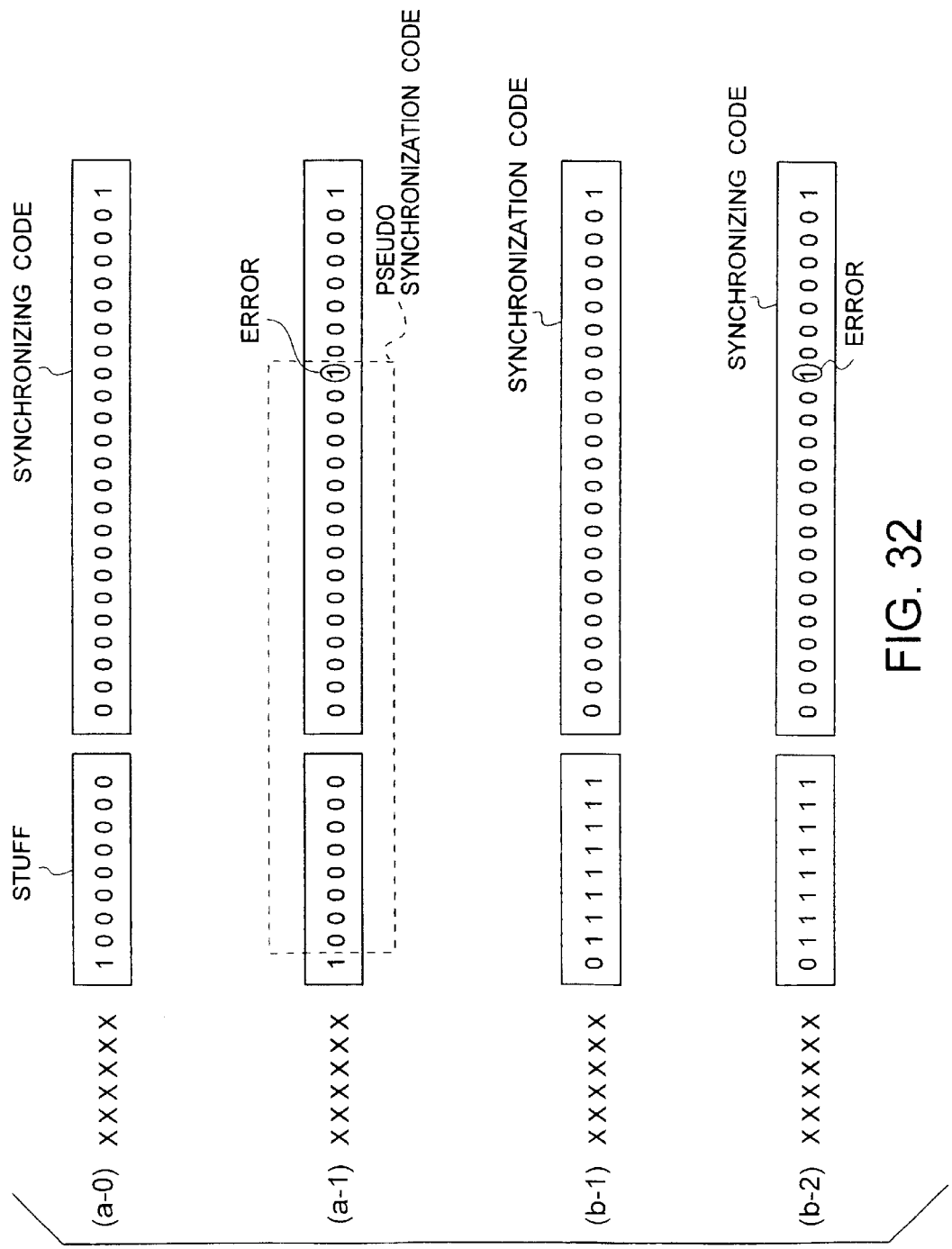
FIG. 32 is a diagram explaining the characteristics of the stuffing bits of FIG. 30.

Referring to FIG. 32, this effect will be described. FIGS. 32(a-0) and 32(b-0) show examples of code strings when usual stuffing bits (all the bits are "0") and the stuffing bits STUFF shown in the code table of FIG. 30(a) are used, and FIGS. 32(a-1) and 32(b-1) show examples when an error of 1 bit is mixed in FIGS. 32(a-0) and 32(b-0), respectively. As can be seen from FIG. 32(a-1), if only an error of 1 bit is mixed into the usual stuffing bits wherein all the bits are "0", the same bit pattern as the synchronization code is produced as shown by the broken line in FIG. 32(a-1), so that a pseudo synchronization occurs. On the other hand, the stuffing bit STUFF representative of the code table of FIG. 30(b) is not the same pattern as the synchronization code even if an error is mixed as shown in FIG. 32(b-2), so that no pseudo synchronization occurs.

Thus, the stuffing bit in this preferred embodiment has advantages in that it is possible to easily detect an error of a code string, and it is difficult to produce a pseudo synchronization code even if an error is mixed into a code string, so that it is possible to provide a strong error resistance.

In addition, the stuffing bit in this preferred embodiment can uniformly decode in the backward direction, and identify the starting position thereof, i.e., the end position of a code string immediately before the stuffing bit STUFF. Therefore, after the coding, by which an information code string can decoded in both of forward and backward directions, is carried out, the code string immediately before the STUFF can be decoded in the backward direction as shown by the arrow 3104 in FIG. 31.

In the aforementioned preferred embodiment, the stuffing bit STUFF may be determined as follows.

(1) In a case where a synchronization code contains "0"s of sync_0_len bits as shown in FIG. 5, if all the bits of the stuffing bits STUFF or at least at the synchronization code inserting positions are set to be "1", the humming distances between the portions of "0" of the synchronization code and the stuffing bits STUFF can be increased. Therefore, it is possible to decrease the probability that an error is mixed into the stuffing bits STUFF to produce a pseudo synchronization.

(2) The stuffing bit STUFF may be a code word representative of the length thereof. In the decoding system, the length of the STUFF from the point, at which the decoding of a code string other than the stuffing bit STUFF is completed, is determined, and the decoding of the STUFF is decoded to decode the length information of the STUFF. In this case, if both are coincident with each other, it can be determined that an error is mixed into the code string.

In addition, the length of the code string of the stuffing bits STUFF may be indicated by binary numbers. For example, if the STUFFs are 5 bits, "5" may be indicated by binary numbers so as to be "00101". Alternatively, a value derived by taking a complement of "1" or "2" from a value indicated by binary numbers may be used as a code word of the stuffing bits STUFF. Thus, the number of bits of "0"s in the STUFFs is decreased, so that it is possible to inhibit a pseudo synchronization from occurring similar to the aforementioned (1).

(3) In a case where the coding is carried out using a code word which can be decoded in both of forward and backward directions, it is required to decode the stuffing bits STUFFs in the backward direction from the end point of the frame in the decoding system, to find the starting point (the boundary point between the STUFF and another code word). In such a case, the STUFFs may be determined so as to be a code word, which starts from "0"(s) of 1 bit or a plurality of bits and has the residuals of "1"s, such as "01111111". Thus, if the STUFFs are decoded in the backward direction to seek the position of "0", it can be uniformly determined that the sought position is the starting point of the STUFFs. In addition, in this example, the bits other than the initial portion of the stuffing bits STUFFs are "1", so that it is possible to decrease the probability that a pseudo synchronization occurs similar to the aforementioned (1).

(4) The stuffing bit STUFF may be a check bit, a parity check bit or the like for an error correcting/detecting code of a part or all of bits of an output code string. Thus, the error correction/detection of a bit error mixed into an output code string can be carried out.

As described in the above examples, stuffing bits STUFFs are produced in accordance with a predetermined rule, and the stuffing bits STUFFs in an input code string are checked with the producing rule in a decoding system. If it is determined that the stuffing bits STUFFs are against the producing rule, it can be determined that an error is mixed into the input code string. Thus, if a process for preventing a reproduced image from being greatly deteriorated is carried out in a dynamic image decoding system, it is possible to improve the quality of a reproduced image when an error is mixed into the input code string.

Moreover, in the aforementioned preferred embodiment, the synchronization code inserting interval sync_period may be determined as follows.

(1) In a case where an error correcting/detecting code is used, a synchronization code inserting interval sync_period may be greater than the minimum number of bits required to carry out the synchronization detection by means of a decoding system, i.e., the sum of the length of a synchronization code and the maximum value of a check bit for an error correcting/detecting code. Since the mean value of the numbers of bits of the last stuffing bits STUFFs of a frame is sync_period / 2, if the sync_period has the minimum bits, by which the synchronization detection can be carried out, it is possible to decrease the number of bits of the stuffing bits STUFFs to improve the coding efficiency.

(2) In a case where no error correcting/detecting code is used, a synchronization code inserting interval sync_period may be greater than the minimum number of bits required to carry out the synchronization detection by means of a decoding system, i.e., the length of a synchronization code. Since the mean value of the numbers of bits of the last stuffing bits STUFFs of a frame is sync_period/2, if the sync_period has the minimum bits, by which the synchronization detection can be carried out, it is possible to decrease the number of bits of the stuffing bits STUFFs to improve the coding efficiency.

(3) In a case where a frame length information POINTER is used as shown in FIGS. 15, 16, 17 and 27, a synchronization code inserting interval sync_period may be shorter than the length of a synchronization code. Thus, it is possible to decrease the number of bits of the stuffing bits STUFFs to improve the coding efficiency.

(4) In a case where the transmission/storage is carried out by dividing into packets or cells at intervals determined in a transmission line or a storage medium, a synchronization code inserting interval sync_period may be matched with the interval of the packets or cells, or a divisor thereof. Thus, since the head of the packets or cells is always arranged at the synchronization code inserting position, it is possible to detect a synchronization code even if a packet or cell is produced due to packet loss or cell loss.

(5) The synchronization code inserting interval sync_period is preferably shorter than the required minimum number of bits of a frame. Thus, it is possible to decrease the number of bits of the stuffing bits STUFFs to improve the coding efficiency.

Sixth Preferred Embodiment

The sixth preferred embodiment of the present invention will be described.

Figure 35:
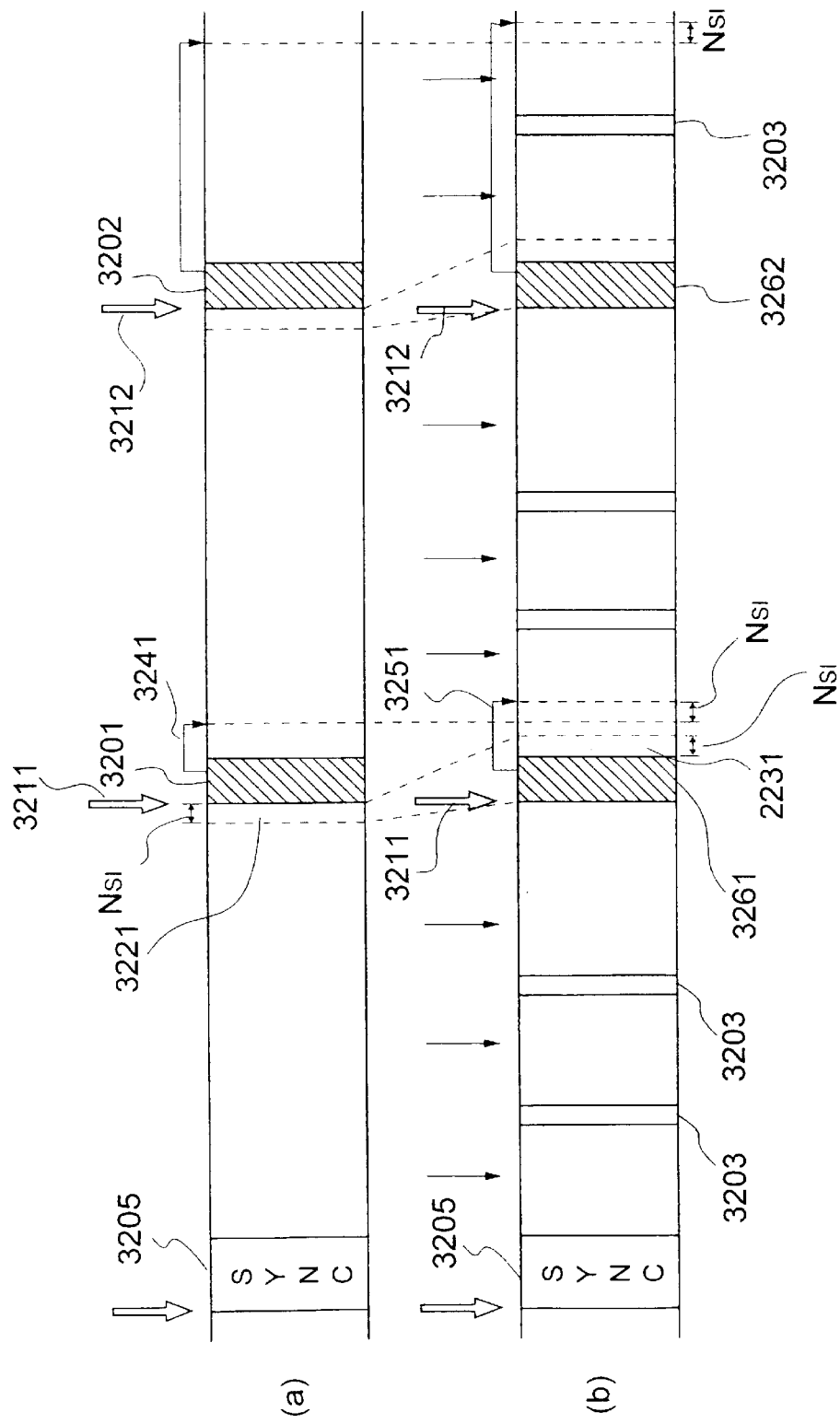
FIGS. 35a and 35b are diagrams of examples of output code strings of the sixth preferred embodiment of a dynamic image coding system according to the present invention.

FIG. 35 shows examples of output code strings of a dynamic image coding system in this preferred embodiment. In these output code strings, in order to decrease the probability of the error detection of a synchronization code due to errors, the bit inserting process as described in the aforementioned preferred embodiments is carried out. In addition, information, such as heater information, is arranged at predetermined positions, or at predetermined positions based on a synchronization code.

FIG. 35(*a*) is a code string before a bit inserting process is carried out, and FIG. 35(*b*) is a code string after a bit inserting process is carried out. In the drawings, each of the portions 3201, 3202, 3261 and 3262 shown by the slanting lines shows information arranged at the predetermined position (the predetermined position based on a synchronization code), and each of void arrows 3211 and 3212 indicates the position, into which the information is inserted. The information 3261 and information 3262 of the code string in FIG. 35(*b*) corresponds to the information 3201 and information 3202 of the code string in FIG. 35(*a*), respectively. In some cases, when the code string (a) is transformed to the code string (b), these information may be transformed (i.e., the transformation from information 3201 to information 3261 and the transformation from information 3202 to information 3262).

In FIG. 35(*b*), 3203 denotes a bit inserted by the bit inserting process. Since the bit string subsequently to the inserted bit is shifted backward by the bit inserting process, a part of a code string immediately before the information to be inserted at a predetermined position is shifted so that the information is inserted at the predetermined position. For example, assuming that the total of the numbers of inserted bits from the synchronization code 3205 immediately before the information 3201 is Ns1, Ns1 bits indicated by sign 3221 in FIG. 35(*a*) immediately before the information 3201 may be shifted to the portion of sign 3231 in FIG. 35(*b*) immediately after the information 3201.

If information such as a pointer representative of a specific position in a code string is contained in information 3201 and/or 3202, this may be transformed. Specifically, for example, if information representative of the position indicated by arrow 3241 is contained in information 3201, the information representative of the position in information 3261 is transformed so as to indicate the position representative of arrow 3251 after the position by the number Ns1 of the inserted bits.

What is claimed is:

1. A coding system comprising:
   multiplexing means for multiplexing kinds of variable-length compressed codes, which are obtained by compression coding an input signal, to produce a multiplexed code string; and
   code string assembling means for inputting said multiplexed code string to assemble an output code string, for determining one of a plurality of synchronization code inserting positions at predetermined periodic intervals in said output string, based on code lengths of the compressed codes, and for inserting a synchronization code into the determined synchronization code inserting position.

2. A coding system comprising:
   multiplexing means for multiplexing kinds of variable-length compressed codes, which are obtained by compression coding an input signal, to produce a multiplexed code string; and
   code string assembling means for inputting said multiplexed code string to assemble an output code string, for determining one of a plurality of synchronization code inserting positions at predetermined periodic intervals in said output string, based on code lengths of the compressed codes, and for inserting a synchronization code into the determined synchronization code inserting position, and suitably inserting a stuffing bit into said output code string.

3. A coding system comprising:
   multiplexing means for multiplexing kinds of variable-length compressed codes, which are obtained by compression coding an input signal, to produce a multiplexed code string; and
   code string assembling means for inputting said multiplexed code string to assemble an output code string, for determining one of a plurality of synchronization code inserting positions at predetermined periodic intervals in said output string, based on code lengths of the compressed codes, and for predetermining a plurality of synchronization code inserting positions arranged periodically in said output code string, inserting information indicating a boundary of said multiplexed code string, and inserting a synchronization code into the determined synchronization code inserting position.

4. A coding system as set forth in any one of claims 1 through 3, wherein said multiplexing means multiplexes a compressed code, which is as compression coded for each of frames or segments of the frames of an input image signal, for each of said frames or said segments of the frame, and wherein said code string assembling means inserts a synchronization code into a synchronization code inserting position immediately before or after the end portion of each synchronization unit constituted by multiplexing each of the frames of the multiplexed code string or segments of the frames.

5. A coding system as set forth in any one of claims 1 through 3, which further comprises code string transforming means for transforming a code string other than said synchronization code, which is arranged at said synchronization code inserting position in said output code string, so that a Hamming distance from said synchronization code is equal to or greater than a predetermined value.

6. The coding system of claim 1, 2, or 3, wherein determining one of a plurality of synchronization code inserting positions comprises:
   determining one of the plurality of synchronization code inserting positions that immediately follows a tail of a compressed code.

7. A coding system as set forth in any one of claims 1 through 3, wherein said multiplexing means produces a multiplexed code string by multiplexing said compressed code string for each of a plurality of layers, and said code string assembling means inputs said multiplexed code string to add a synchronization code to at least a part of said plurality of layers to produce an output code.

8. A coding system as set forth in claim 7, which further comprises code string transforming means for transforming a code string other than said synchronization code in a part or all of said layers, to which said synchronization code of said output code string is added, so that a Hamming distance from said synchronization code is equal to or greater than a predetermined value.

9. A coding system as set forth in claim 8, which further comprises code string transforming means for transforming a code string other than said synchronization code in a part or all of said layers, to which said synchronization code of said output code string is added, so that a Hamming distance from a synchronization code which has a shortest length of synchronization codes having different lengths is equal to or greater than a predetermined value.

10. A coding system as set forth in claim 7, wherein said code string assembling means causes said synchronization codes to have different lengths in a part or all of said plurality of layers.

11. A coding system as set forth in claim 10, which further comprises code string transforming means for transforming a code string other than said synchronization code in a part or all of said layers, to which said synchronization code of said output code string is added, so that a Hamming distance from said synchronization code is equal to or greater than a predetermined value.

12. A coding system as set forth in claim 11, which further comprises code string transforming means for transforming a code string other than said synchronization code in a part or all of said layers, to which said synchronization code of said output code string is added, so that a Hamming distance from a synchronization code which has a shortest length of synchronization codes having different lengths is equal to or greater than a predetermined value.

13. A coding system comprising:
   a multiplexer configured to multiplex kinds of variable-length compressed codes, which are obtained by compression coding an input signal, to produce a multiplexed code string; and
   a code string assembler configured to input said multiplexed code string to assemble an output code string, to determine one of a plurality of synchronization code inserting positions at predetermined periodic intervals in said output string, based on code lengths of the compressed codes, and to insert a synchronization code into the determined synchronization code inserting position.

14. A coding system as set forth in claim 13, wherein said multiplexer multiplexes a compressed code, which is compression coded for each of frames or segments of the frames of an input image signal, for each of said frames or said segments of the frame, and wherein said code string assembler inserts a synchronization code into a synchronization code inserting position immediately before or after an end portion of each synchronization unit constituted by multiplexing each of the frames of the multiplexed code string or segments of the frames.

15. A coding system comprising:
- a multiplexer configured to multiplex kinds of variable-length compressed codes, which are obtained by compression coding an input signal, to produce a multiplexed code string; and
- a code string assembler configured to input said multiplexed code string to assemble an output code string, to determine one of a plurality of synchronization code inserting positions at predetermined periodic intervals in said output string, based on code lengths of the compressed codes, and to insert a synchronization code into the determined synchronization code inserting position, and suitably insert a stuffing bit into said output code string.

16. A coding system as set forth in claim 15, wherein said multiplexer multiplexes a compressed code, which is compression coded for each of frames or segments of the frames of an input image signal, for each of said frames or said segments of the frame, and wherein said code string assembler inserts a synchronization code into a synchronization code inserting position immediately before or after an end portion of each synchronization unit constituted by multiplexing each of the frames of the multiplexed code string or segments of the frames.

17. A coding system comprising:
- a multiplexer configured to multiplex kinds of variable-length compressed codes, which are obtained by compression coding an input signal, to produce a multiplexed code string; and
- a code string assembler configured to input said multiplexed code string to assemble an output code string, to determine one of a plurality of synchronization code inserting positions at predetermined periodic intervals in said output string, based on code lengths of the compressed codes, and to insert information indicating a boundary of said multiplexed code string, and insert a synchronization code into the determined synchronization code inserting position.

18. A coding system as set forth in claim 17, wherein said multiplexer multiplexes a compressed code, which is compression coded for each of frames or segments of the frames of an input image signal, for each of said frames or said segments of the frame, and wherein said code string assembler inserts a synchronization code into a synchronization code inserting position immediately before or after an end portion of each synchronization unit constituted by multiplexing each of the frames of the multiplexed code string or segments of the frames.

19. A coding method comprising:
- multiplexing kinds of variable-length compressed codes, which are obtained by compression coding an input signal, to produce a multiplexed code string;
- inputting said multiplexed code string to assemble an output code string;
- determining one of a plurality of synchronization code inserting positions at predetermined periodic intervals in said output string, based on code lengths of the compressed codes; and
- inserting a synchronization code into the determined synchronization code inserting position.

20. A coding method comprising:
- multiplexing kinds of variable-length compressed codes, which are obtained by compression coding an input signal, to produce a multiplexed code string;
- inputting said multiplexed code string to assemble an output code string;
- determining one of a plurality of synchronization code inserting positions at predetermined periodic intervals in said output string, based on code lengths of the compressed codes; and
- inserting a synchronization code into the determined synchronization code inserting position, and suitably inserting a stuffing bit into said output code string.

21. A coding method comprising:
- multiplexing kinds of variable-length compressed codes, which are obtained by compression coding an input signal, to produce a multiplexed code string;
- inputting said multiplexed code string to assemble an output code string;
- determining one of a plurality of synchronization code inserting positions at predetermined periodic intervals in said output string, based on code lengths of the compressed codes; and
- inserting information indicating a boundary of said multiplexed code string, and inserting a synchronization code into the determined synchronization code inserting position.

* * * * *